United States Patent [19]

Miwa et al.

[11] Patent Number: 5,541,124
[45] Date of Patent: Jul. 30, 1996

[54] METHOD FOR MAKING BIPOLAR TRANSISTOR HAVING DOUBLE POLYSILICON STRUCTURE

[75] Inventors: Hiroyuki Miwa; Shigeru Kanematsu, both of Kanagawa; Takayuki Gomi, Tokyo; Hiroaki Anmo, Kanagawa; Takashi Noguchi, Kanagawa; Katsuyuki Kato, Kanagawa; Hirokazu Ejiri, Kanagawa; Norikazu Ouchi, Kanagawa, all of Japan

[73] Assignee: Sony Corporation, Tokyo, Japan

[21] Appl. No.: 477,471

[22] Filed: Jun. 7, 1995

Related U.S. Application Data

[62] Division of Ser. No. 196,569, Feb. 15, 1994.

[30] Foreign Application Priority Data

| Feb. 28, 1993 | [JP] | Japan | 5-062982 |
| Feb. 28, 1993 | [JP] | Japan | 5-062985 |
| Mar. 31, 1993 | [JP] | Japan | 5-098789 |
| Mar. 31, 1993 | [JP] | Japan | 5-098791 |
| Mar. 31, 1993 | [JP] | Japan | 5-098792 |
| Mar. 31, 1993 | [JP] | Japan | 5-098793 |
| Mar. 31, 1993 | [JP] | Japan | 5-098795 |
| Mar. 31, 1993 | [JP] | Japan | 5-098796 |

[51] Int. Cl.[6] .................................................. H01L 21/265
[52] U.S. Cl. ..................... 437/31; 437/150; 437/162; 437/191; 437/193; 437/195; 437/200; 148/DIG. 11; 257/518; 257/554; 257/588; 257/592
[58] Field of Search ............................. 437/31, 141, 150, 437/162, 191, 193, 195, 200; 148/DIG. 10, DIG. 11; 257/554, 553, 552, 518, 588, 592, 517

[56] References Cited

U.S. PATENT DOCUMENTS

| 4,994,400 | 2/1991 | Yamaguchi et al. | 437/31 |
| 4,997,775 | 3/1991 | Cook et al. | 437/31 |
| 5,024,957 | 6/1991 | Harame et al. | 437/31 |
| 5,204,277 | 4/1993 | Somero et al. | 437/31 |
| 5,213,989 | 5/1993 | Fitch et al. | 437/31 |
| 5,391,503 | 2/1995 | Miwa et al. | 437/31 |
| 5,403,757 | 4/1995 | Suzuki | 437/31 |

FOREIGN PATENT DOCUMENTS

| 63-0289863 | 11/1988 | Japan | 437/31 |
| 0028959 | 1/1989 | Japan | 437/31 |
| 0094444 | 4/1990 | Japan | 437/191 |
| 0105521 | 4/1990 | Japan | 437/191 |
| 0246338 | 10/1990 | Japan | 437/191 |
| 3165523 | 7/1991 | Japan . | |
| 3224269 | 10/1991 | Japan | 257/592 |
| 4113627 | 4/1992 | Japan | 437/31 |

*Primary Examiner*—George Fourson
*Assistant Examiner*—Long Pham
*Attorney, Agent, or Firm*—Hill, Steadman & Simpson

[57] ABSTRACT

A semiconductor device and a manufacturing method therefor which can simultaneously realize both a reduction in base transit time by a reduction in base width and a reduction in base resistance by a reduction in link base resistance. The semiconductor device is manufactured by the method including the steps of forming a first impurity diffused layer of a first conduction type in a semiconductor substrate; forming a conducting film connected to the first impurity diffused layer; forming a first insulating film on the conducting film; forming a first hole through a laminated film composed of the first insulating film and the conducting film; forming a second impurity diffused layer of the first conduction type in the semiconductor substrate exposed to the first hole; forming a side wall from a second insulating film in the first hole to form a second hole; and forming a third impurity diffused layer of the first conduction type in the semiconductor substrate exposed to the second hole.

7 Claims, 45 Drawing Sheets

FIG. IA  PRIOR ART
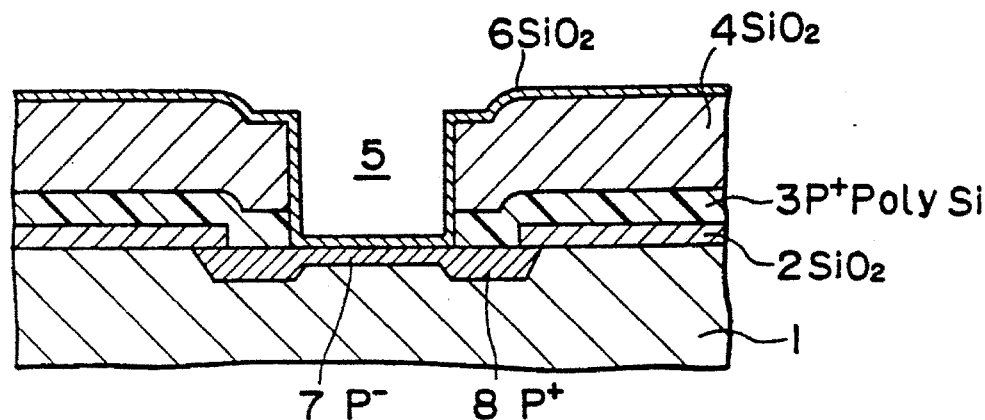
FIG. IB  PRIOR ART
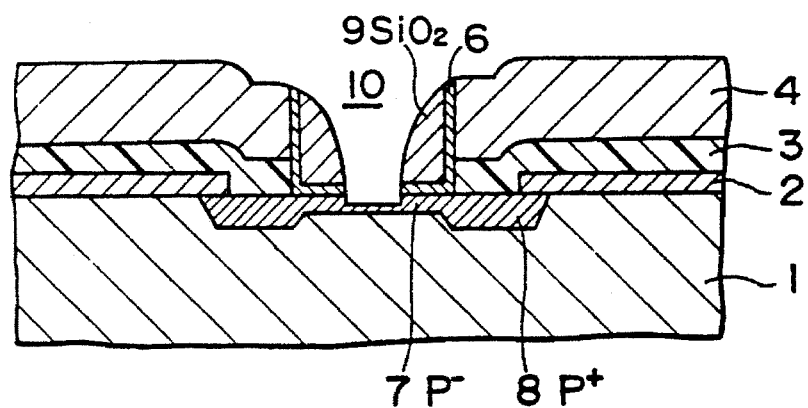
FIG. IC  PRIOR ART
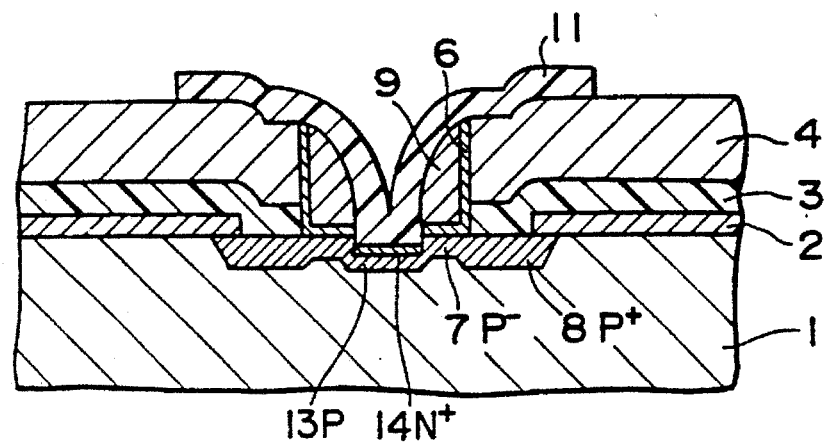

F I G. 12A
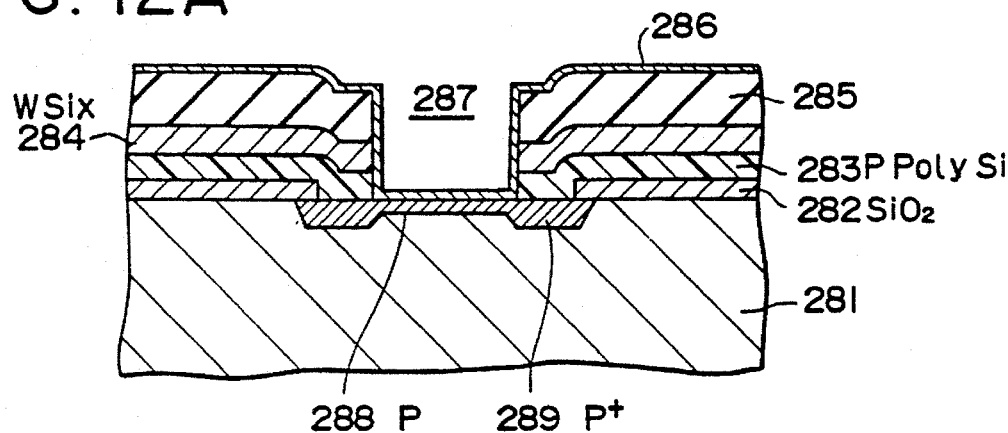
F I G. 12B
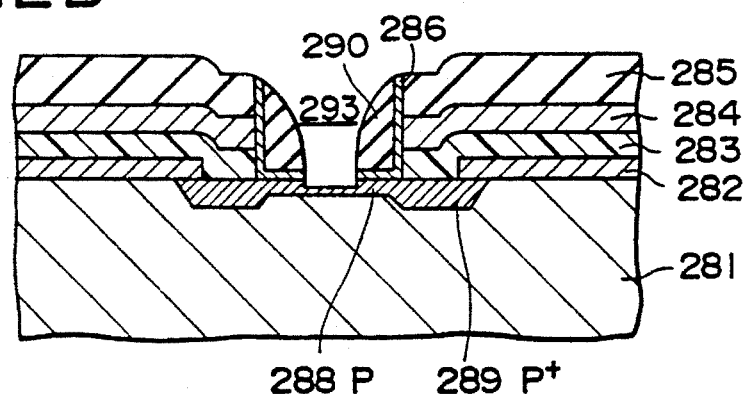
F I G. 12C
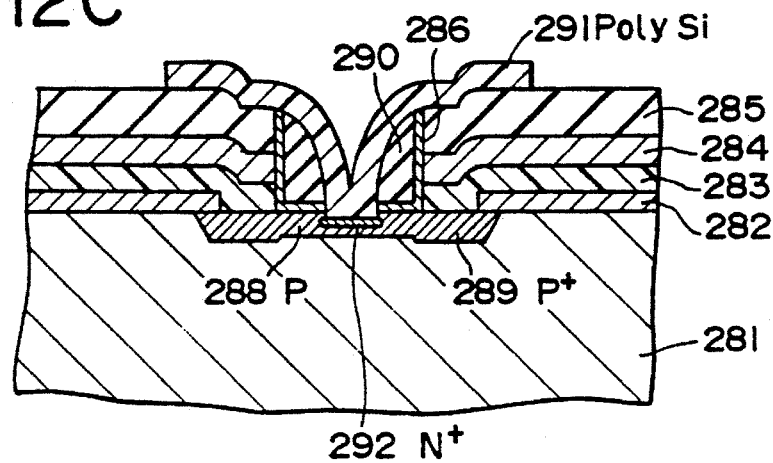

F I G. 15A
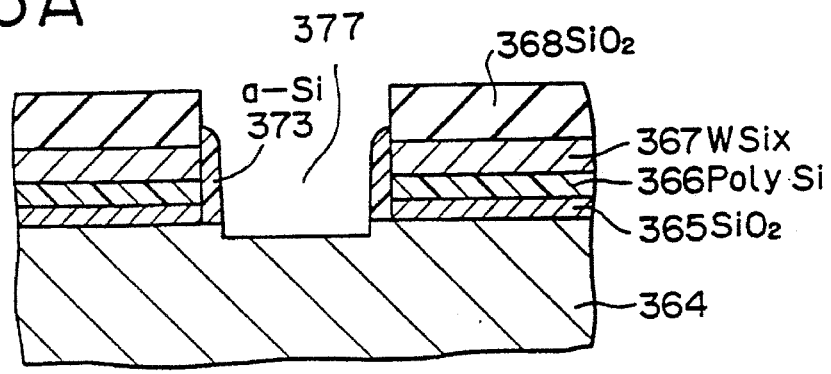
F I G. 15B
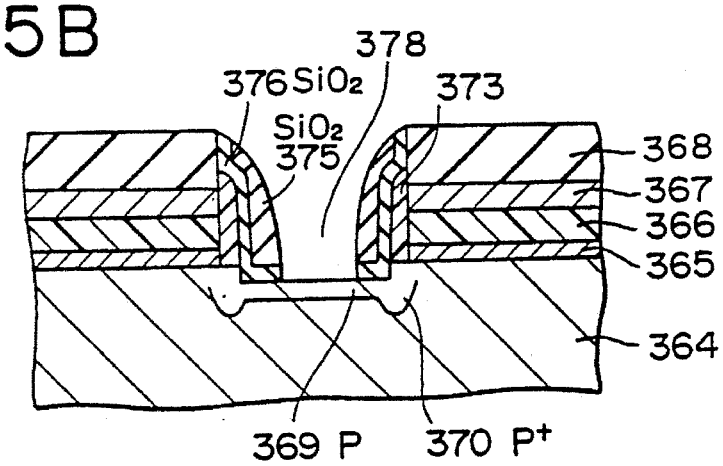
F I G. 15C
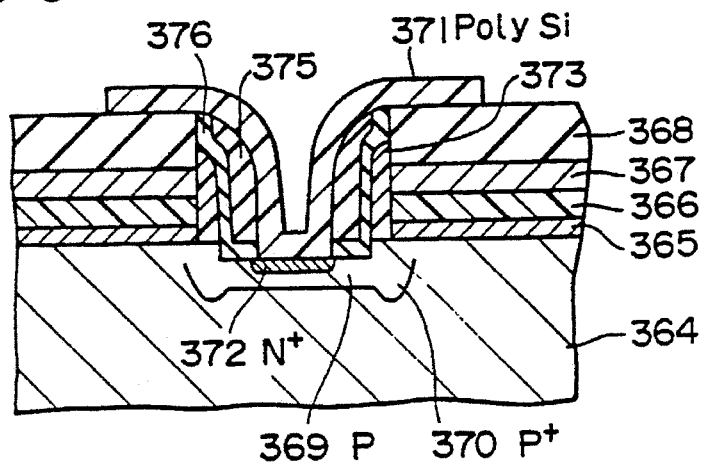

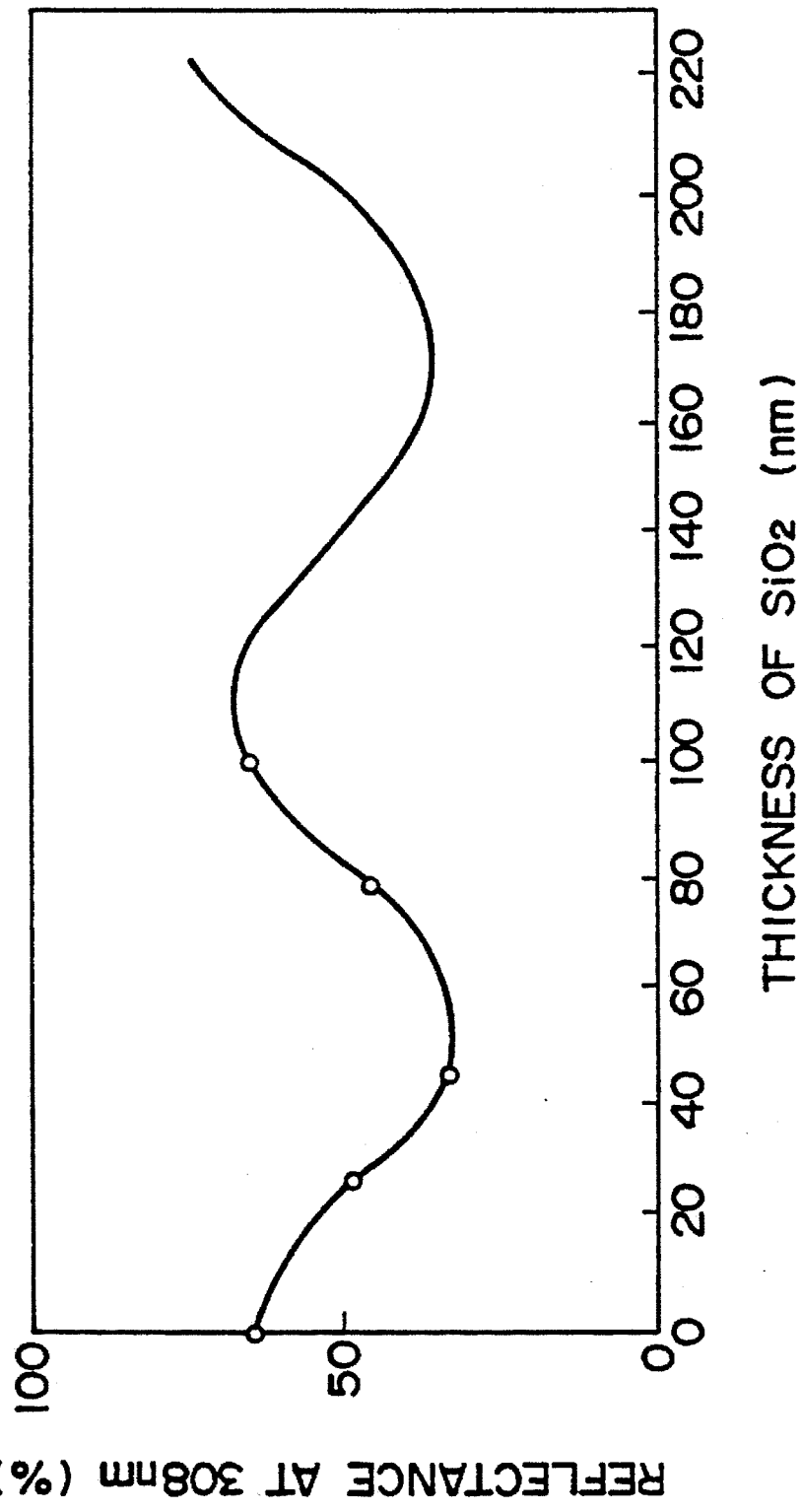

METHOD FOR MAKING BIPOLAR TRANSISTOR HAVING DOUBLE POLYSILICON STRUCTURE

This is a division of application Ser. No. 08/196,569, filed Feb. 15, 1994.

BACKGROUND OF THE INVENTION

1. Field of the Invention

The present invention relates to the field of semiconductor devices and a manufacturing method therefor, and, more particularly the present invention relates to a bipolar transistor design and manufacturing method.

2. Description of the Related Art

In recent years, there have been demands for further large scale integration and increased performance of LSIs. In particular there has been demand for increased performance of bipolar transistor.

The performance of a bipolar transistor can be increased by reducing base transit time through narrowing of the base width, a reduction in base resistance, and a reduction in parasitic capacitance which is represented by a base-collector capacitance. In reality, however, these parameters conflict with each other, and therefore optimization is required.

For example, the reduction in base transit time by narrowing of the base width results in an increase in intrinsic base resistance. Therefore, it is necessary to find an optimum base width.

In this regard, more detailed discussion will be made with reference to FIGS. 1A to 1C, which are sectional views of an upper portion of a silicon substrate in which emitter and base regions of a high-speed npn bipolar transistor in the related art are formed.

As shown in FIG. 1C, the bipolar transistor has a so called double polysilicon structure such that electrodes for a base 13 and an emitter 14 are formed from two polysilicon layers 3 and 11, respectively. The electrodes 3 and 11 are isolated from each polysilicon layers 3 and 11, respectively. The electrodes 3 and 11 are isolated from each other by an insulating film side wall 9 to thereby greatly reduce a base-collector capacitance.

As will be understood from the following description of the manufacturing process for a bipolar transistor, the base 13 is formed by solid-phase diffusion from the emitter electrode 11 as the diffusion source, thereby preventing channeling tail from occurring in ion implantation to reduce the base width. Additionally, as shown in FIG. 1C, a link base 7 for connecting the base 13 to the base electrode 3 is formed.

The manufacturing process for the bipolar transistor mentioned above will now be described.

Referring to FIG. 1A, an insulating film 2 having a thickness of 100 to 200 nm is formed by CVD (chemical vapor deposition) on the whole surface of a silicon wafer as a substrate 1, and is then opened at a base electrode forming portion of the bipolar transistor. Then, a p-type polysilicon film 3 having a thickness of 100 to 200 nm is formed by CVD on the whole surface of the wafer. The polysilicon film 3 functions as a base electrode. The doping of the polysilicon film 3 may be performed by ion implantation. An insulating film 4 having a thickness of 300 to 400 nm is then formed by CVD on the whole surface of the wafer.

Then, a laminated film comprised of the insulating film 4 and the polysilicon film 3 is removed at the base and emitter forming portion by a known dry etching technique to form a hole 5. An insulating film 6 having a thickness of 10 to 20 nm is formed by CVD on the whole surface of the wafer. A p-type diffused layer 7 is subsequently formed by ion implantation. The p-type diffused layer 7 functions as a link base for connecting the base electrode and a base to be formed later. The insulating film 6 having a thickness of 10 to 20 nm functions as a buffer layer for preventing channeling tail in the ion implantation for forming the link base 7.

Then, annealing 900° C. for 10 to 20 min is performed to diffuse impurities from the p-type polysilicon film 3 into the substrate 1, thereby forming a $p^+$ contact layer 8 as a graft base.

Referring next to FIG. 1B, an insulating film having a thickness of 400 to 600 nm is formed by CVD, and is then wholly etched by anisotropic etching using a known dry etching technique to thereby form a side wall 9 from this insulating film and define a hole 10. The side wall 9 performs the function of isolating the base electrode 3 from an emitter electrode 11 (see FIG. 1C) which will be formed later.

Referring next to FIG. 1C, a polysilicon film 11 having a thickness of from 100 to 200 nm is formed by CVD. The polysilicon film 11 functions as an emitter electrode. Then, $p^+$ ions are implanted into the substrate 1 and annealing is performed to thereby form a base diffused layer 13. Then, $n^+$ ions are implanted into the base diffused layer 13 and annealing is performed to thereby form an emitter diffused layer 14.

Although not shown, electrodes are formed by using a known wiring technique after obtaining the structure of FIG. 1C.

According to this method, the base 8 is formed by the solid-phase diffusion from the polysilicon film 3, thereby eliminating the channeling tail upon ion implantation and reducing the base width.

However, the above described method has the following disadvantages. In forming the link base 7 shown in FIG. 1A, the shallow junction of the link base 7 is necessary for high performance. This can be achieved by ion implantation with low energy or counter doping of an n-type impurity.

However, the shallow junction of the link base 7 causes an increase in base resistance. That is, when an ion implantation dose is increased to reduce a base resistance, a junction depth is increased because of channeling to invite an increase in base width, or a base Gummel number is increased to cause a reduction in current amplification factor $H_{fe}$, for example. As a result, the sheet resistance of the link base 7 actually becomes higher than that of the graft base 8.

Thus, an increase in base resistance is unavoidable in improving the characteristics by a reduction in base transit time.

Further, during over etching the insulating film in the formation of the side wall 9 shown in FIG. 1B, the base layer formed in the silicon substrate is partially cut because a selection ratio of silicon/silicon dioxide is unsatisfactory in this known dry etching technique, thus causing a variation in base width.

FIGS. 2A to 2C shows a second example of the bipolar transistor in the related art, which employs a stacked structure composed of a refractory metal or its silicide ($WSi_x$ in this example) film and a polysilicon film as a base electrode for the purpose of reducing a resistance of the base electrode to thereby reduce the base resistance. In this case, however, the above problems still remain, and additionally the surface condition becomes unstable through generation of a leakage current.

A manufacturing process for the bipolar transistor having the stacked structure mentioned above will now be described with reference to FIGS. 2A to 2C.

Referring to FIG. 2A, an insulating film 22 having a thickness of from 100 to 200 nm is formed by CVD on the whole surface of a silicon wafer substrate 21, and is then opened at a base electrode forming portion of the bipolar transistor. Then, a p-type polysilicon film 23 having a thickness of from 100 to 200 nm is formed by CVD on the whole surface of the wafer. Then, a tungsten silicide (WSi$_x$) film 24 refractory metal or its silicide film having a thickness of from 100–200 nm is formed by CVD on the whole surface of the wafer. This laminated structure composed of the tungsten silicide film 24 and the polysilicon film 23 functions as a base electrode. The doping of the polysilicon film 23 may be performed by ion implantation. Then, an insulating film 25 having a thickness of 300 to 400 nm is formed by CVD on the whole surface of the wafer.

A laminated film composed of the insulating film 25, the tungsten silicide film 24 and the polysilicon film 23 is then removed at the base and emitter forming portion by a known dry etching technique to form a hole 27. An insulating film 26 having a thickness of from 10 to 20 nm is formed on the whole surface of the wafer by CVD at a low temperature of about 400° C. Then, a p-type diffused layer 28 is formed by ion implantation. The p-type diffused layer 28 functions as a base. The insulating film 26 having the thickness of from 10 to 20 nm functions as a buffer layer for preventing channeling tail in ion implantation for forming the base 28.

Referring next to FIG. 2B, an insulating film having a thickness of from 400 to 600 nm is formed by CVD, and is then wholly etched by anisotropic etching using a known dry etching technique to thereby form a side wall 30 from this insulating film and define a hole 31. The side wall 30 isolates the base electrode from an emitter electrode which will be formed later.

Referring next to FIG. 2C, a polysilicon film 32 having a thickness of from 100 to 200 nm is formed by CVD. The polysilicon film 32 functions as an emitter electrode. Then, n$^+$ ions are implanted into the base diffused layer 28 and annealing is performed to form an emitter diffused layer 33.

Although not shown, electrodes are formed by using a known wiring technique after obtaining the structure of FIG. 2C.

As mentioned above, the CVD film 26 is formed at a low temperature of about 400° C. to prevent channeling tail upon base ion implantation and also to prevent the occurrence of metal contamination due to the exposure of the tungsten silicide film 24 to the side surface of the hole 27 and the of peeling of the tungsten silicide film 24 due to stress generated in it during heat treatment. However, the low-temperature CVD film 26 is weaker in quality than an oxide film formed from the silicon substrate 21 by oxidation or a film formed by CVD at a high temperature of 700° to 800° C. Additionally, an interface level is generated at the interface between the silicon substrate 21 and the CVD film 26, causing instability of transistor operation. In particular, when the surface of the silicon substrate 21 is inverted by the interface level, a collector-emitter leakage current is generated which causes a reduction in yield.

Further, the above laminated structure has the following problem. Since the diffusion coefficient of an impurity in a silicide film such as a tungsten silicide film is large, it results in the absorption of the impurity by the silicide film when using the silicide film as a drawing electrode. In the example shown in FIGS. 2A to 2C, the absorption of a p-type impurity (e.g., boron) by the silicide film 24 occurs in the base drawing electrode. More specifically, the p-type impurity in the p-type polysilicon film 23 is diffused into the tungsten silicide film 24 to segregate at the interface between the insulating film 25 and the tungsten silicide film 24. As a result, the concentration of the p-type impurity in the polysilicon film 23 and at the interface between the tungsten silicide film 24 and the polysilicon film 23 is reduced. Accordingly, the resistance of the polysilicon film 23 and the connection resistance at the interface between the tungsten silicide film 24 and the polysilicon film 23 are increased to cause an increase in external base resistance.

This problem is contrary to the original reasons for employing the silicide film for the reduction in base resistance, and it is therefore desired to solve this problem.

A recent very high-speed bipolar transistor design, has adopted a double polysilicon structure where two polysilicon films are used as emitter and base drawing electrodes. The polysilicon film which is used as the base drawing electrode has also recently been replaced by a polycide film for the purpose of reducing the base spreading resistance Rbb' to thereby further increase operating speed. As a material for forming such a polycide film, tungsten silicide is desirably used from the viewpoint of process consistency or application to a BiCMOS device, because the tungsten silicide has been established as a gate material in MOS devices.

However, in a base polycide film having a stacked structure composed of a p$^+$ polysilicon film and a tungsten silicide film, an impurity such as boron in the p$^+$ polysilicon film is absorbed into the tungsten silicide film which results in a reduction of the concentration of the impurity in the polysilicon film, and the diffusion of the impurity from the p$^+$ polysilicon film into a silicon substrate is accordingly suppressed to cause an increase in contact resistance between the polysilicon film and the silicon substrate. Thus, the base spreading resistance Rbb' cannot be greatly reduced in spite of the use of the polycide film.

In this regard, more detailed discussion will be made with reference to FIGS. 3A to 3D, which are sectional views of an upper portion of a silicon substrate in which emitter and base regions of an npn bipolar transistor in the related art are formed. The bipolar transistor has a stacked structure of a p-polysilicon film and a tungsten silicide film as a base drawing electrode.

Referring to FIG. 3A, a silicon dioxide film 42 as an insulating film having a thickness of 100 nm is formed by CVD on the whole surface of a silicon substrate 41, and is then opened at a base electrode forming portion. Then, a polysilicon film 43 having a thickness of 100 nm is formed by CVD on the whole surface of the substrate 41, and a tungsten silicide film 44 having a thickness of 80 nm is then formed by CVD on the whole surface of the substrate 41. Then, boron fluoride ions (BF$_2^+$) are implanted into the polysilicon film 43 under the conditions of 30 keV and 5E15 cm$^{-2}$ to form a p-type polycide film. Then, a silicon dioxide film 45 having a thickness of 300 nm is formed by CVD on the whole surface of the substrate 41. A laminated structure of the silicon dioxide film 45, the tungsten silicide film 44 and the polysilicon film 43 at a base/emitter forming portion is removed by RIE (reactive ion etching) to form a hole 52.

Then, boron fluoride ions are implanted into the substrate 41 to form a p-type diffused layer 47 (link base layer) for connecting a base electrode to a base which will be formed later. Then, annealing at 900° C. for 20 min is performed to diffuse the boron ions from the p⁺ polysilicon film 43 into the substrate 41 to form a graft base layer 46.

Referring next to FIG. 3B, a silicon dioxide film having a thickness of 600 nm is formed by CVD on the whole surface of the substrate 41, and is then wholly etched by RIE to thereby form an emitter/base isolating side wall 50 from this insulating film and define a hole 53. Then, the silicon substrate 41 exposed to the hole 53 is etched to partially remove the link base layer 47.

Referring next to FIG. 3C, a polysilicon film 48 having a thickness of 150 nm is formed by CVD. Then, p⁺ ions are implanted into the substrate 41 and annealing is performed to form a base diffused layer 51. Then, n⁺ ions are implanted into the base diffused layer 51 and annealing is performed to form an emitter diffused layer 49.

Although not shown, electrodes are formed by using a known wiring technique after obtaining the structure of FIG. 3C. The bipolar transistor having the above-mentioned structure has the following problem.

FIG. 3D is an enlarged view of a contact portion between the base drawing electrode and the silicon substrate. In FIG. 3D, arrows show a primary route of a base current. The base current flowing in the tungsten silicide film 44 is introduced through the contact between the p⁺ polysilicon film 43 and the silicon substrate 41 into the graft base layer 46.

However, the boron in the p⁺ polysilicon film 43 is absorbed by the tungsten silicide film 44 to result in a reduction in boron concentration in the p⁺ polysilicon film 43. Accordingly, the contact resistance between the Polysilicon film 43 and the silicon substrate 41 is increased to generate a large series resistance. Finally, the base resistance is increased to hinder a high-speed operation.

Further, the above method involves the following problem. That is, in forming the base drawing electrode, it is necessary to align the window of the insulating film 42 and the base drawing electrode composed of the tungsten silicide film 44 and the polysilicon film 43. Accordingly, an aligning margin causes an increase in contact area, resulting in an increase in base resistance and base-collector capacitance which degrades the improvement in characteristics.

One method of solving this problem, is known in which a base electrode is formed on an insulating film and is connected through a side wall of polysilicon or the like to a silicon substrate. However, in forming the polysilicon side wall, a refractory metal or its silicide film such as a tungsten silicide film is exposed to the side surface of the hole, so that metal contamination may occur or peeling of the refractory metal or its silicide film may occur because of a stress generated therein during heat treatment.

In such a structure where the polysilicon side wall is used as a base drawing electrode, the surface of the polysilicon side wall is oxidized in order to ensure a withstand voltage of an emitter/base isolating side wall insulating film. Accordingly, the heat treatment in this oxidation similarly causes peeling of the refractory metal or its silicide film.

In association with a reduction in emitter width by a decrease in element size, the area of a diffused layer (graft base) region for base electrode drawing and the area of a link base region for connecting an intrinsic base region to the graft base region become larger than the intrinsic base region. Accordingly, a reduction in such parasitic capacitance component is essential for an increase in operating speed. On the other hand, a reduction in width of the link base region causes a deterioration in emitter-base characteristic and high-frequency characteristic in the transistor. Further, a reduction in width of the graft base region causes a problem in an aspect of process stability. Thus, it is necessary to find out an optimum point in the reduction in widths of the link base region and the graft base region.

This problem will now be further discussed with reference to FIG. 4, which is a sectional view of an upper portion of a silicon substrate 71 in which an emitter 80 and a base 78 of a high-speed npn bipolar transistor in the related art are formed. This bipolar transistor has a so-called double polysilicon structure such that an emitter electrode and a base electrode are formed from two polysilicon-films 79 and 76, respectively. The emitter electrode 79 and the base electrode 76 are isolated from each other by an insulating film side wall 81 to thereby greatly reduce a base-collector capacitance. Further, a link base for connecting the base 78 to a graft base 77 is formed.

However, in the structure shown in FIG. 4, the width of the emitter 80 is 300 nm and the width of the graft base 77 is 400 nm in design pattern, which is increased to 1100 nm after diffusion. Thus, the area of the parasitic component is very large. Accordingly, it is necessary to sufficiently narrow the graft base region without hindering the characteristics by connection of the link base, so as to increase an operating speed.

FIG. 5 shows an example of a high-speed bipolar transistor having a double polysilicon emitter-base self-aligned structure. An emitter polysilicon film 100 is larger in width than the stacked electrode of a barrier metal layer 98 and an aluminum layer 99, and is patterned simultaneously with patterning of the stacked electrode, because a large tolerance of the emitter polysilicon film 100 on a mask can be taken.

In general, an emitter polysilicon film is etched by plasma etching or RIE in a size larger than that for the stacked electrode before forming a barrier metal layer. As shown in FIG. 6A, an edge portion of an emitter polysilicon film 111 is substantially perpendicular to a background 110 in general. However, depending upon a step form of the background 110 or an over etching quantity during etching, an edge portion of an emitter polysilicon film 112 becomes reversely tapered as shown in FIG. 6B. In forming a barrier metal/aluminum stacked film on the emitter polysilicon film 112, a coverage defect of a barrier metal layer 113 may occur at the step portion as shown in FIG. 7A. Additionally, a coverage defect of an aluminum layer 114 on the barrier metal layer 113 may occur at the step portion as shown in FIG. 7B or a void 115 may be generated in the aluminum layer 114 as shown in FIG. 7C. Moreover, these defects may cause stress migration or electromigration. In addition, as shown in FIG. 7D, the intrusion of aluminum from an aluminum layer 138 into an emitter polysilicon film 137 may occur as shown by 133, causing an emitter-base junction defect.

In general, an emitter in a bipolar transistor is formed by impurity diffusion from a polysilicon film owing to the fact that washed emitter and shallow junction can be effected and a current amplification factor $H_{fe}$ can be increased by the presence of a native oxide at the interface between the polysilicon film and a silicon substrate.

In increasing the operating speed of a bipolar transistor, creating a shallow junction for an emitter is an important technique. Conventionally, rapid thermal annealing using a halogen lamp is generally performed to effect the shallow junction. For example, a polysilicon film doped with arsenic at a concentration of $10^{20}$ to $10^{21}$ cm⁻³ is formed to have a thickness of 100 to 150 nm after forming a base, and then IRA (infrared annealing) using a halogen lamp is performed to diffuse the arsenic into a single crystal silicon substrate, thereby realizing an emitter junction depth $X_{je}$ of 0.1 μm.

However, to further reduce the emitter junction depth $X_{je}$, by means of IRA, the thickness of the polysilicon film for forming the emitter must be increased to 150 to 200 nm because the wavelength range of light from the halogen lamp is wide such as 0.2 to 6.0 μm or more and the light intensity at a long wavelength with a high transmissivity is large. The increase in thickness of the polysilicon film for forming the emitter causes an increase in emitter delay time due to an increase in emitter resistance $R_E$, thus hindering high-speed operation. Accordingly, there is a limit in realizing the shallow junction of the emitter by IRA.

As another method of rapid thermal annealing, it is known to use laser irradiation instead of the halogen lamp to effect emitter diffusion. For example, in using single pulse irradiation of an excimer laser (ELA) (e.g., XeCl: pulse width of 20 ns, wavelength of 308 nm), the absorption coefficient of silicon is large such as about $10^6$ cm$^{-1}$, and the energy of laser light absorbed is about 90% within a depth of 20 nm from the silicon surface. Accordingly, it is possible that a polysilicon film doped with arsenic at a concentration of $10^{20}$ to $10^{21}$ cm$^{-3}$ is formed to have a thickness of 30 to 50 nm after forming a base, and then ELA (excimer laser annealing) is performed to diffuse the arsenic into a single crystal silicon substrate, thereby realizing an emitter junction depth $X_{je}$ of about 0.05 μm.

However, in performing the emitter diffusion from a polysilicon film into a single crystal silicon substrate, the following problem arises. That is, the polysilicon film formed in contact with the single crystal silicon substrate at an emitter forming portion is hardly increased in temperature because the silicon substrate has good thermal conductivity and the heat in the polysilicon film is therefore dissipated into the silicon substrate. To the contrary, the polysilicon film formed on an insulating film (silicon dioxide) at a portion other than the emitter forming portion is easily increased in temperature because the insulating film has poor thermal conductivity. For example, the thermal conductivity of silicon is 148 W/mK, and the thermal conductivity of silicon dioxide is 1.38 W/mK; thus, the former is greater than the latter by two orders of magnitude. For example, when an amount of energy of 400 mJ/cm$^2$ is absorbed into the polysilicon film having a thickness of 50 nm, the polysilicon film at the emitter forming portion takes 17 ns until it reaches the melting point, whereas the polysilicon film on the insulating film takes only 3 ns until it reaches the melting point. This has been proved from a thermal conduction simulation.

Accordingly, if ELA is performed under the conditions fit for the formation of emitter-base junction, the polysilicon film on the insulating film is excessively increased in temperature and melts. Conversely, if ELA is performed under the conditions such that the polysilicon film on the insulating film does not melt, the polysilicon film at the emitter forming portion is not increased in temperature and consequently no emitter-base junction is formed.

SUMMARY OF THE INVENTION

It is a first object of the present invention to provide a semiconductor device such as a high-performance bipolar transistor and a manufacturing method therefor which can simultaneously realize both a reduction in base transit time by a reduction in base width and a reduction in base resistance by a reduction in link base resistance.

It is a second object of the present invention to provide a semiconductor device such as a high-performance bipolar transistor and a manufacturing method therefor which can simultaneously realize both the prevention of metal contamination to an emitter/base forming region and the stabilization of the surface condition of the emitter/base forming region, even in a high-performance device adopting a double polysilicon structure and using a laminated structure composed of a refractory metal or its silicide film and a polysilicon film for a base electrode.

It is a third object of the present invention to provide a semiconductor device such as a high-performance bipolar transistor and a manufacturing method therefor which can suppress the absorption of an impurity from a conducting film such as a polysilicon film into a refractory metal or its silicide film to thereby reduce base resistance and accordingly realize a high-performance device adopting a double polysilicon structure and using a conducting, polycrystal containing laminated structure composed of a refractory metal or its silicide film and a polysilicon film for a base electrode.

It is a fourth object of the present invention to provide a semiconductor device such as a high-performance bipolar transistor and a manufacturing method therefor which can realize a reduction in base spreading resistance Rbb' by selectively forming a silicide layer on the side surface of a base drawing electrode having a laminated structure composed of a polysilicon film and a refractory metal or its silicide film and on a contact portion between the base drawing electrode and a silicon substrate.

It is a fifth object of the present invention to provide a semiconductor device such as a high-performance bipolar transistor and a manufacturing method therefor which can greatly reduce the base-collector parasitic Capacitance and thereby achieve a higher speed of operation by suppressing an increase in width of a graft base due to the lithography margin in opening a window to form the graft base connecting a polysilicon base drawing electrode with a link base.

It is a sixth object of the present invention to provide a semiconductor device such as a high-performance bipolar transistor and a manufacturing method therefor which can reduce the contact area by forming a base drawing region from a refractory metal/polysilicon laminated structure formed on an insulating film and a conducting film connected to the laminated structure, thereby reducing a base resistance and a base-collector capacitance to improve the characteristics, and simultaneously realize the prevention of metal contamination to an emitter/base forming region in forming the conducting film, the stabilization of the surface condition of the emitter/base forming region, and the ensurance of a withstand voltage of an emitter/base isolating side wall insulating film.

It is a seventh object of the present invention to provide a semiconductor device such as a high-performance bipolar transistor and a manufacturing method therefor which can prevent the coverage defect and the cutting of a metal wiring film such as a barrier metal/aluminum layer at a stepped portion of an emitter polysilicon film, the occurrence of electromigration and stress migration, and the intrusion of aluminum due to the breakage of a barrier metal layer, thereby realizing a high yield.

It is an eighth object of the present invention to provide a semiconductor device such as a high-performance bipolar transistor and a manufacturing method therefor which can solve the problem of local temperature rise such that a polysilicon film present on an insulating film excessively increases in temperature during laser annealing, thereby achieving uniform annealing.

Other objects and features of the invention will be more fully understood from the following detailed description and appended claims when taken with the accompanying drawings.

BRIEF DESCRIPTION OF THE DRAWINGS

FIGS. 1A to 1C are sectional views illustrating a manufacturing process for a bipolar transistor as a first example in the related art;

FIGS. 12A to 12C are sectional views illustrating a structure of a bipolar transistor and a manufacturing method therefor according to a fifth preferred embodiment of the present invention;

FIGS. 15A to 15C are sectional views illustrating a structure of a bipolar transistor and a manufacturing method therefor according to a eighth preferred embodiment of the present invention;

FIG. 19 is a graph showing a reflection characteristic of a silicon dioxide film with respect to a laser wavelength.

DETAILED DESCRIPTION OF THE PREFERRED EMBODIMENTS

The preferred embodiments of the present invention will be described with reference to the drawings, it is to be noted that the present invention is not limited to the following preferred embodiments.

A first preferred embodiment of the present invention will be described with reference to FIGS. 8A to 8C, in which the present invention is applied to a high-performance bipolar transistor.

Figure 2A:
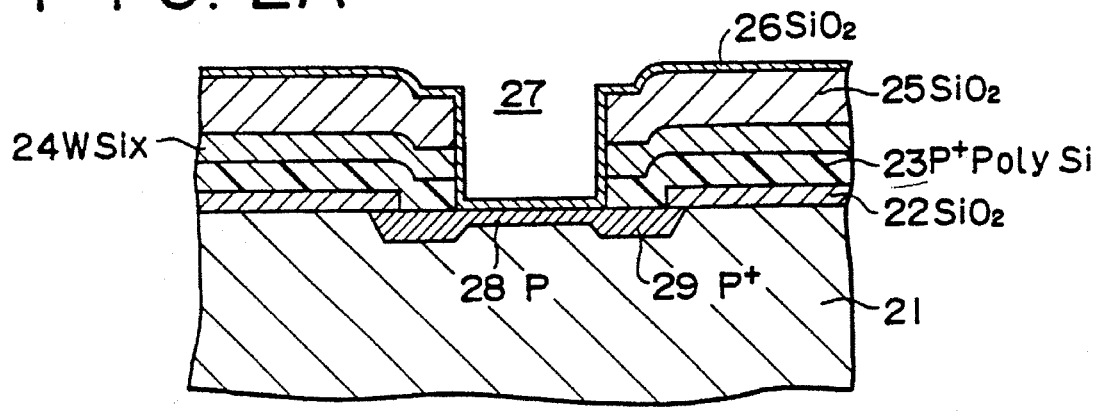
FIGS. 2A to 2C are sectional views illustrating a manufacturing process for a bipolar transistor as a second example in the related art.
Figure 2B:
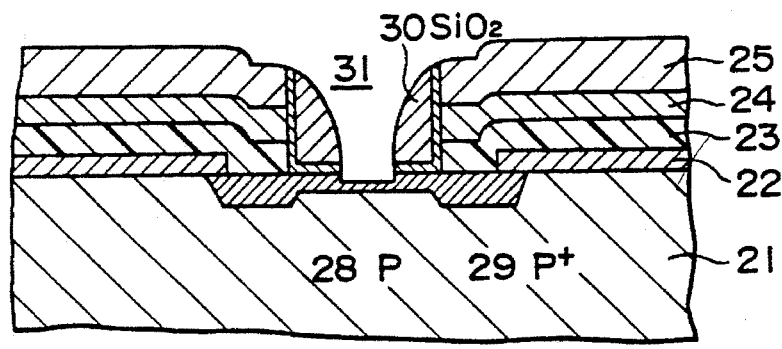
Figure 2C:
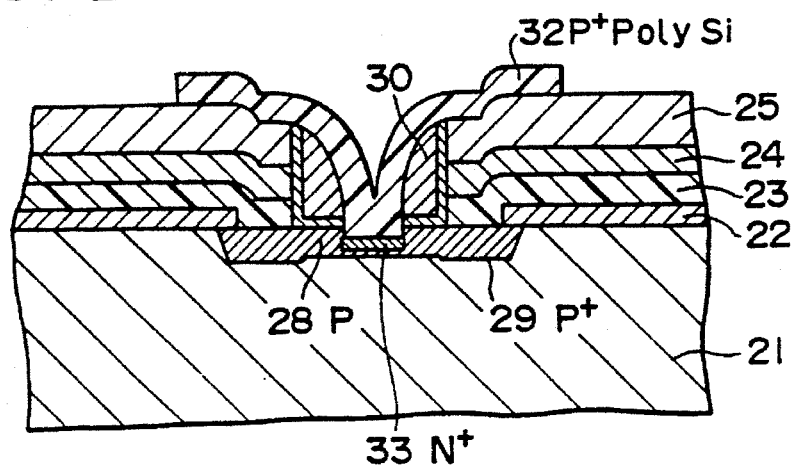
Figure 3A:
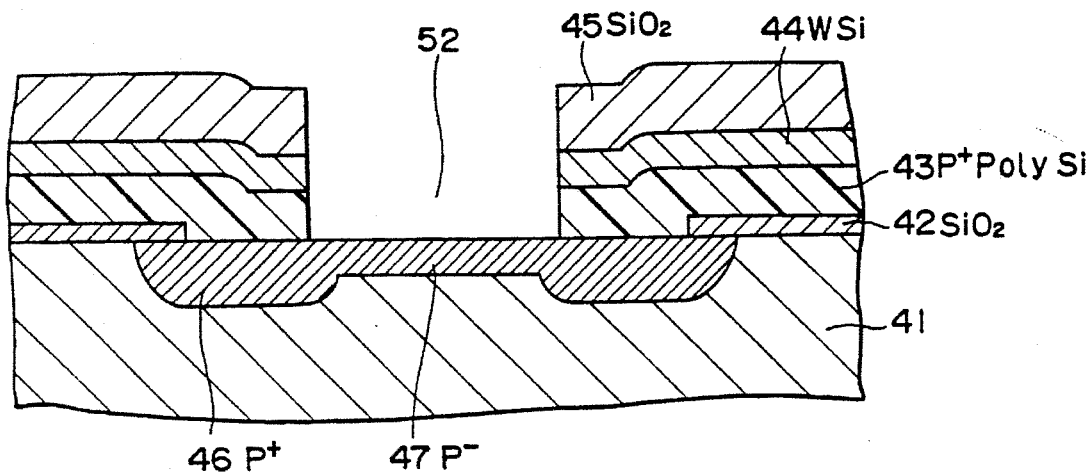
FIGS. 3A to 3D are sectional views illustrating a manufacturing process for a bipolar transistor as a third example in the related art.
Figure 3B:
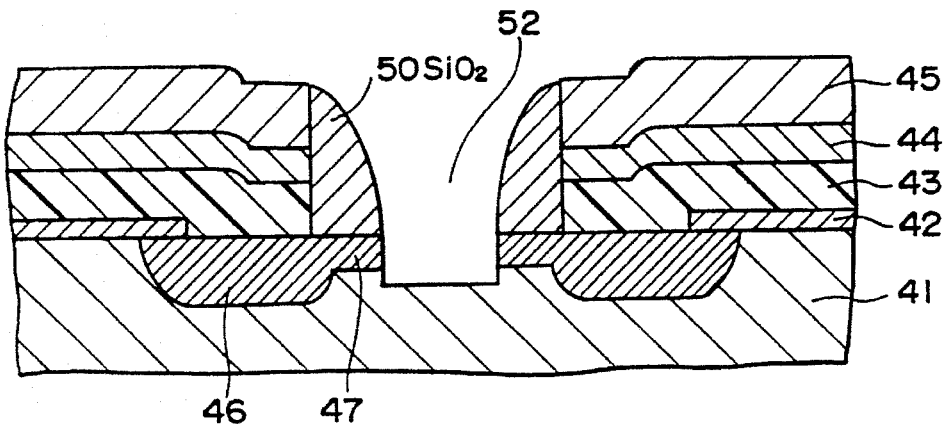
Figure 3C:
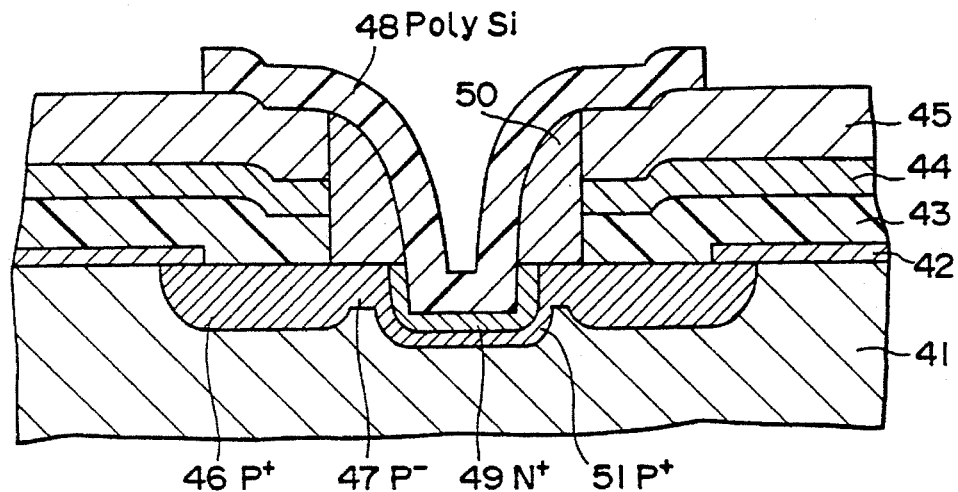
Figure 3D:
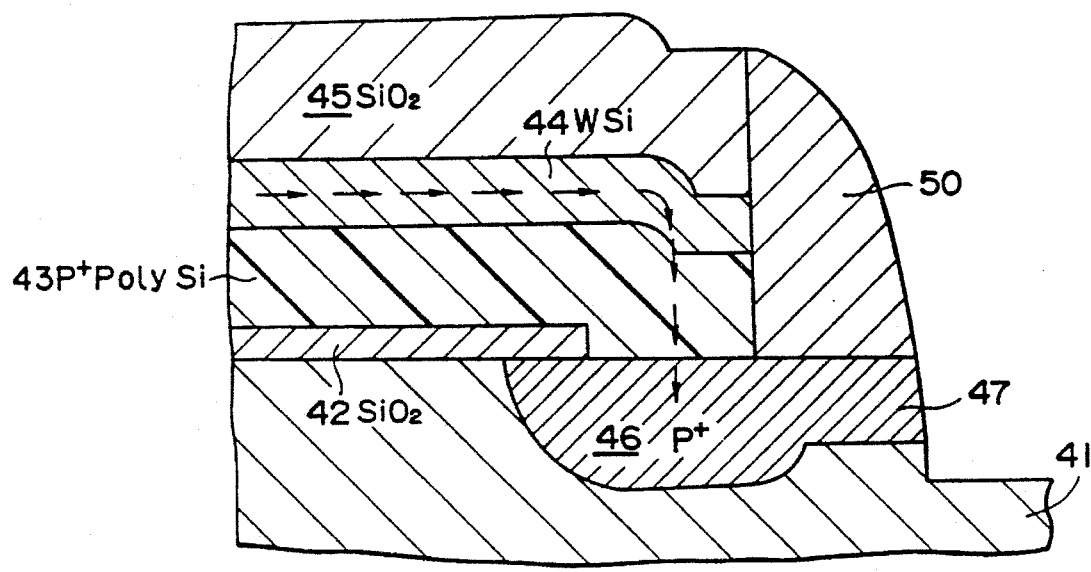
Figure 4:
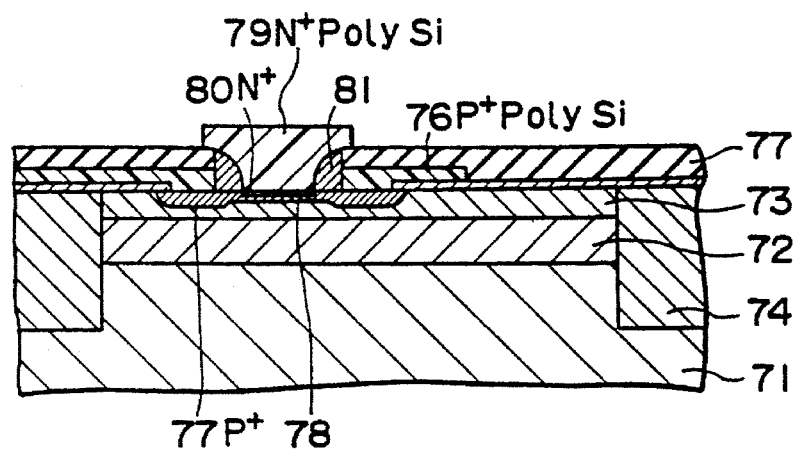
FIG. 4 is a sectional view of a bipolar transistor as a fourth example in the related art.
Figure 5:
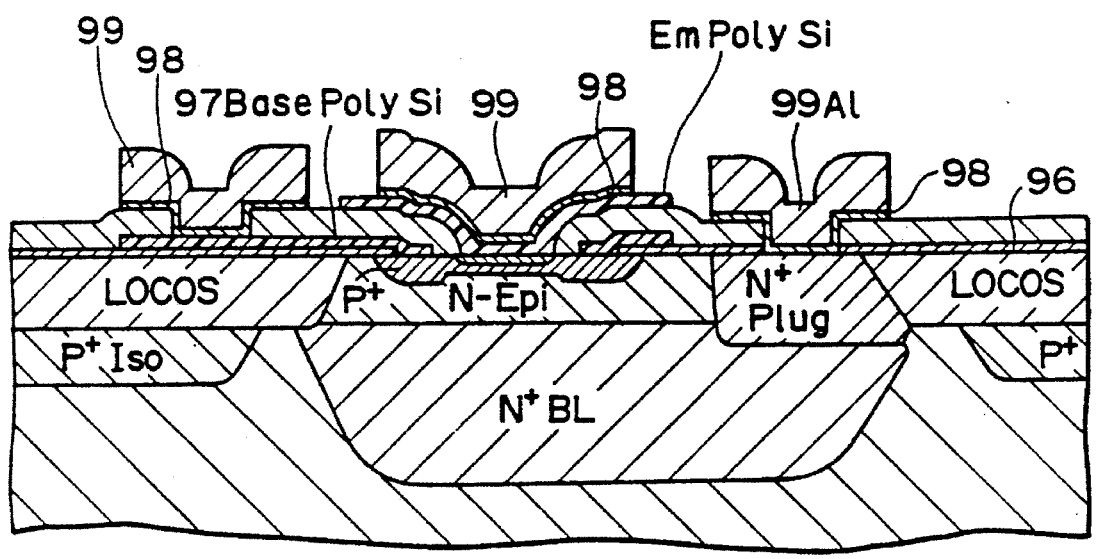
FIG. 5 is a sectional view of a bipolar transistor having a double polysilicon emitter-base self-aligned structure as a fifth example in the related art.
Figure 6A:
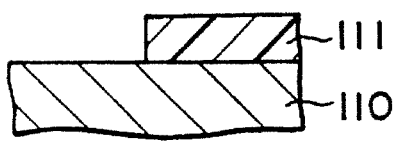
FIGS. 6A and 6B are sectional views illustrating different examples of an edge portion of an emitter polysilicon film in the structure shown in FIG. 5.
Figure 6B:
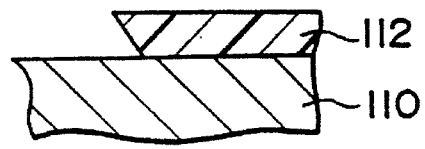
Figure 7A:
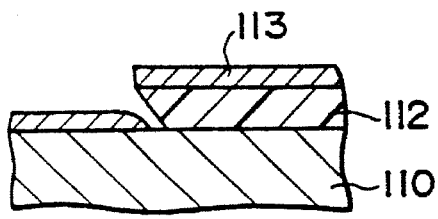
FIGS. 7A to 7D are sectional views illustrating various problems in the structure shown in FIG. 5.
Figure 7B:
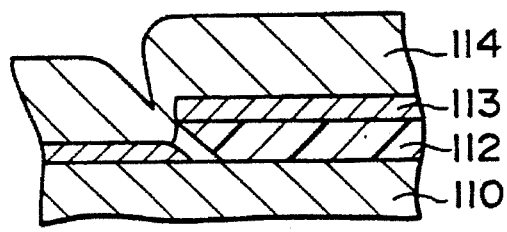
Figure 7C:
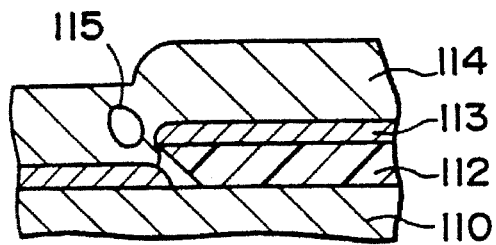
Figure 7D:
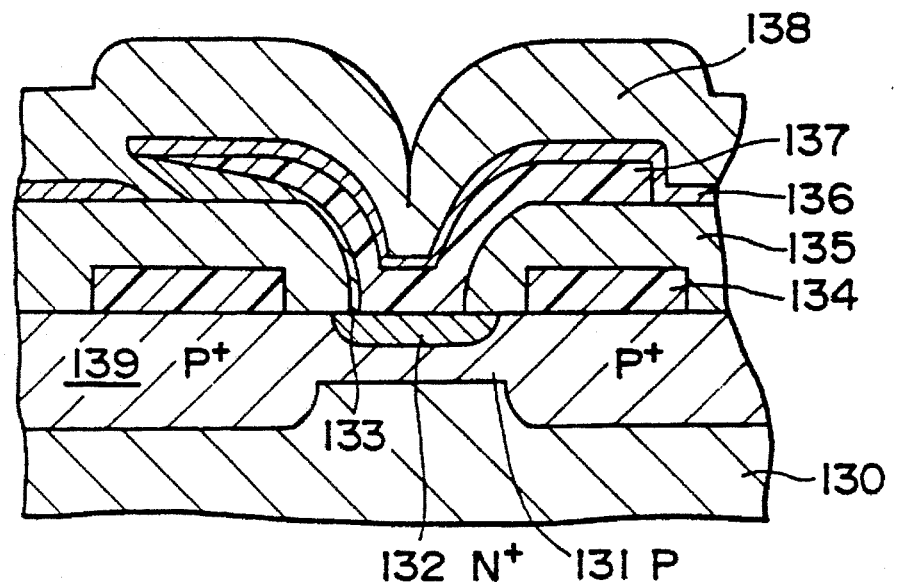
Figure 8A:
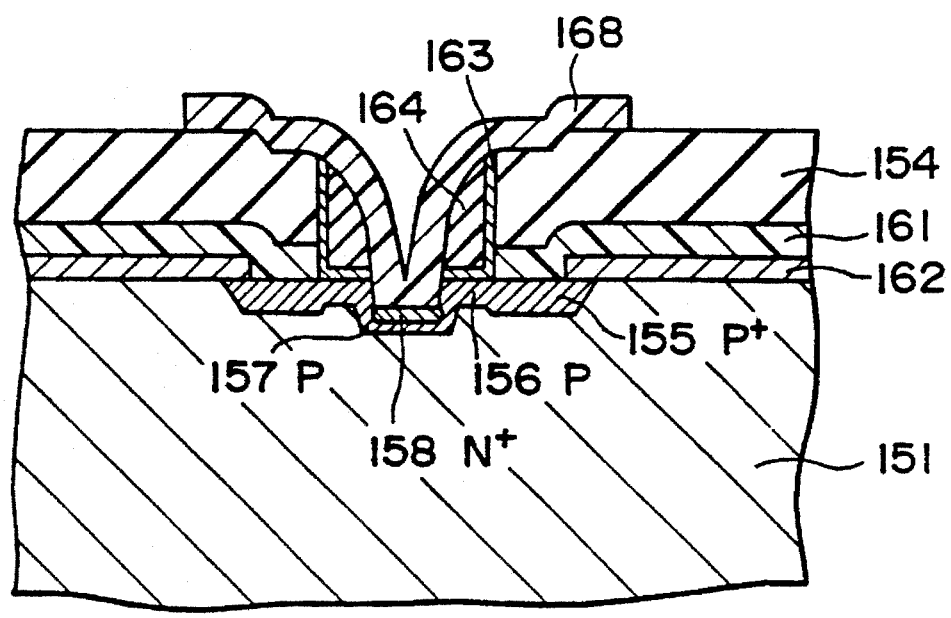
FIGS. 8A to 8C are sectional views illustrating a structure of a bipolar transistor and a manufacturing method therefor according to a first preferred embodiment of the present invention.

In this preferred embodiment, a semiconductor device (bipolar transistor) is manufactured by a method comprising the steps of forming a first impurity diffused layer 155 of a first conduction type in a semiconductor substrate 151; forming a conducting film 161 connected to the first impurity diffused layer 155; forming a first insulating film 154 on the conducting film 161; forming a first hole 165 through a laminated film composed of the first insulating film 154 and the conducting film 161; forming a second impurity diffused layer 156 of the first conduction type in the semiconductor substrate 151 exposed to the first hole 165 (see FIG. 8B); forming a side wall 164 from a second insulating film in the first hole 165 to form a second hole 166 (see FIG. 8C); and forming a third impurity diffused layer 157 of the first conduction type in the semiconductor substrate 151 exposed to the second hole 166 (see FIG. 8A).

The above method, provides a semiconductor device (bipolar transistor) as shown in FIG. 8A which comprises a first impurity diffused layer 155 of a first conduction type formed in a semiconductor substrate 151; a conducting film 161 connected to the first impurity diffused layer 155; an insulating film 154 formed in contact with the conducting film 161; a second impurity diffused layer 156 of the first conduction type formed just under the insulating film 154 and connected to the first impurity diffused layer 155; and a third impurity diffused layer 157 of the first conduction type connected to the second impurity diffused layer 156.

This preferred embodiment will now be described in more detail with reference to FIGS. 8A to 8C, which are sectional views of an upper portion of a silicon substrate in which emitter and base regions of an npn bipolar transistor are formed. The bipolar transistor is manufactured in the following manner.

Figure 8B:
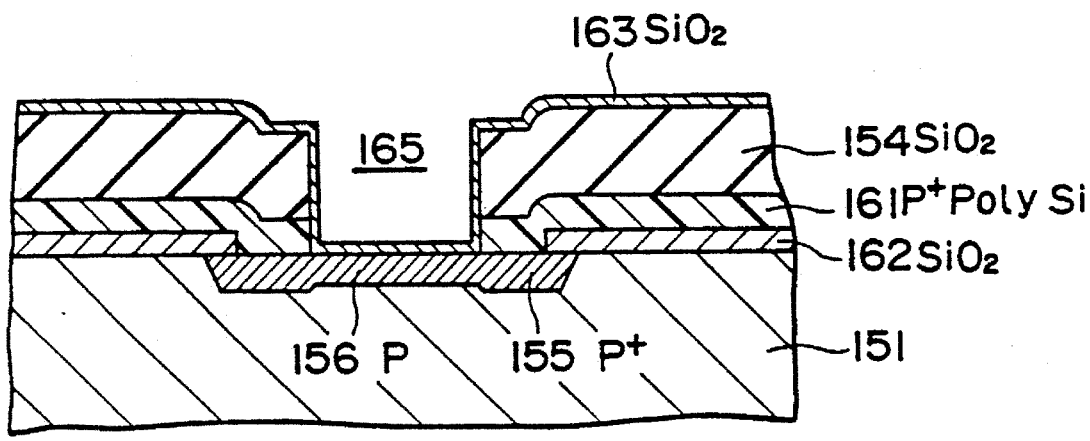

Referring to FIG. 8B, an insulating film 162 having a thickness of 100 to 200 nm is formed by CVD (chemical vapor deposition) on the whole surface of a silicon wafer substrate 151, and is then opened at a base electrode forming portion of the bipolar transistor. Then, a p-type polysilicon film 161 having a thickness of 100 to 200 nm is formed by CVD on the whole surface of the wafer. The polysilicon film 161 functions as a base electrode. The doping of the polysilicon film 161 may be performed by ion implantation. Then, an insulating film 154 having a thickness of 300 to 400 nm is formed by CVD on the whole surface of the wafer.

Then, a laminated film composed of the insulating film 154 and the polysilicon film 161 is removed at the base and emitter forming portion by a known dry etching technique to form a hole 165. Then, an insulating film 163 having a thickness of 10 to 20 nm is formed by CVD on the whole surface of the wafer. Then, a p-type diffused layer 156 is formed by ion implantation. The p-type diffused layer 156 functions as a link base. The concentration in the link base 156 can be made higher than that in the prior art because the link base 156 is to be etched off at the base forming region in the subsequent step. The insulating film 163 having the thickness of 10 to 20 nm functions as a buffer layer for preventing channeling tail in the ion implantation for forming the link base 156.

Then, annealing at 900° C. for 10 to 20 min is performed to diffuse impurities from the p-type polysilicon film 161 into the substrate 151, thereby forming a $p^+$ contact layer 155.

Figure 8C:
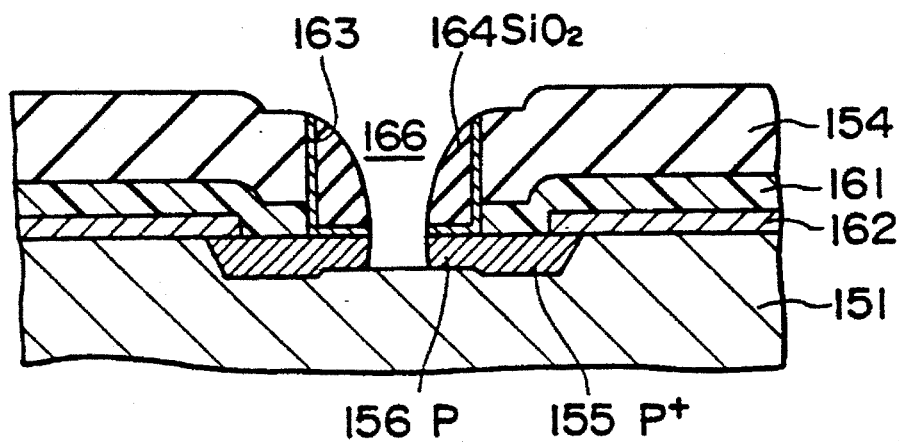

Referring next to FIG. 8C, an insulating film having a thickness of 400 to 600 nm is formed by CVD, and is then wholly etched by anisotropic etching using a known dry etching technique to thereby form a side wall 164 from this insulating film and define a hole 166. The side wall 164 has a function of isolating the base electrode 161 from an emitter electrode 168 (see FIG. 8A) which will be formed later.

Then, the silicon substrate 151 exposed to the hole 166 is etched to remove the link base 156 at the base forming region. Thus, the structure shown in FIG. 8C is obtained. This etching of the silicon substrate 151 may be performed continuously from the anisotropic etching of the insulating film for forming the side wall 164. For example, when this insulating film is a silicon dioxide film, the etching of the silicon dioxide film by the use of a mixture gas of $O_2/CHF_3$ may be performed continuously from the etching of the silicon substrate by the use of a mixture gas of $O_2/SF_6$. Further, the etching of the silicon substrate 151 can be performed in a self-aligned manner with use of the side wall 164 as a mask, thereby minimizing an increase in number of manufacturing steps.

Referring next to FIG. 8A, a polysilicon film 168 having a thickness of 100 to 200 nm is formed by CVD. The polysilicon film 168 functions as an emitter electrode. Then, $p^+$ ions are implanted into the substrate 151 and annealing is performed to thereby form a base diffused layer 157. Then, $n^+$ ions are implanted into the base diffused layer 157 and annealing is performed to thereby form an emitter diffused layer 158.

Although not shown, electrodes are formed by using a known wiring technique after obtaining the structure of FIG. 8A.

According to the method of this preferred embodiment, the base 155 is formed by the solid-phase diffusion from the polysilicon film 168, thereby eliminating the channeling tail upon ion implantation and reducing the base width. Furthermore, since the link base 156 is etched off at the base forming region (see FIG. 8C), the concentration in the link base 156 can be made high. Thus, a reduction in base resistance and a reduction in base width can be simultaneously realized.

A second preferred embodiment of the present invention will be described with reference to FIGS. 9A to 9C. In the first preferred embodiment, the emitter is in contact with the link base having a high concentration at a side wall portion of the emitter electrode, causing the possibility of an increase in junction capacitance, a reduction in withstand voltage, and a reduction in current amplification factor $H_{fe}$. Thus, the second preferred embodiment is intended to avoid this possibility.

This preferred embodiment will now be described in more detail with reference to FIGS. 9A to 9C, which are sectional views of an upper portion of a silicon substrate in which emitter and base regions of an npn bipolar transistor are formed. The bipolar transistor is manufactured in the following manner.

Figure 9A:
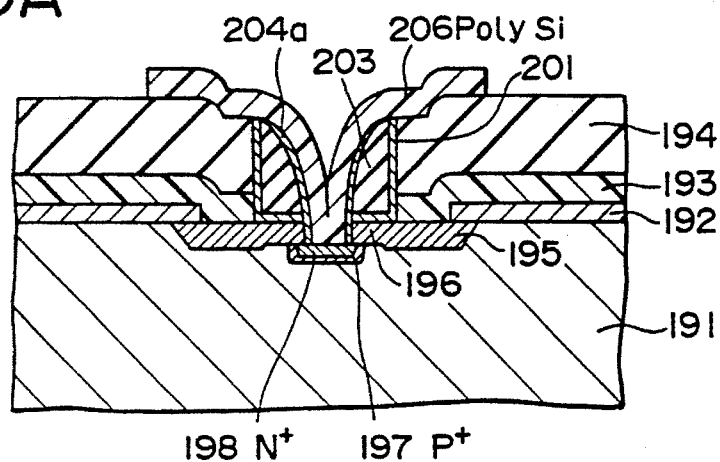
FIGS. 9A to 9C are sectional views illustrating a structure of a bipolar transistor and a manufacturing method therefor according to a second preferred embodiment of the present invention.
Figure 9B:
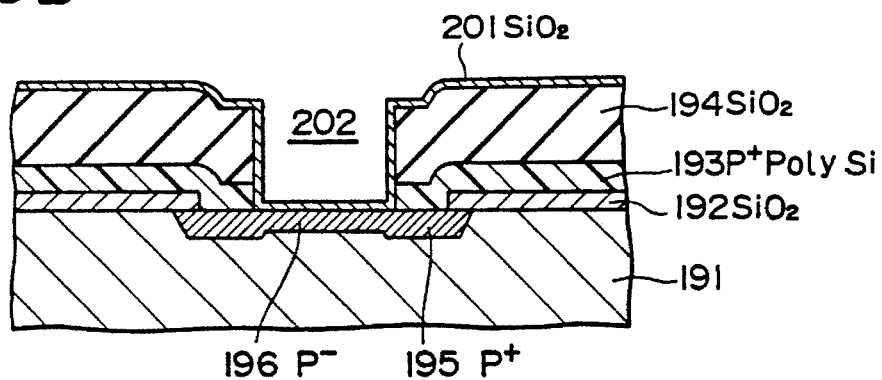

Referring to FIG. 9B, an insulating film 192 having a thickness of 100 to 200 nm is formed by CVD on the whole surface of a silicon wafer as a substrate 191, and is then opened at a base electrode forming portion of the bipolar transistor. Then, a p-type polysilicon film 193 having a thickness of 100 to 200 nm is formed by CVD on the whole surface of the wafer. The polysilicon film 193 functions as a base electrode. The doping of the polysilicon film 193 may be performed by ion implantation. Then, an insulating film 194 having a thickness of 300 to 400 nm is formed by CVD on the whole surface of the wafer.

Then, a laminated film composed of the insulating film 194 and the polysilicon film 193 is removed at the base and emitter forming portion by a known dry etching technique to form a hole 202. Then, an insulating film 201 having a thickness of 10 to 20 nm is formed by CVD on the whole surface of the wafer. Then, a p-type diffused layer 196 is formed by ion implantation. The p-type diffused layer 196 functions as a link base. The concentration in the link base 196 can be made higher than that in the prior art because the link base 196 is to be etched off at the base forming region in the subsequent step. The insulating film 201 having the thickness of 10 to 20 nm functions as a buffer layer for preventing channeling tail in the ion implantation for forming the link base 196.

Then, annealing at 900° C. for 10 to 20 min is performed to diffuse an impurity from the p-type polysilicon film 193 into the substrate 191, thereby forming a $p^+$ contact layer 195.

Figure 9C:
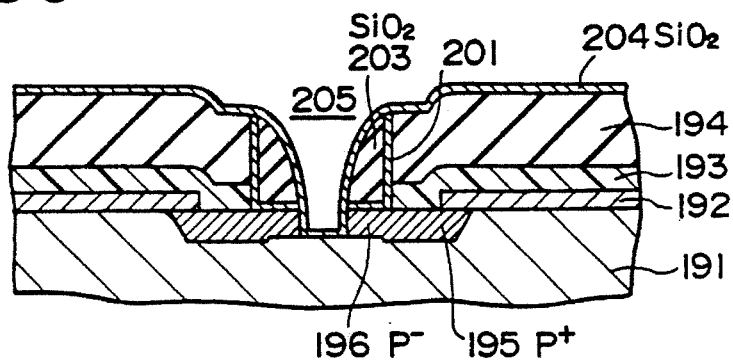

Referring next to FIG. 9C, an insulating film having a thickness of 400 to 600 nm is formed by CVD, and is then wholly etched by anisotropic etching using a known dry etching technique to thereby form a side wall 203 from this insulating film and define a hole 205. The side wall 203 has a function of isolating the base electrode 193 from an emitter electrode 206 (see FIG. 8A) which will be formed later.

Then, the silicon substrate 191 exposed to the hole 205 is etched to remove the link base 196 at the base forming region. This etching of the silicon substrate 191 may be performed continuously from the anisotropic etching of the insulating film for forming the side wall 203. For example, when this insulating film is a silicon dioxide film, the etching of the silicon dioxide film by the use of a mixture gas of $O_2/CHF_3$, may be performed continuously from the etching of the silicon substrate by the use of a mixture gas of $O_2/SF_6$. Further, the etching of the silicon substrate 191 can be performed in a self-aligned manner with use of the side wall 203 as a mask, thereby minimizing the number of manufacturing steps.

Then, an insulating film 204 having a thickness of 50 to 100 nm is formed by CVD on the whole surface of the wafer.

Referring next to FIG. 9A, the insulating film 204 is then wholly etched by anisotropic etching using a known dry etching technique to thereby form an additional side wall 204a from the insulating film 204.

Then, a polysilicon film 206 having a thickness of 100 to 200 nm is formed by CVD. The polysilicon film 206 functions as an emitter electrode. Then, $p^+$ ions are implanted into the substrate 191 and annealing is performed to thereby form a base diffused layer 197. Then, $n^+$ ions are implanted into the base diffused layer 197 and annealing is performed to thereby form an emitter diffused layer 198.

Although not shown, electrodes are formed by using a known wiring technique after obtaining the structure of FIG. 9A.

According to the method of this preferred embodiment, the contact between the emitter 198 and the link base 196 having a high concentration at the side wall portion of the emitter electrode 206 can be prevented by the additional side wall 204a. According to the present invention, in realizing a semiconductor device such as a high-performance bipolar transistor, there can be provided a structure and a manufacturing method which can simultaneously realize both a reduction in base transit time by a reduction in base width and a reduction in base resistance by a reduction in link base resistance.

A third preferred embodiment of the present invention will be described with reference to FIGS. 10A to 10C, which are sectional views of an upper portion of a silicon substrate in which emitter and base regions of an npn bipolar transistor are formed. The bipolar transistor is manufactured in the following manner.

Figure 10A:
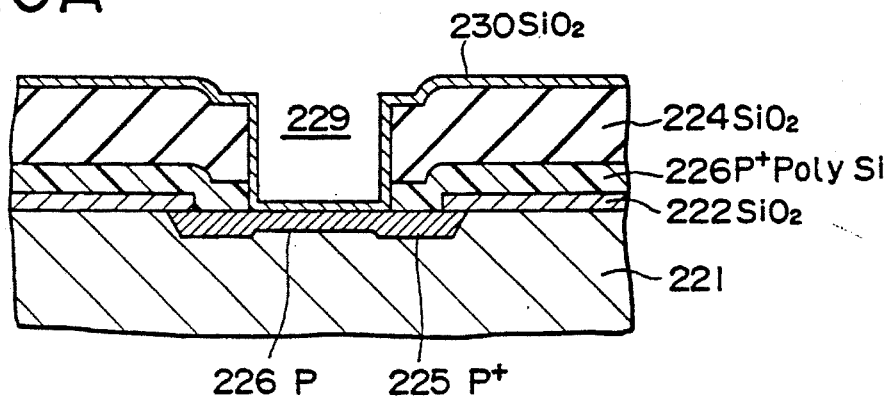
FIGS. 10A to 10C are sectional views illustrating a structure of a bipolar transistor and a manufacturing method therefor according to a third preferred embodiment of the present invention.

Referring to FIG. 10A, an insulating film 222 having a thickness of 100 to 200 nm is formed by CVD on the whole surface of a silicon wafer as a substrate 221, and is then opened at a base electrode forming portion of the bipolar transistor. Then, a p-type polysilicon film 223 having a thickness of 100 to 200 nm is formed by CVD on the whole surface of the wafer. The polysilicon film 223 functions as a base electrode. The doping of the polysilicon film 223 may be performed by ion implantation. Then, an insulating film 224 having a thickness of 300 to 400 nm is formed by CVD on the whole surface of the wafer.

Then, a laminated film composed of the insulating film 224 and the polysilicon film 223 is removed at the base and emitter forming portion by a known dry etching technique to form a hole 229. Then, an insulating film 230 having a thickness of 10 to 20 nm is formed by CVD on the whole surface of the wafer. Then, a p-type diffused layer 226 is formed by ion implantation. The p-type diffused layer 226 functions as a link base for connecting a base contact to a base. The insulating film 230 having the thickness of 10 to 20 nm functions as a buffer layer for preventing channeling tail in the ion implantation for forming the link base 226.

Then, annealing at 900° C. for 10 to 20 min is performed to diffuse an impurity from the p-type polysilicon film 223 into the substrate 221, thereby forming a $p^+$ contact layer 225.

Figure 10B:
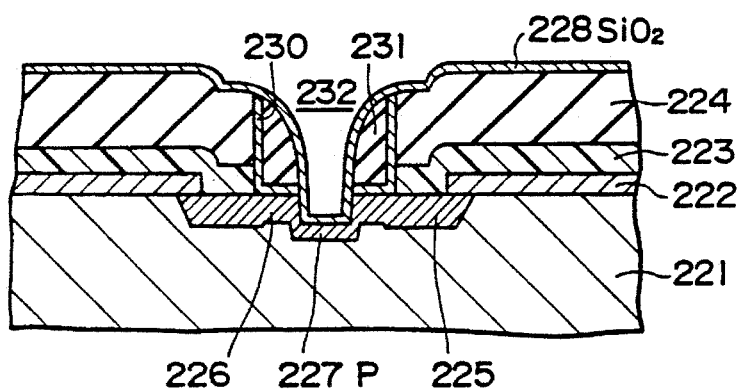

Referring next to FIG. 10B, an insulating film having a thickness of 400 to 600 nm is formed by CVD, and is then wholly etched by anisotropic etching using a known dry etching technique to thereby form a side wall 231 from this insulating film and define a hole 232. The side wall 231 has a function of isolating the base electrode 223 from an emitter electrode 233 (see FIG. 10C) which will be formed later.

Then, as required the silicon substrate 221 exposed to the hole 232 is etched to remove the link base 226 at the base forming region. This etching of the silicon substrate 221 is performed for the purpose of preventing the link base 226 from affecting an impurity concentration in a base 227 to be formed later and a depth of impurity diffusion in forming the base 227. This etching of the silicon substrate 221 may be performed continuously from the anisotropic etching of the insulating film for forming the side wall 231. For example, when this insulating film is a silicon dioxide film, the etching of the silicon dioxide film by the use of a mixture gas of $O_2/CHF_3$ may be performed continuously from the etching of the silicon substrate by the use of a mixture gas of $O_2/SF_6$. Further, the etching of the silicon substrate 221 can be performed in a self-aligned manner with use of the side wall 231 as a mask, thereby minimizing an increase in number of manufacturing steps.

Then, an insulating film 228 having a thickness of 10 to 20 nm is formed by CVD on the whole surface of the wafer. Then, ion implantation with low energy is performed to form a base diffused layer 227. The insulating film 228 having the thickness of 10 to 20 nm functions as a buffer layer for preventing channeling tail in the ion implantation for forming the base diffused layer 227.

Figure 10C:
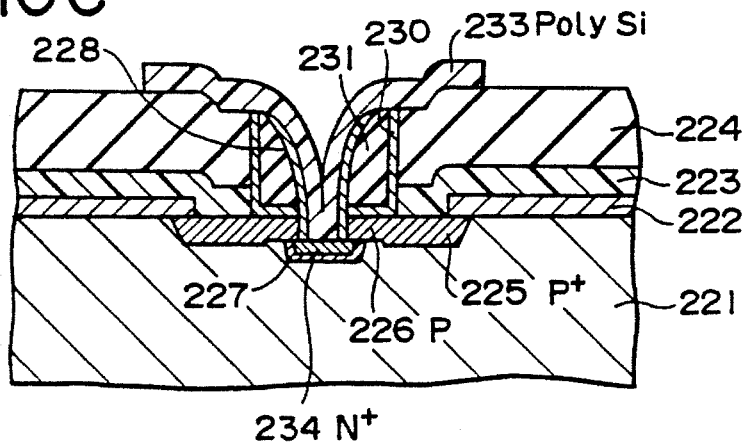

Referring next to FIG. 10C, the insulating film 228 is wholly etched by anisotropic etching using a known dry etching technique. At this time, the thickness of the insulating film 228 is about 1/50 of the thickness of the side wall 231 for isolating the base electrode 223 from the emitter electrode 233. Accordingly, there is no problem of variation in base width due to the etching of the silicon substrate as occurred in the prior art.

Then, a polysilicon film 233 having a thickness of 100 to 200 nm is formed by CVD. The polysilicon film 233 functions as an emitter electrode. Then, $n^+$ ions are implanted into the base diffused layer 227 and annealing is performed to thereby form an emitter diffused layer 234.

Although not shown, electrodes are formed by using a known wiring technique after obtaining the structure of FIG. 10C.

According to this preferred embodiment, the prior art problem such that the base region is subjected to etching in forming the side wall can be eliminated to thereby suppress the variation in fine base width.

A fourth preferred embodiment of the present invention will be described with reference to FIGS. 11A to 11C. In the third preferred embodiment, the insulating film 228 is used as a buffer layer for preventing the channeling tail during ion implantation with low energy in forming the base diffused layer 227 in the step of obtaining the structure shown in FIG. 10B. Accordingly, a step of removing this insulating film 228 is required, causing an increase in cost due to an increase in number of process steps. Furthermore, there is a possibility that the silicon substrate may be slightly etched in removing the insulating film 228. Thus, the fourth preferred embodiment is intended to avoid this possibility.

This preferred embodiment will now be described in more detail with reference to FIGS. 11A to 11C, which are sectional views of an upper portion of a silicon substrate in which emitter and base regions of an npn bipolar transistor are formed. The bipolar transistor is manufactured in the following manner.

Figure 11A:
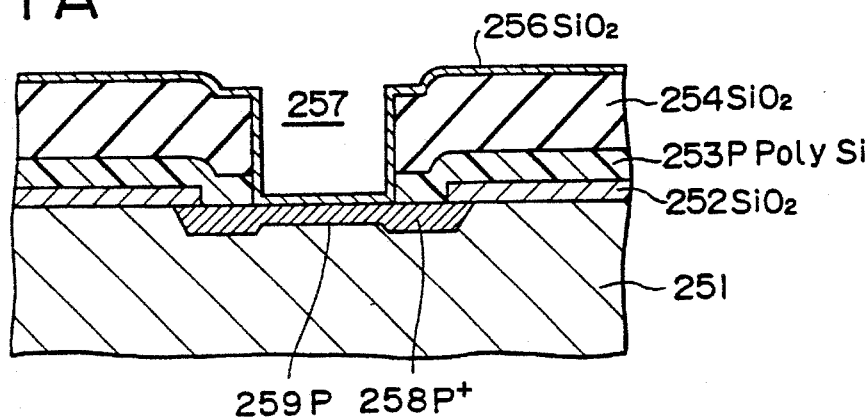
FIGS. 11A to 11C are sectional views illustrating a structure of a bipolar transistor and a manufacturing method therefor according to a fourth preferred embodiment of the present invention.

Referring to FIG. 11A, an insulating film 252 having a thickness of 100 to 200 nm is formed by CVD on the whole surface of a silicon wafer as a substrate 251, and is then opened at a base electrode forming portion of the bipolar transistor. Then, a p-type polysilicon film 253 having a thickness of 100 to 200 nm is formed by CVD on the whole surface of the wafer. The polysilicon film 253 functions as a base electrode. The doping of the polysilicon film 253 may be performed by ion implantation. Then, an insulating film 254 having a thickness of 300 to 400 nm is formed by CVD on the whole surface of the wafer.

Then, a laminated film composed of the insulating film 254 and the polysilicon film 253 is removed at the base and emitter forming portion by a known dry etching technique to form a hole 257. Then, an insulating film 256 having a thickness of 10 to 20 nm is formed by CVD on the whole surface of the wafer. Then, a p-type diffused layer 259 is formed by ion implantation. The p-type diffused layer 259 functions as a link base for connecting a base contact to a base. The insulating film 256 having the thickness of 10 to 20 nm functions as a buffer layer for preventing channeling tail in the ion implantation for forming the link base 259.

Then, annealing at 900° C. for 10 to 20 min is performed to diffuse an impurity from the p-type polysilicon film 253 into the substrate 251, thereby forming a $p^+$ contact layer 258.

Figure 11B:
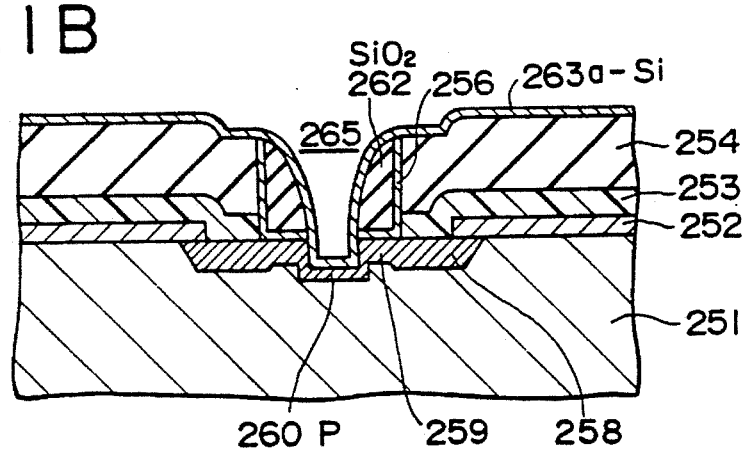

Referring next to FIG. 11B, an insulating film having a thickness of 400 to 600 nm is formed by CVD, and is then wholly etched by anisotropic etching using a known dry etching technique to thereby form a side wall 262 from this insulating film and define a hole 265. The side wall 262 performs the function of isolating the base electrode 253 from an emitter electrode 264 (see FIG. 11C) which will be formed later.

Then, as required, the silicon substrate 251 exposed to the hole 265 is etched to remove the link base 259 at the base forming region. This etching of the silicon substrate 251 is performed for the purpose of preventing the link base 259 from affecting an impurity concentration in a base 260 to be formed later and a depth of impurity diffusion in forming the base 260. This etching of the silicon substrate 251 may be performed continuously from the anisotropic etching of the insulating film for forming the side wall 262. For example, when this insulating film is a silicon dioxide film, the etching of the silicon dioxide film by the use of a mixture gas of $O_2/CHF_3$ may be performed continuously from the etching of the silicon substrate, by the use of a mixture gas of $O_2/SF_6$. Further, the etching of the silicon substrate 251 can be performed in a self-aligned manner with use of the side wall 262 as a mask, thereby minimizing an increase in number of manufacturing steps.

Then, an amorphous silicon film 263 having a thickness of 10 to 20 nm is formed by CVD on the whole surface of the wafer. Then, ion implantation with low energy is performed to form a base diffused layer 260. The amorphous silicon film 263 having the thickness of 10 to 20 nm functions as a buffer layer for preventing channeling tail in the ion implantation for forming the base diffused layer 260.

Figure 11C:
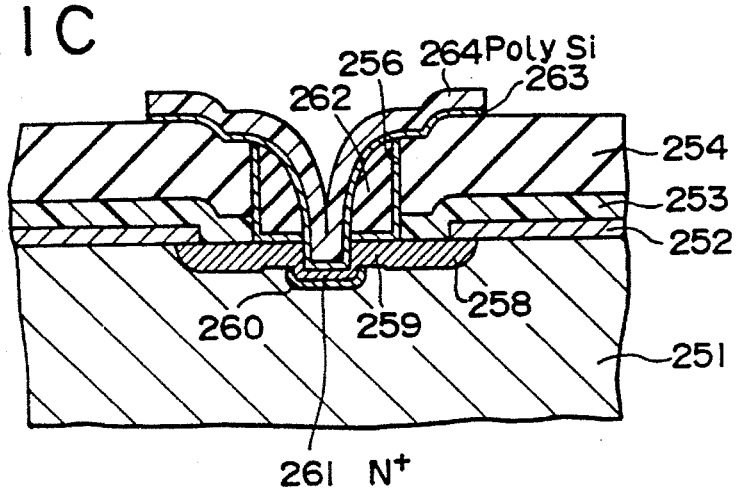

Referring next to FIG. 11C, a polysilicon film 264 having a thickness of 100 to 200 nm is formed by CVD. The polysilicon film 264 functions as an emitter electrode. Then, $n^+$ ions are implanted into the base diffused layer 260 and annealing is performed to thereby form an emitter diffused layer 261.

Although not shown, electrodes are formed by using a known wiring technique after obtaining the structure of FIG. 11C.

According to this referred embodiment, the conducting CVD film (amorphous silicon film) 263 is used as a buffer layer for preventing channeling tail during ion implantation. Therefore, the step of removing the conducting film 263 is not required, thereby preventing an increase in cost due to an increase in number of process steps and accordingly eliminating the possibility of the silicon substrate being etched in such a step.

In forming the base by ion implantation, there is the possibility that the number of implanted ions may be insufficient at the corner of the step because of shadowing. However, this possibility may be avoided by performing oblique rotative ion implantation.

A fifth preferred embodiment of the present invention will be described with reference to FIGS. 12A to 12C. In this preferred embodiment, a laminated structure composed of a refractory metal containing substance (e.g., refractory metal or its silicide) film and a polysilicon film is used for a base electrode.

This preferred embodiment will now be described in more detail with reference to FIGS. 12A to 12C, which are sectional views of an upper portion of a silicon substrate in which emitter and base regions of an npn bipolar transistor are formed. The bipolar transistor is manufactured in the following manner.

Referring to FIG. 12A, an insulating film 282 having a thickness of from 100 to 200 nm is formed by CVD on the whole surface of a silicon wafer as a substrate 281, and is then opened at a base electrode forming portion of the bipolar transistor. Then, a p-type polysilicon film 283 having a thickness of 100 to 200 nm is formed by CVD on the whole surface of the wafer. Then, a tungsten silicide ($WSi_x$) film 284 as a refractory metal containing substance film having a thickness of 100–200 nm is formed by CVD on the whole surface of the wafer. This laminated structure composed of the tungsten silicide film 284 and the polysilicon film 283 functions as a base electrode. The doping of the polysilicon film 283 may be performed by ion implantation. Then, an insulating film 283 having a thickness of 300 to 400 nm is formed by CVD on the whole surface of the wafer.

Then, a laminated film composed of the insulating film 285, the tungsten silicide film 284 and the polysilicon film 283 is removed at the base and emitter forming portion by a known dry etching technique to form a hole 287. Then, an insulating film 286 having a thickness of 10 to 20 nm is formed on the whole surface of the wafer by CVD at a low temperature of 600° C. or less under reduced pressure. Then, a p-type diffused layer 288 is formed by ion implantation. The p-type diffused layer 288 functions as a base. The insulating film 286 having the thickness of 10 to 20 nm functions as a buffer layer for preventing channeling tail in the ion implantation for forming the base 288.

Then, oxidation at 850° to 900° C. for 10 to 20 min is performed to oxidize the interface between the insulating film 286 and the silicon substrate 281 with a thickness of 10 to 20 nm. Accordingly, the interface between the silicon substrate 281 and the CVD film 286 is improved by this oxidation process. At the same time, an impurity is diffused from the polysilicon film 283 into the substrate 281 to form a $p^+$ contact layer 289.

Thus, the oxidation of the interface between the insulating film 286 and the silicon substrate 281 is performed after the base ion implantation in this preferred embodiment. However, if there is a problem of variation in base profile due to such thermal oxidation, the base ion implantation may be performed after the oxidation of the interface.

Referring next to FIG. 12B, an insulating film having a thickness of 400 to 600 nm is formed by CVD, and is then wholly etched by anisotropic etching using a known dry etching technique to thereby form a side wall 290 from this insulating film and define a hole 293. The side wall 290 isolates the base electrode 283 from an emitter electrode 291 (see FIG. 12C) which will be formed later.

Referring next to FIG. 12C, a polysilicon film 291 having a thickness of 100 to 200 nm is formed by CVD. The polysilicon film 291 functions as an emitter electrode. Then, $n^+$ ions are implanted into the base diffused layer 288 and annealing is performed to thereby form an emitter diffused layer 292.

Although not shown, electrodes are formed by using a known wiring technique after obtaining the structure of FIG. 12C.

According to this preferred embodiment, in the high-performance bipolar transistor adopting the double polysilicon structure and using the laminated structure composed of the refractory metal containing substance film 284 and the Polysilicon film 283 for the base electrode, the refractory metal containing substance film 284 such as tungsten silicide film exposed to the side surface of the hole 287 is covered with the CVD film 286, thereby preventing the occurrence of metal contamination. Furthermore, the interface between the silicon substrate 281 and the CVD film 286 is oxidized by thermal oxidation, thereby improving the film quality of the interface. In the oxidation process, the side surface of the refractory metal containing substance film 284 is covered with the CVD film 286, so that even if thermal stress is generated in the refractory metal containing substance film 284 because of heat by the thermal oxidation, the peeling of the refractory metal containing substance film 284 can be prevented by the CVD film 286.

Thus, both the prevention of metal contamination at the emitter/base forming region and the stabilization of the surface condition of the emitter/base region can be simultaneously realized.

According to the present invention, in realizing a semiconductor device such a high-performance bipolar transistor, there is provided a method of realizing a fine base width to thereby attain a reduction in base transit time. Particularly in a high-performance bipolar transistor adopting a double polysilicon structure, is provided a method of preventing a variation in fine base width due to the problem that a base region is subjected to etching in forming a side wall from an insulating film.

Further, according to the present invention, in realizing a semiconductor device such as a high-performance bipolar transistor, even in a high-performance device adopting a double polysilicon structure and using a laminated structure composed of a refractory metal containing substance film and a polysilicon film for a base electrode, there is provided a method of simultaneously realizing both the prevention of metal contamination of an emitter/base forming region and the stabilization of the surface condition of the emitter/base forming region.

A sixth preferred embodiment of the present invention will be described with reference to FIGS. 13A to 13C. In this preferred embodiment, a semiconductor device (bipolar transistor) is manufactured by a method comprising the steps of forming a first impurity layer 318 of a first conduction type in a semiconductor substrate 311; forming a first conducting film 313 connected to the first impurity diffused layer 318, the first conducting film 313 comprising a polycrystalline film; increasing a crystal grain size in at least a part of the first conducting film 313; forming a second conducting film 314 on the first conducting film 313; forming a first insulating film 321 on the second conducting film 314; forming a hole 323 through a laminated film composed of the first insulating film 321, the first conducting film 313, and the second conducting film 314; forming a second insulating film 316 in the hole 323; and forming a second impurity diffused layer 317 of the first conduction type in the semiconductor substrate 311 exposed to the hole 323.

This preferred embodiment will now be described in more detail with reference to FIGS. 13A to 13C, which are sectional views of an upper portion of a silicon substrate in which emitter and base regions of an npn bipolar transistor are formed. The bipolar transistor is manufactured in the following manner.

Figure 13A:
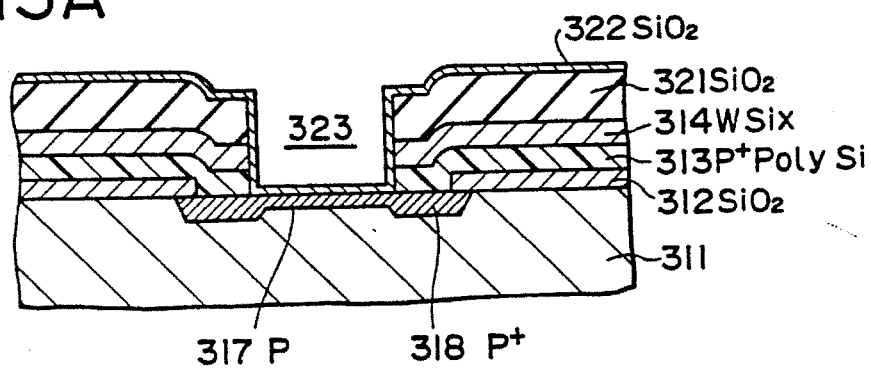
FIGS. 13A to 13C are sectional views illustrating a structure of a bipolar transistor and a manufacturing method therefor according to a sixth preferred embodiment of the present invention.

Referring to FIG. 13A, an insulating film 312 having a thickness of 100 to 200 nm is formed by CVD on the whole surface of a silicon wafer substrate 311, and is then opened at a base electrode forming portion of the bipolar transistor. Then, a p-type polysilicon film 313 having a thickness of 100 to 200 nm is formed by CVD on the whole surface of the wafer. The doping of the polysilicon film 283 may be performed by ion implantation.

Then, silicon ions or the like are implanted into the polysilicon film 313 at a base drawing electrode portion to thereby make the polysilicon film 313 at this portion into an amorphous state. For example, the implantation of the silicon ions is performed under the conditions of 40 to 50 KeV and 1E15 to 5E15 $cm^{-2}$.

Then, annealing at about 600° C. for several hours is performed to thereby increase a crystal grain size in the polysilicon film 313. By such a process, the crystal grain size in the polysilicon film 313 can be increased from several tens of nanometers to several micrometers. In the case where the doping of the polysilicon film 313 is performed by ion implantation, it is desirable that annealing at about 800° C. for several hours is performed before implantation of silicon ions to thereby uniform an impurity concentration in the polysilicon film 313.

As another method, it may be considered to initially form an amorphous silicon film by CVD and then annealing it to increase the crystal grain size, or to optimize the CVD conditions to make polysilicon of a large crystal grain size grow. In this case, however, the crystal grain size in the polysilicon film on the whole surface of the wafer becomes large. Accordingly, in the case of using the polysilicon film also as a gate electrode in a MOS transistor, for example, the gate withstand voltage may be reduced. Thus, such method is undesirable.

Then, a tungsten silicide ($WSi_x$) film 314 as a refractory metal containing substance (e.g., refractory metal or its silicide) film having a thickness of 100–200 nm is formed by CVD on the whole surface of the wafer. This laminated structure composed of-the tungsten silicide film 314 and the polysilicon film 313 functions as a base electrode. Then, an insulating film (silicon dioxide) 321 having a thickness of 300 to 400 nm is formed by CVD on the whole surface of the wafer.

Then, a laminated film composed of the insulating film 321, the tungsten silicide film 314 and the polysilicon film 313 is removed at the base and emitter forming portion by a known dry etching technique to form a hole 323. Then, an insulating film (silicon dioxide) 322 having a thickness of 10 to 20 nm is formed by CVD on the whole surface of the wafer. Then, a p-type diffused layer 317 is formed by ion implantation. The p-type diffused layer 317 functions as a base. The insulating film 322 having the thickness of 10 to 20 nm functions as a buffer layer for preventing channeling tail in the ion implantation for forming the base 317.

Figure 13B:
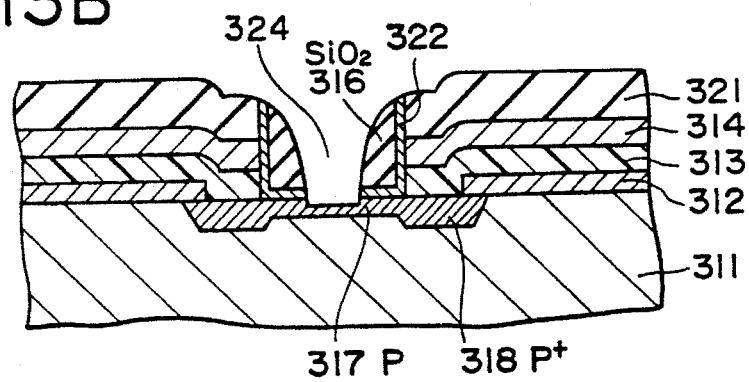

Referring next to FIG. 13B, an insulating film (silicon dioxide) having a thickness of 400 to 600 nm is formed by CVD, and is then wholly etched by anisotropic etching using a known dry etching technique to thereby form a side wall 316 from this insulating film and define a hole 324. The side wall 316 has a function of isolating the base electrode from an emitter electrode which will be formed later.

Figure 13C:
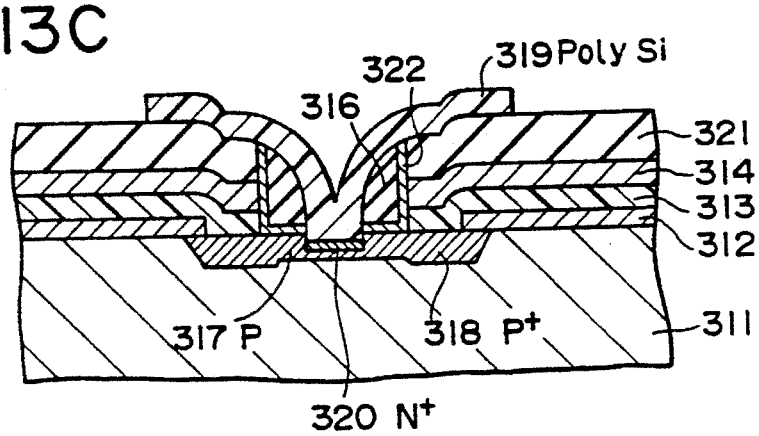

Referring next to FIG. 13C, a polysilicon film 319 having a thickness of 100 to 200 nm is formed by CVD. The polysilicon film 319 functions as an emitter electrode. Then, $n^+$ ions are implanted into the base diffused layer 317 and annealing is performed to thereby form an emitter diffused layer 320.

Although not shown, electrodes are formed by using a known wiring technique after obtaining the structure of FIG. 13C.

According to this preferred embodiment, in the high-performance bipolar transistor adopting the double polysilicon structure and using the laminated structure composed of the refractory metal containing substance film 314 and the polysilicon film 313 for the base electrode, the crystal grain size in the polysilicon film 313 to be used as the base electrode is increased, and the impurity is sufficiently diffused in the large crystal grain of the polysilicon film 313. Thereafter, the refractory metal containing substance film 314 is formed on the polysilicon film 313 to form the laminated structure. Accordingly, the absorption of the impurity from the polysilicon film 313 into the tungsten silicide film 314 in the subsequent thermal process can be suppressed to thereby reduce the base resistance and accordingly realize a high performance device.

Further, as the crystal grain size in the polysilicon film 313 at the base drawing electrode portion only is selectively increased, the polysilicon film 313 can be used also as a gate electrode in a MOS transistor without a reduction in gate withstand voltage.

According to the present invention, in realizing a semiconductor device such as a high-performance bipolar transistor, even in a high-performance device adopting a double polysilicon structure and using a laminated structure composed of a refractory metal containing substance film and a polysilicon film for a base electrode, there is provided a method of suppressing the absorption of an impurity from a conducting film such as a polysilicon film into a refractory metal or its silicide film to thereby reduce a base resistance and accordingly realize a high performance device.

Figure 14A:
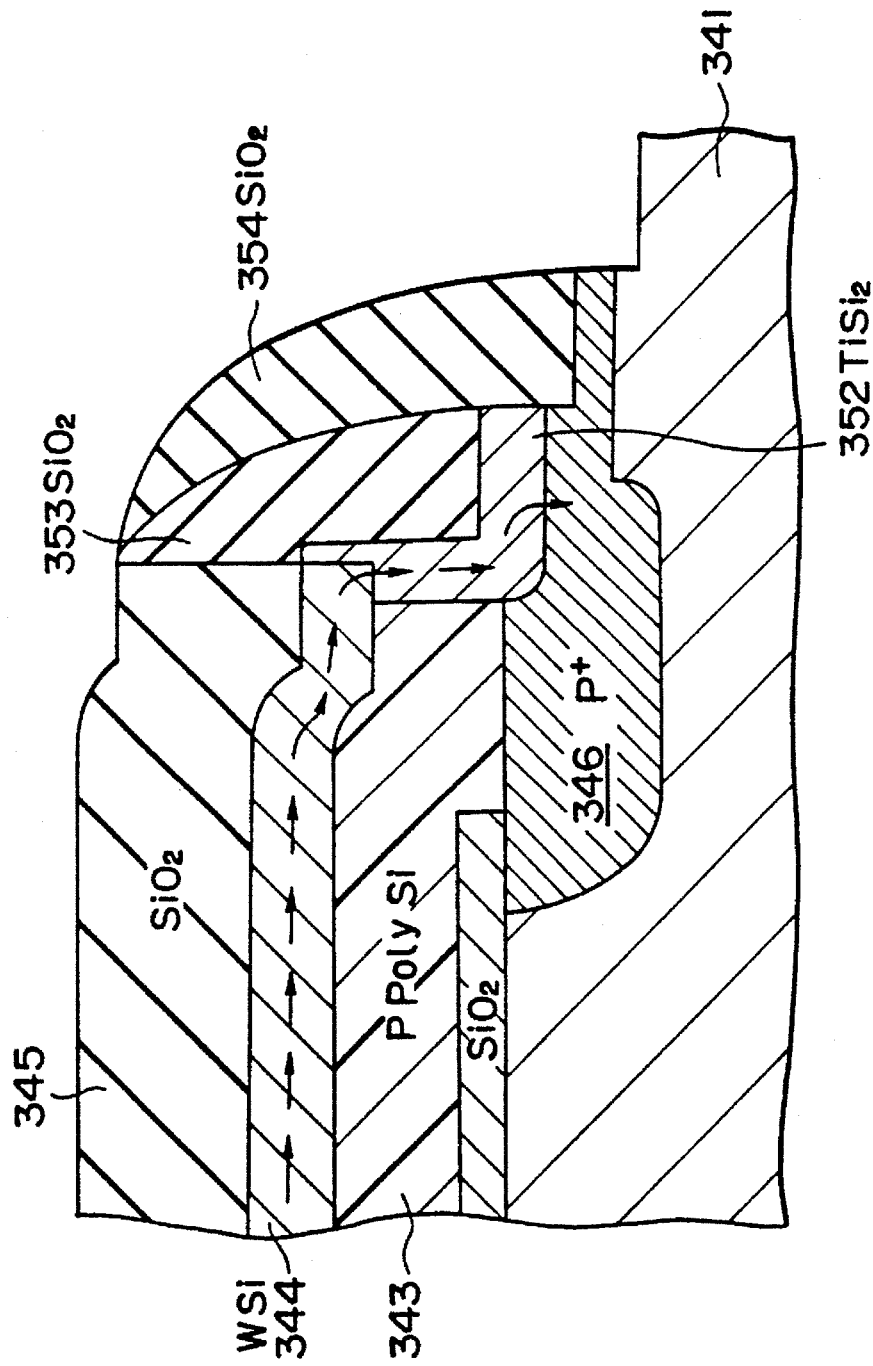
FIGS. 14A to 14G are sectional views illustrating a structure of a bipolar transistor and a manufacturing method therefor according to a seventh preferred embodiment of the present invention.

A seventh preferred embodiment of the present invention will be described with reference to FIGS. 14A to 14G, which are sectional views of an upper portion of a silicon substrate in which emitter and base regions of an npn bipolar transistor are formed. The bipolar transistor has a laminated structure of a $p^+$ polysilicon film and a tungsten silicide film as a base drawing electrode. FIG. 14A shows the operation of the bipolar transistor, and FIGS. 14B to 14G show a manufacturing method for the bipolar transistor.

Figure 14B:
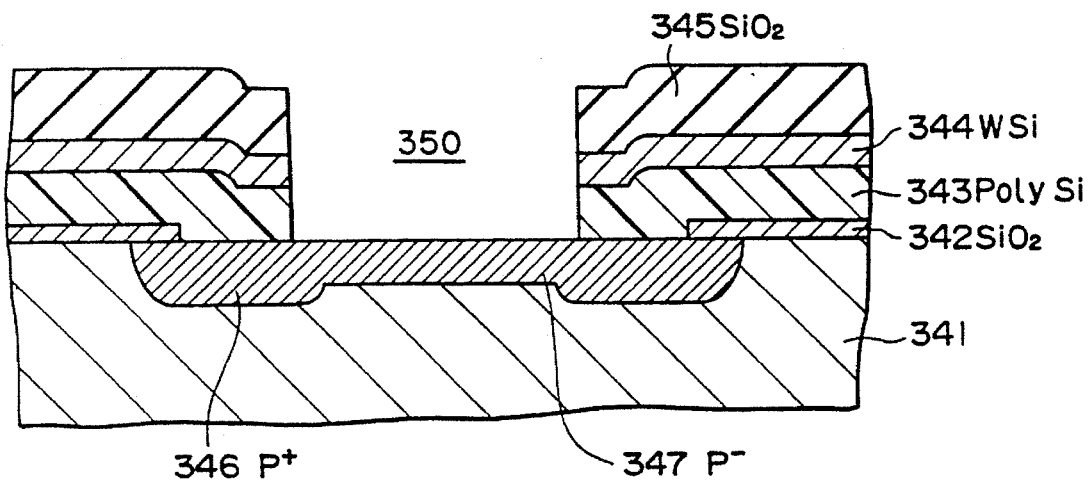

Referring to FIG. 14B, a silicon dioxide film 342 having a thickness of 100 nm is formed by CVD on the whole surface of silicon substrate 341, and is then opened at a base electrode forming portion. Then, a polysilicon film 343 having a thickness of 100 nm is formed by CVD on the whole surface of the substrate 341, and a tungsten silicide film 344 having a thickness of 80 nm is then formed by CVD on the whole surface of the substrate 341. Then, boron fluoride ions ($BF_2^+$) are implanted into the polysilicon film 343 under the conditions of 30 KeV and 5E15 $cm^{-2}$ to form a p-type polycide film. This p-type polycide film composed of the $p^+$ polysilicon film 343 and the tungsten silicide film 344 corresponds to a first conducting film in the present invention. Then, a silicon dioxide film 345 having a thickness of 300 nm is formed by CVD on the whole surface of the substrate 341. This silicon dioxide film 345 corresponds to a first insulating film in the present invention. Then, a laminated structure of the silicon dioxide film 345, the tungsten silicide film 344 and the polysilicon film 343 at a base/emitter forming portion is removed by RIE (reactive ion etching) to form a hole 350. This hole 350 corresponds to a first hole in the present invention. Thus, the first hole is formed through the first insulating film and the first conducting film.

Then, boron fluoride ions are implanted into the substrate 341 to form a p-type diffused layer 347 (link base layer) for connecting a base electrode to a base which will be formed later. Then, annealing at 900° C. for 20 min is performed to diffuse the boron ions from the $p^+$ polysilicon film 343 into the substrate 341 to form a graft base layer 346.

Figure 14C:
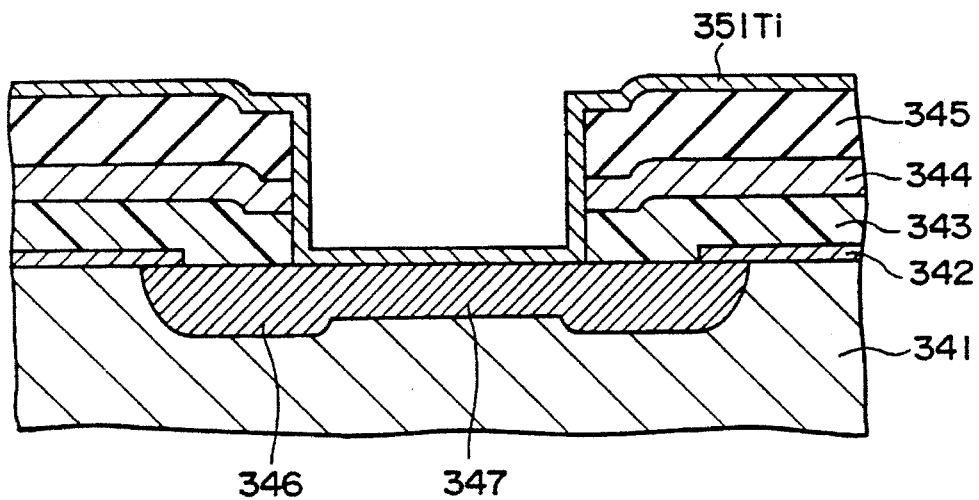

Referring next to FIG. 14C, a titanium film 351 having a thickness of 10 to 70 nm is formed by sputtering on the whole surface of the substrate 341. The titanium film 351 may be formed by CVD.

Figure 14D:
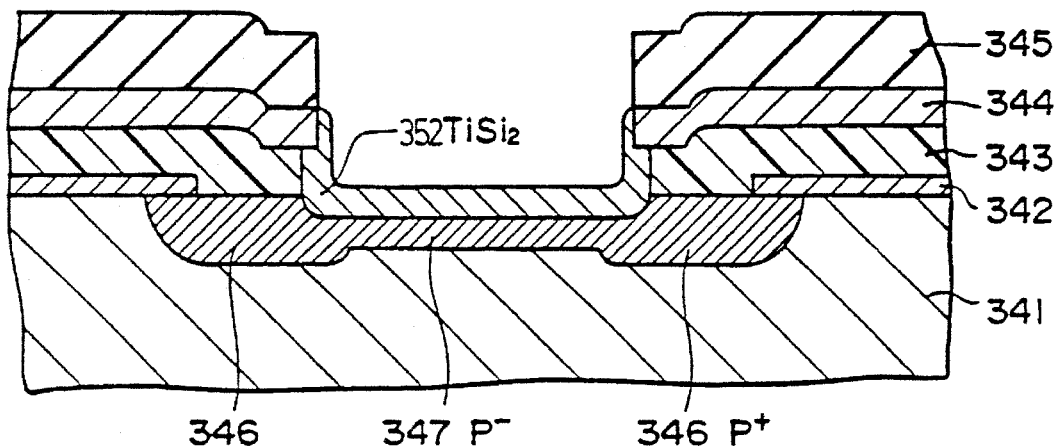

Referring next to FIG. 14D, annealing at 600° C. for 30 to 40 sec is performed to make titanium react with silicon, thus forming a titanium silicide ($TiSi_2$) film 352. This titanium silicide film 352 corresponds to a second conducting film in the present invention. The titanium silicide film 352 is formed on the side surface of the tungsten silicide film 344, the side surface of the $p^+$ polysilicon film 343, and the upper surface of the silicon substrate 341 exposed to the hole 350, but is not formed on the silicon dioxide film 345 with the titanium film 351 still remaining on the silicon dioxide film 345. Then, the titanium film 351 is etched off by a mixed liquid of $NH_4OH/H_2O_2$ heated at 80° C. At this time, the titanium silicide film 352 is not etched by this mixed liquid, but remains in the hole 350. Thus, the second conducting film is selectively formed on the side surface of the first conducting film and on the substrate exposed to the first hole.

Figure 14E:
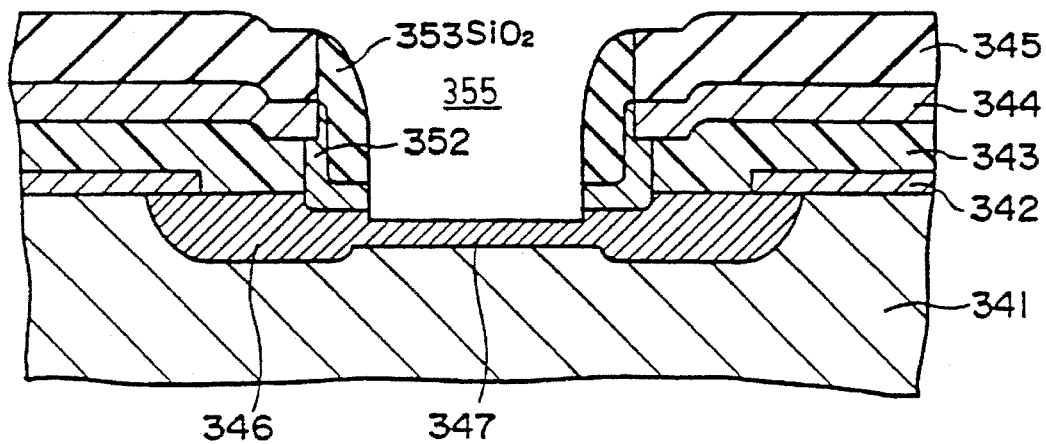

Referring next to FIG. 14E, a silicon dioxide film having a thickness of 300 nm is formed by CVD on the whole surface of the substrate 341, and is then wholly etched by RIE to thereby form a side wall 353 from this silicon dioxide film and define a hole 355. This silicon dioxide film corresponds to a second insulating film in the present invention, and the hole 355 corresponds to a second hole in the present invention. Then, the titanium silicide film 352 exposed to the hole 355 is etched off by RIE.

Figure 14F:
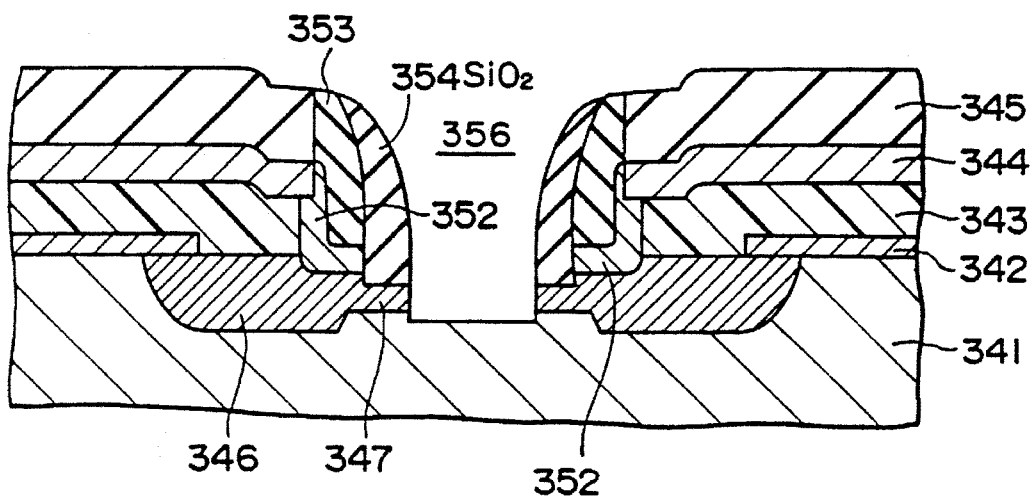

Referring next to FIG. 14F, a silicon dioxide film having a thickness of 300 nm is formed by CVD on the whole surface of the substrate 341, and is then wholly etched by RIE to thereby form an emitter/base isolating side wall 354 from this insulating film and define a hole 356. This silicon dioxide film corresponds to a third insulating film in the present invention, and the hole 356 corresponds to a third hole in the present invention. Then, the silicon substrate 341 exposed to the hole 356 is etched to partially remove the link base layer 347.

Figure 14G:
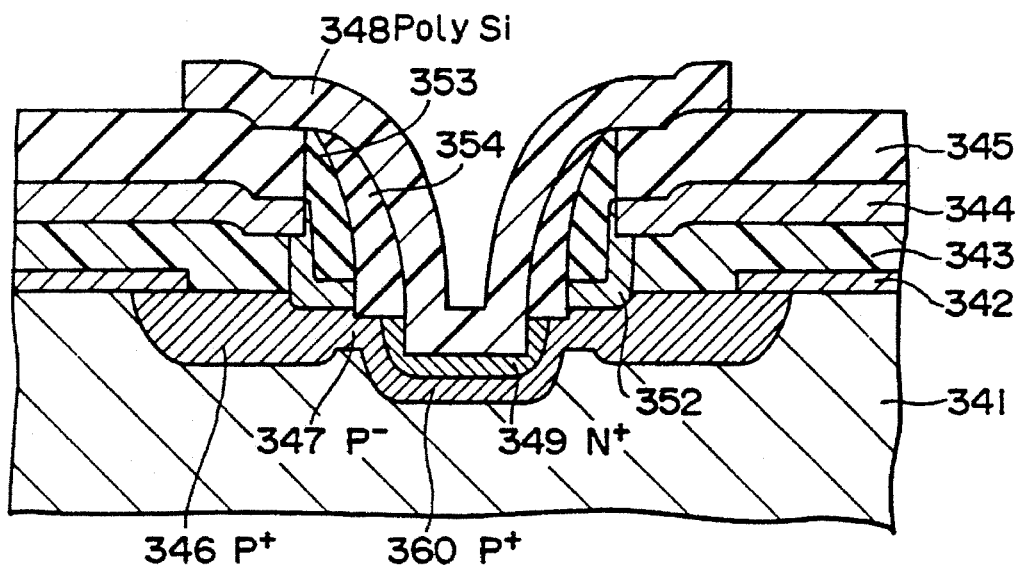

Referring next to FIG. 14G, a polysilicon film 348 having a thickness of 150 nm is formed by CVD. The polysilicon film 348 corresponds to a third conducting film in the present invention. Then, $p^+$ ions are implanted into polysilicon film 348 and annealing is performed to form a base diffused layer 360. Then, $n^+$ ions are implanted into the polysilicon film 348 and annealing is performed to form an emitter diffused layer 349.

Although not shown, electrodes are formed by using a known wiring technique after obtaining the structure of FIG. 14G.

FIG. 14A is an enlarged view of a contact portion between the base drawing electrode and the silicon substrate. In FIG. 14A, arrows show a primary route of a base current. The base current flowing in the tungsten silicide film 344 is introduced through the titanium silicide film 352 into the graft base layer 346. Accordingly, even when the boron ions in the $p^+$ polysilicon film 343 are absorbed by the tungsten silicide film 344 to reduce the concentration in the $p^+$ polysilicon film 343 and accordingly increase the contact resistance between the polysilicon film 343 and the silicon substrate 341, the series resistance between the base drawing electrode and the silicon substrate 341 is small. Accordingly, a base spreading resistance Rbb' can be reduced to realize a high-speed bipolar transistor.

While the titanium silicide film 352 is selectively formed on the side surface of the tungsten silicide film 344, the side surface of the $p^+$ polysilicon film 343, and the silicon substrate 341 in this preferred embodiment, any refractory metal other than titanium may be used to selectively form a silicide film. Further, a refractory metal film or a refractory metal or its silicide film may be selectively formed by any other method such as selective CVD of tungsten on the side surface of the tungsten silicide film 344, the side surface of the $p^+$ polysilicon film 343, and the silicon substrate 341.

According to the present invention, a base drawing electrode and a base contact impurity diffused layer in a silicon substrate can be connected together with a low resistance to thereby realize a reduction in base spreading resistance Rbb' and accordingly realize a high-speed bipolar transistor.

An eighth preferred embodiment of the present invention will be described with reference to FIGS. 15A to 15C, which are sectional views of an upper portion of a silicon substrate in which emitter and base regions of an npn bipolar transistor are formed. The bipolar transistor is manufactured in the following manner.

Referring to FIG. 15A, an insulating film (silicon dioxide) 365 having a thickness of 100 to 200 nm is formed by CVD on the whole surface of a silicon wafer as a substrate 364. Then, a p-type polysilicon film 366 having a thickness of 100 to 200 nm is formed by CVD on the whole surface of the wafer. Then, a tungsten silicide ($WSi_x$) film 367 as a refractory metal containing substance film having a thickness of 100–200 nm is formed by CVD on the whole surface of the wafer. This laminated structure composed of the tungsten silicide film 367 and the polysilicon film 366 functions as a base electrode. The doping of the polysilicon film 366 may be performed by ion implantation. Then, an insulating film 368 having a thickness of 300 to 400 nm is formed by CVD on the whole surface of the wafer.

Then, a laminated film composed of the insulating film 368, the tungsten silicide film 367, the polysilicon film 366 and the insulating film 364 is removed at the base and emitter forming portion by a known dry etching technique to form a hole 377. Then, a conducting film having a thickness of 10 to 20 nm is formed by low-temperature CVD, sputtering, etc. on the whole surface of the wafer. For example, an amorphous silicon film is formed as this conducting film by CVD at a low temperature of 600° C. or less.

Then, this conducting film is removed by anisotropic etching using a known dry etching technique to form a side wall 373 from this conducting film in the hole 377. The side wall 373 functions as a base drawing electrode for connecting the laminated structure of the tungsten silicide film 367 and the polysilicon film 366 to the silicon substrate 364.

With this structure, a base contact can be formed in a self-aligned manner to thereby effect fine formation of elements and improvement in characteristics. Further, the side surface of the laminated structure of the tungsten silicide film 367 and the polysilicon film 366 exposed to the hole 377 is covered with the low-temperature formed film 373, thereby preventing metal contamination of an emitter/base forming region and separation of the refractory metal.

Referring next to FIG. 15B, an insulating film (silicon dioxide) 376 having a thickness of 10 to 20 nm is formed on the whole surface of the wafer by CVD at a low temperature of 600° C. or less under reduced pressure. Then, a p-type diffused layer 369 is formed by ion implantation. The p-type diffused layer 369 functions as a base. The insulating film 376 having the thickness of 10 to 20 nm functions as a buffer layer for preventing channeling tail in the ion implantation for forming the base 369, and functions also as a capping means for the subsequent oxidation process.

Then, oxidation at 850° to 900° C. for 10 to 20 min is performed to oxidize the interface between the insulating film 376 and the silicon substrate 364 with a thickness of 10 to 20 nm. Accordingly, the interface between the silicon substrate 364 and the CVD film 376 is improved by this oxidation process to thereby stabilize the surface condition of the emitter/base forming region. Furthermore, weak spots in the CVD film 376 are also oxidized by this oxidation process to thereby ensure a withstand voltage of an emitter/base isolating side wall insulating film. At the same time, an impurity is diffused from the polysilicon film 366 into the substrate 364 to form a $p^+$ contact layer 370. The $p^+$ contact layer 370 functions as a connection layer (link base).

Thus, the oxidation of the interface between the insulating film 376 and the silicon substrate 364 is performed after the base ion implantation in this preferred embodiment. However, if there is a problem of variation in base profile due to such thermal oxidation, the base ion implantation may be performed after the oxidation of the interface.

Then, an insulating film having a thickness of 400 to 600 nm is formed by CVD, and is then wholly etched by anisotropic etching using a known dry etching technique to thereby form a side wall 375 from this insulating film and define a hole 378. The side wall 375 has a function of isolating the base electrode from an emitter electrode which will be formed later.

Referring next to FIG. 15C, a polysilicon film 371 having a thickness of 100 to 200 nm is formed by CVD. The polysilicon film 371 functions as an emitter electrode. Then, $n^+$ ions are implanted into the base diffused layer 369 and annealing is performed to thereby form an emitter diffused layer 372.

Although not shown, electrodes are formed by using a known wiring technique after obtaining the structure of FIG. 15C.

According to this preferred embodiment, in the high-performance bipolar transistor having the double polysilicon structure and using the laminated structure composed of the refractory metal containing substance film 367 and the polysilicon film 366 for the base electrode, the side wall 373 is formed from a conducting film by a low-temperature film forming technique after forming the hole 377 through the laminated structure of the refractory metal containing substance film 367 and the polysilicon film 366, and thereafter the insulating film 376 is formed by CVD and oxidation, thereby forming the fine base drawing electrode and isolating the base electrode from the emitter electrode. Thus, the prevention of metal contamination to the emitter/base forming region, the stabilization of the surface condition of the emitter/base forming region, and the ensurance of a withstand voltage of the emitter/base isolating side wall insulating film can be simultaneously realized. That is, the refractory metal containing substance film 367 such as tungsten silicide film exposed to the side surface of the hole 377 is covered with the low-temperature formed film 373, thereby preventing the occurrence of metal contamination. Furthermore, the interface between the silicon substrate 364 and the CVD film 376 is oxidized by the oxidation process, and the weak spots in the CVD film 376 are also oxidized by the oxidation process, thereby improving the film quality of the interface and the CVD film 376.

In the oxidation process, the side surface of the refractory metal containing substance film 367 is covered with the CVD film 376, so that even if a thermal stress is generated in the refractory metal containing substance film 367 because of heat by the thermal oxidation, the occurrence of peeling of the refractory metal containing substance film 367 can be prevented by the CVD film 376.

According to the present invention, there is provided a method of simultaneously realizing the reduction in size of a base drawing region, the prevention of metal contamination to an emitter/base forming region, the stabilization of the surface condition of the emitter/base forming region, and the ensurance of a withstand voltage of an emitter/base isolating side wall insulating film.

A ninth preferred embodiment of the present invention will be described with reference to FIGS. 16A to 16M, which are sectional views of an upper portion of a silicon substrate on which emitter and base regions of an npn bipolar transistor are formed. The bipolar transistor is manufactured in the following manner.

Figure 16A:
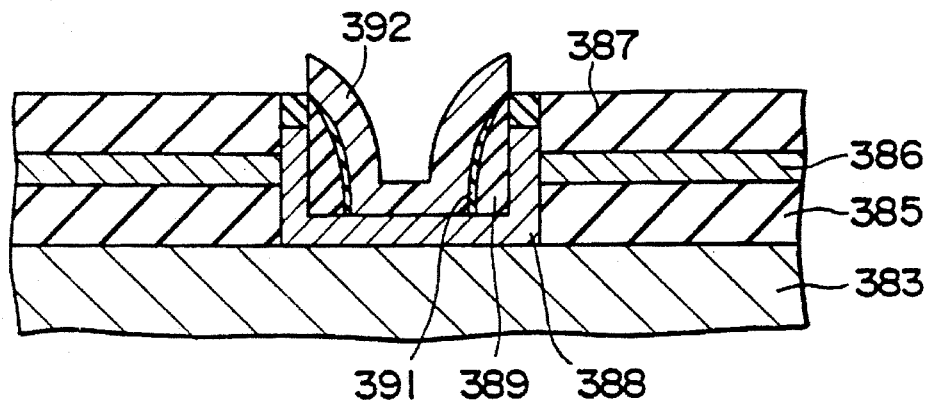
FIGS. 16A to 16M are sectional views illustrating a structure of a bipolar transistor and a manufacturing method therefor according to a ninth preferred embodiment of the present invention.
Figure 16B:
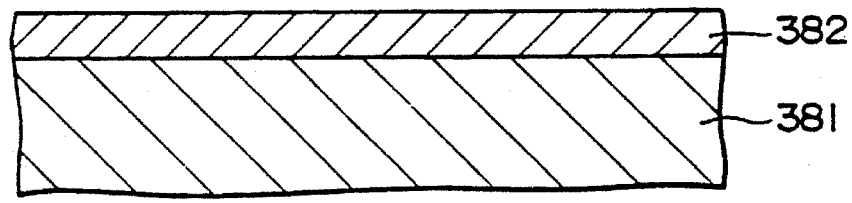
Figure 16C:
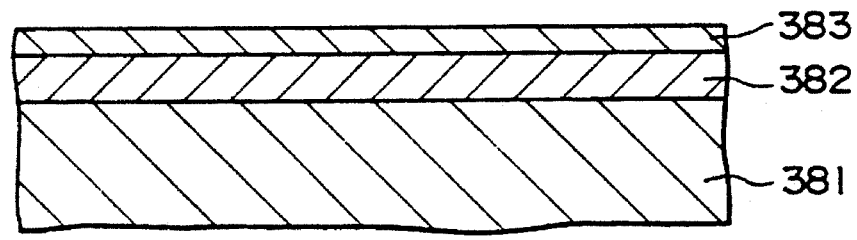

As shown in FIG. 16B, an n$^+$ collector buried layer 382 is formed in a p-type substrate 381. Then, as shown in FIG. 16C, an n-type epitaxial layer 383 is formed on the n$^+$ collector buried layer 382 by epitaxial growth.

Figure 16D:
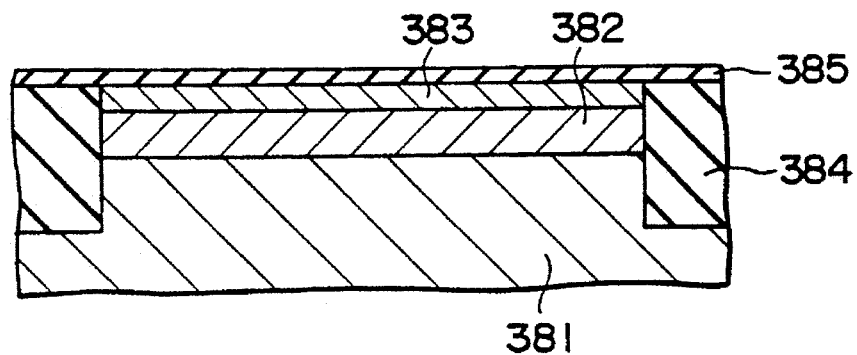

Then, as shown in FIG. 16D, element isolation by an insulating film 384 is performed. In this preferred embodiment, there is shown so-called trench isolation where a groove is formed in the substrate 381, and this groove is filled with an insulating material. Thereafter, an insulating film 385 (silicon dioxide) having a thickness of 300 nm is formed by CVD. The thicker the insulating film 385, the better for a reduction in parasitic capacitance between a base drawing electrode and a collector (epitaxial layer). However, if the thickness of the insulating film 385 is too large, it becomes difficult to form electrodes. For this reason, the thickness of the insulating film 385 is set to the above-mentioned value.

Figure 16E:
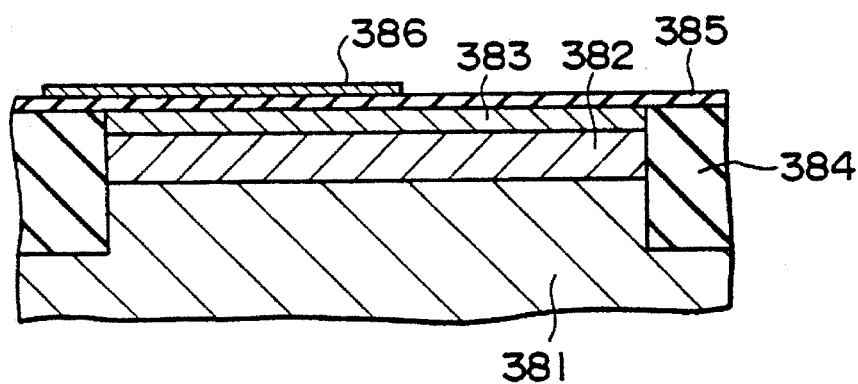

As shown in FIG. 16E, a polysilicon film 386 having a thickness of 100 nm is formed by CVD after forming the insulating film 385. The polysilicon film 386 is doped with a p-type impurity to reduce the resistance, because the polysilicon film 386 is used as drawing electrodes after completing an element. Then, an unnecessary portion of the polysilicon film 386 is removed by lithography and dry etching to open a window.

Figure 16F:
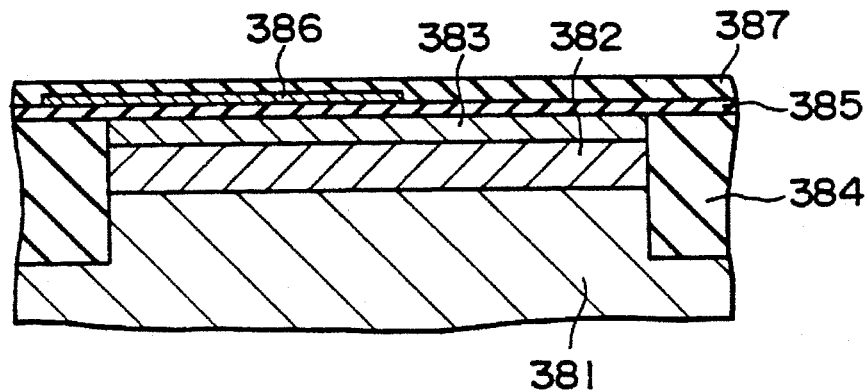

Then, as shown in FIG. 16F, an insulating film 387 (silicon dioxide) having a thickness of 300 nm is formed by CVD.

Figure 16G:
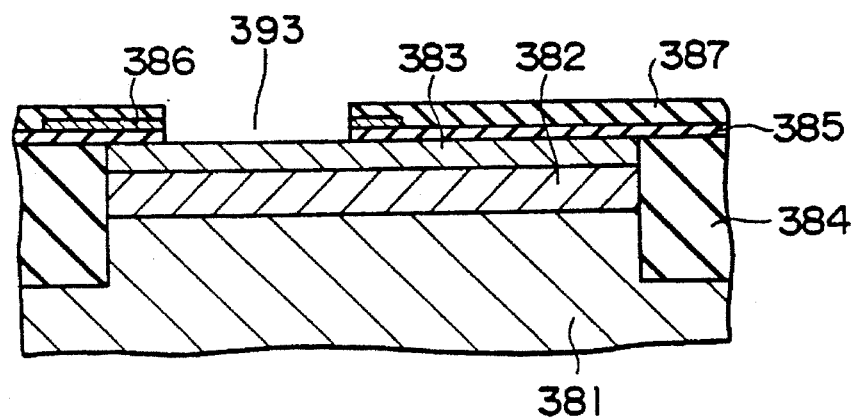

Then, as shown in FIG. 16G, a stacked structure of the insulating film 385, the polysilicon film 386 and the insulating film 387 are removed by lithography and RIE to thereby form a hole 393 where base and emitter active regions are to be formed. At the same time, a collector drawing electrode (not shown) can also be formed.

Figure 16H:
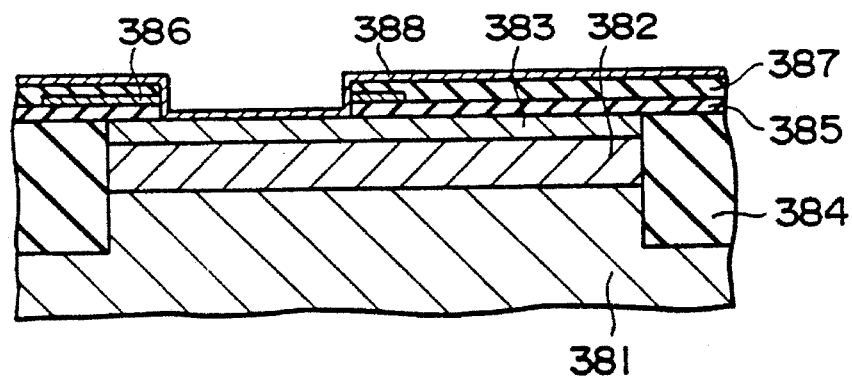

Then, as shown in FIG. 16H, a thin epitaxial film 388 having a p-type conductivity is formed on the whole surface or the substrate 381 by high-vacuum epitaxy at a low temperature (500° to 600° C.). The sheet resistance of the epitaxial film 388 is set to preferably about 10 to 20 k$\Omega$/☐ because it forms an intrinsic base region, and the thickness of the epitaxial film 388 is set to about 50 to 80 nm for an improvement in high-frequency characteristic. A side portion of the epitaxial film 388 present in the hole 393 is influenced by the background polysilicon; however, the influence is in the order of the thickness of the polysilicon film 386. Furthermore, the influence does not extend to the intrinsic base region because a side wall insulating film is to be formed later for the purpose of isolation. Further, at an edge portion about the hole 393, a junction is formed in a single crystal by diffusion of a p-type impurity to the n-type epitaxial layer 383, so that the leakage current becomes negligible.

Figure 16I:
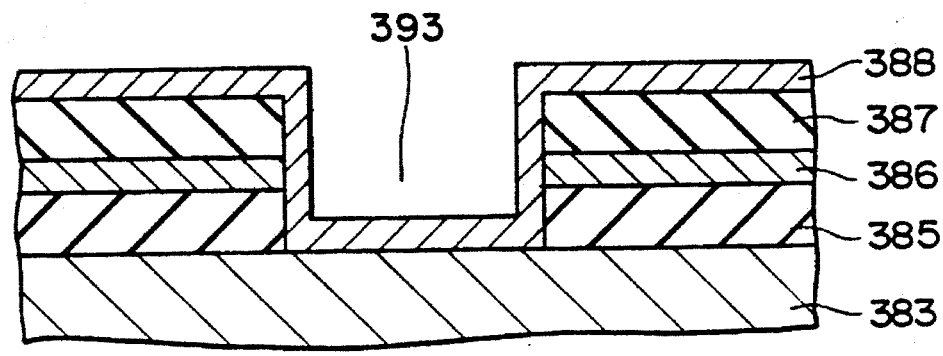

FIG. 16I is an enlarged view of an essential part shown in FIG. 16H. The subsequent steps will be described with reference to FIGS. 16J to 16M which are also enlarged views similar to FIG. 16I.

Figure 16J:
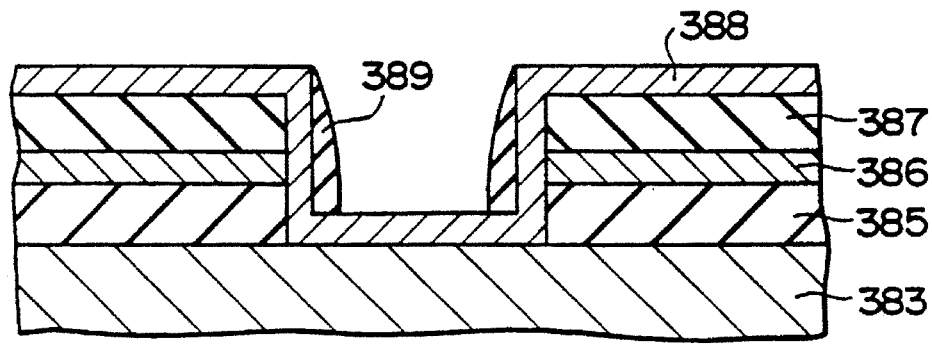

As shown in FIG. 16J, an insulating film having a thickness of 100 nm is formed by CVD, and is then etched by RIE to form a side wall 389 from this insulating film in the hole 393.

Figure 16K:
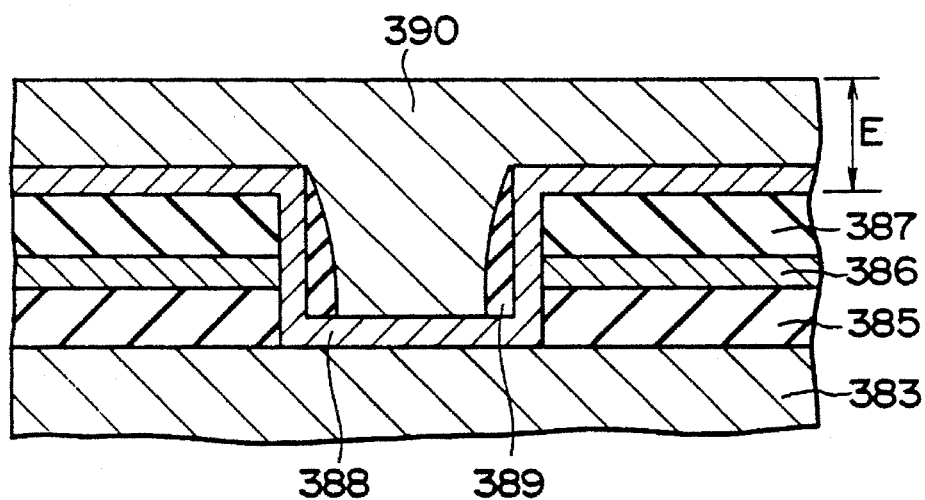

Then, as shown in FIG. 16K, a photoresist 390 or the like is coated on the whole surface including the inside of the hole 393 to perform flattening. Then, the photoresist 390 and the epitaxial layer 388 are etched back by RIE or chemical mechanical polishing until the insulating film 387 is exposed. In FIG. 16K, reference character E denotes a region to be etched back.

Figure 16L:
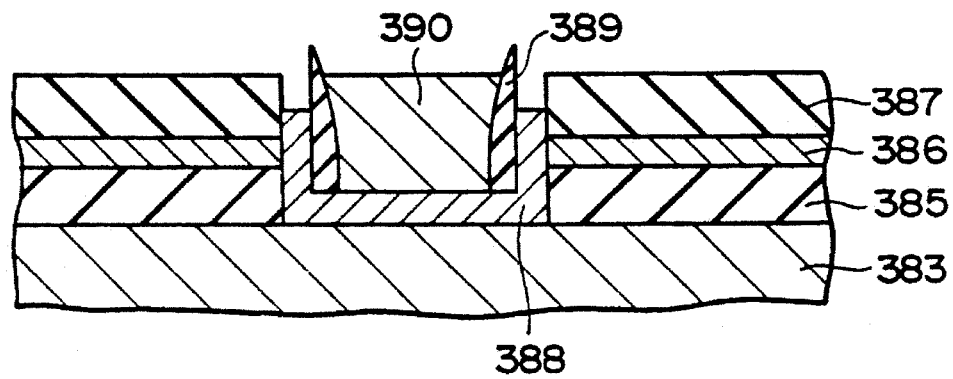

Then, as shown in FIG. 16L, the remaining portion (polysilicon) of the epitaxial layer 388 in the hole 393 is etched back by RIE with the remaining portion of the photoresist 390 in the hole 393 used as a mask. Thus, the connection between the base region 388 and the base drawing electrode 386 is completed in the condition where the intrinsic base region is protected.

Figure 16M:
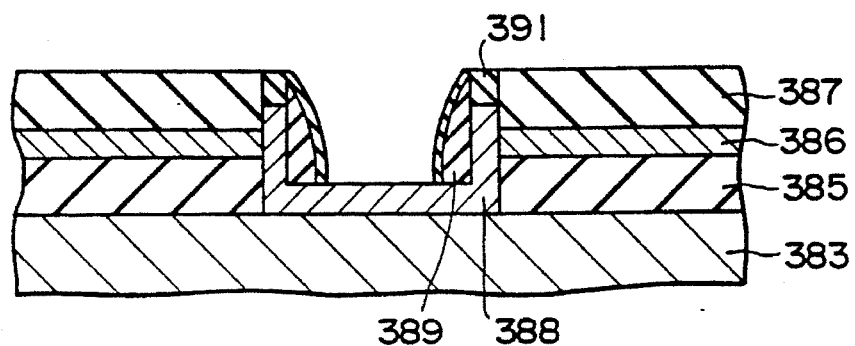

Then, as shown in FIG. 16M, an insulating film 391 having a thickness of 100 nm is formed by CVD after removing the photoresist 390 in the hole 393. Then, the insulating film 391 is etched back by RIE so as to fill a space over the epitaxial layer 388 between the side wall 389 and the insulating film 387.

Then, a polysilicon film 392 (see FIG. 16A) having a thickness of 100 nm for forming an emitter diffused layer is formed by CVD. Then, arsenic ions are implanted into the polysilicon film 392 under the conditions of 1E16 cm−2, and then annealing is performed at 800° C. for 30 min in the atmosphere of nitrogen. Further, RTA (rapid thermal annealing) is performed to stably form an emitter-base junction, Thus, the bipolar transistor structure shown in FIG. 16A is obtained. Thereafter, a step of forming metal electrodes is performed.

The present invention is not limited to this preferred embodiment, but various modifications may be made within the scope of the present invention.

For example, a silicide (e.g., titanium silicide) film may be added to the polysilicon film 386 in the step of FIG. 16E, thereby reducing the resistance in the base drawing electrode and accordingly realizing high-speed operation.

Further, the energy band gap in the polysilicon film 392 for the emitter formed in the step of FIG. 16A may be set larger than that in the epitaxial film 388 for the base formed in the step of FIG. 16H, thereby improving an injection efficiency to reduce a base resistance and accordingly realize a high-speed operation. This may be effected by using polysilicon ($SiO_xP_y$) containing oxygen and n-type impurity (e.g., phosphorus) as the polysilicon film 392 for the emitter and/or doping the epitaxial film 388 for the base with germanium.

Further, the thickness of the insulating film to be formed in the steps of FIGS. 16K to 16M may be made smaller to thereby reduce a parasitic region other than the intrinsic base.

Further, the thickness of the graft base, the link base, and the insulating films to be formed in the steps of FIGS. 16J to 16M may be made smaller to thereby reduce the parasitic region other than the intrinsic base.

According to the present invention, in forming a graft base, a link base, and a base of a bipolar transistor, the thickness of the graft base is decided by the thickness of an epitaxial film, thereby greatly reducing the base-collector parasitic capacitance and the base-substrate parasitic capacitance. Accordingly, the operating speed can be made very high.

Figure 17A:
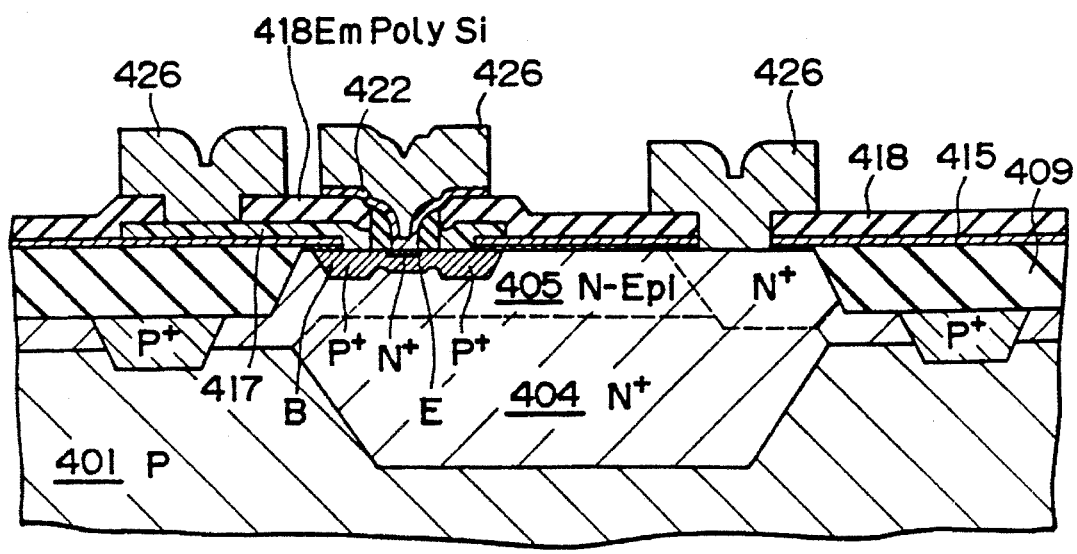
FIGS. 17A to 17W are sectional views illustrating a structure of a bipolar transistor and a manufacturing method therefor according to a tenth preferred embodiment of the present invention.
Figure 17B:
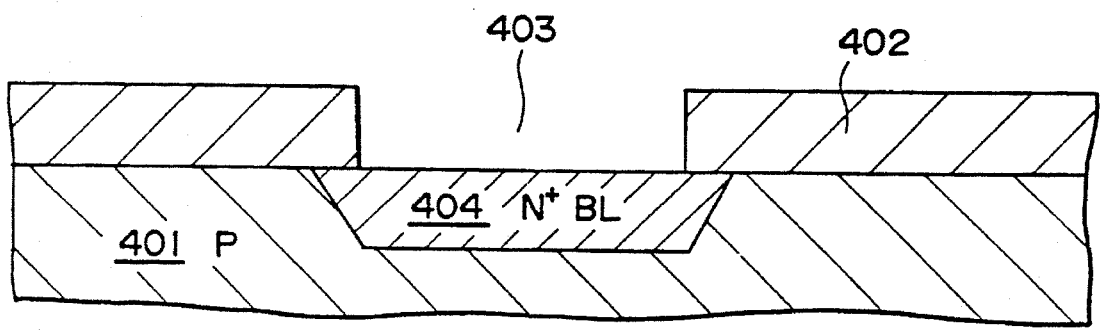
Figure 17C:
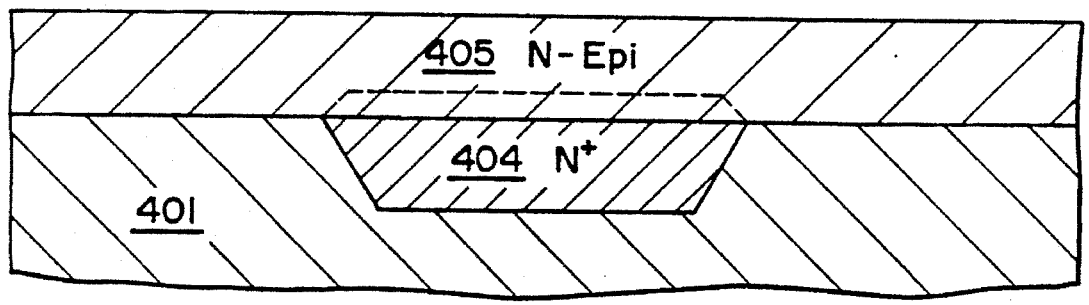
Figure 17D:
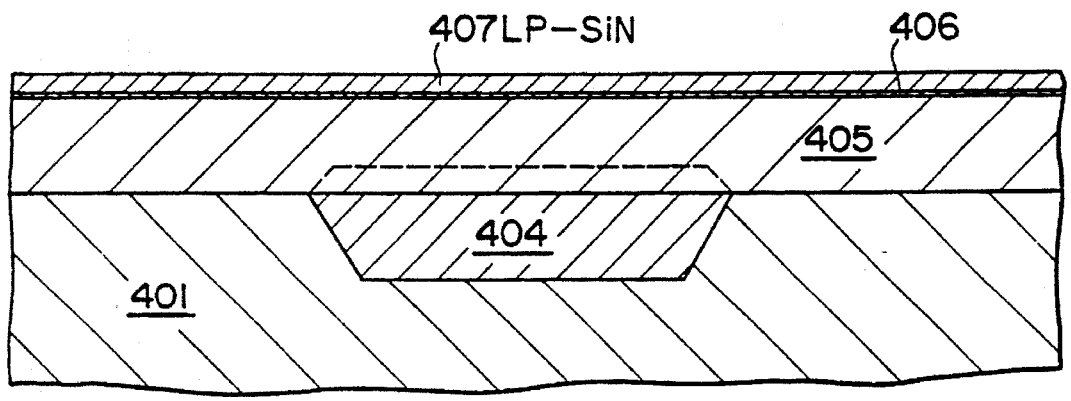
Figure 17E:
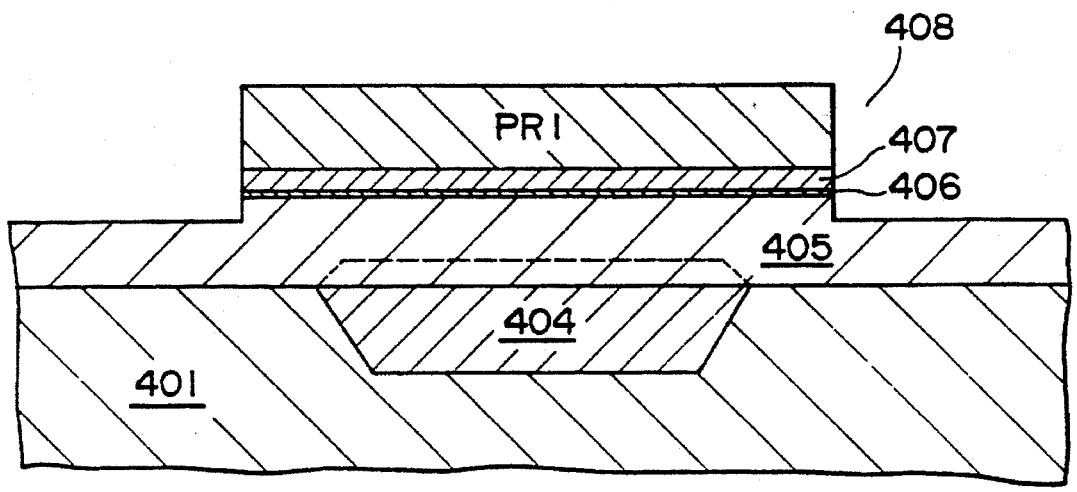
Figure 17F:
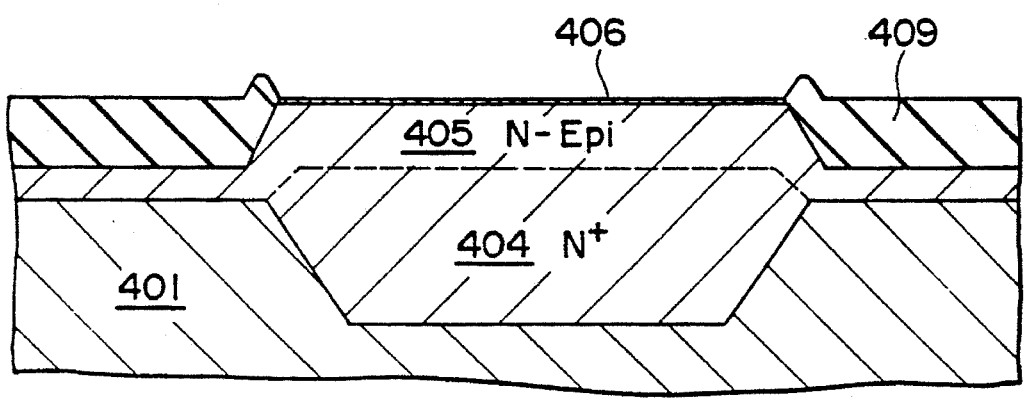
Figure 17G:
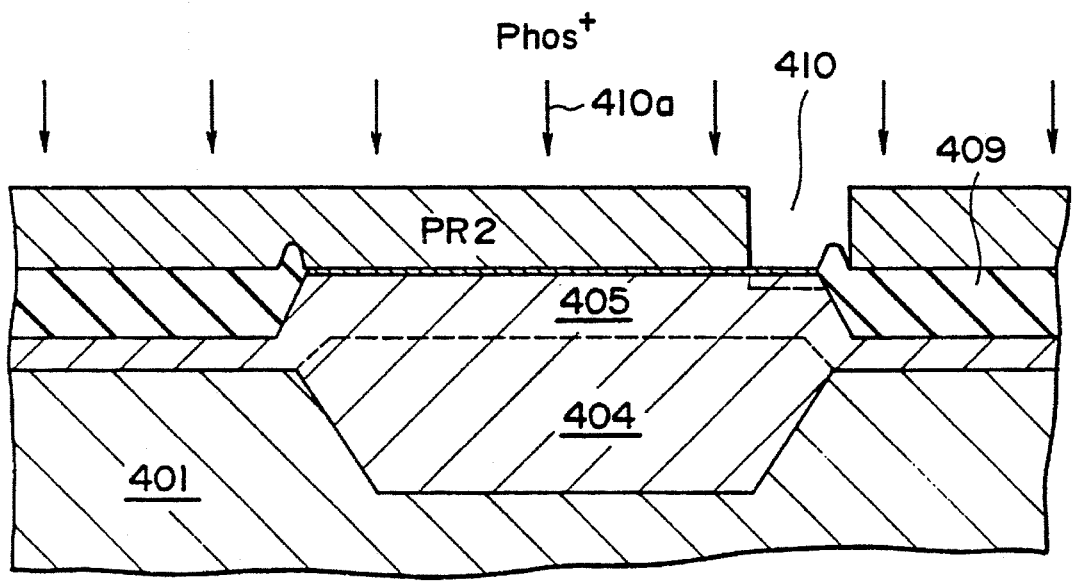
Figure 17H:
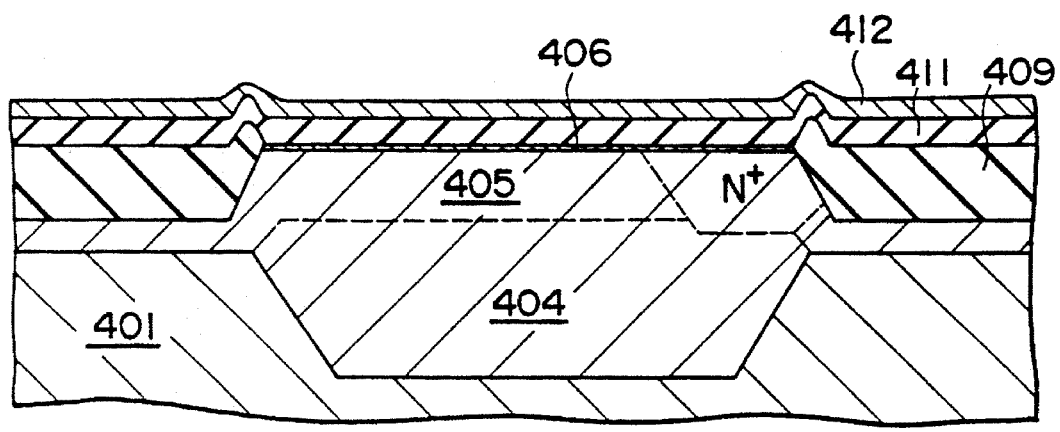
Figure 17I:
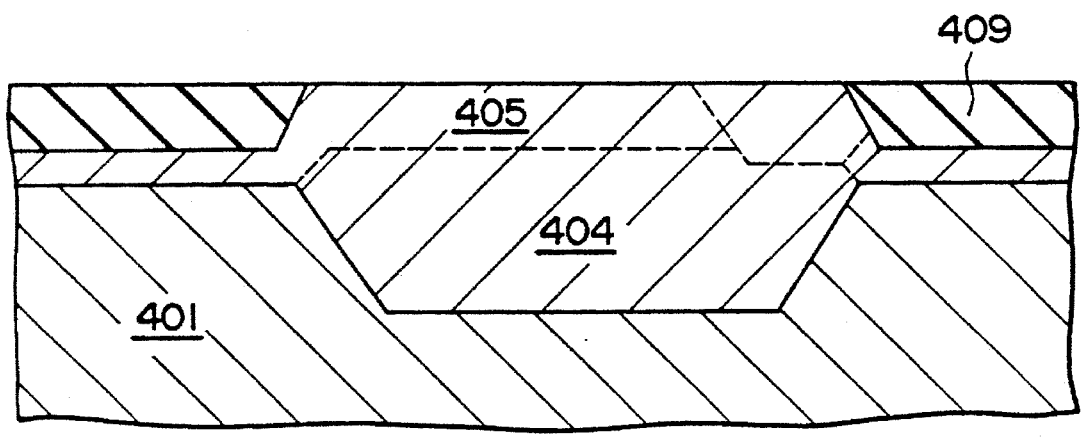
Figure 17J:
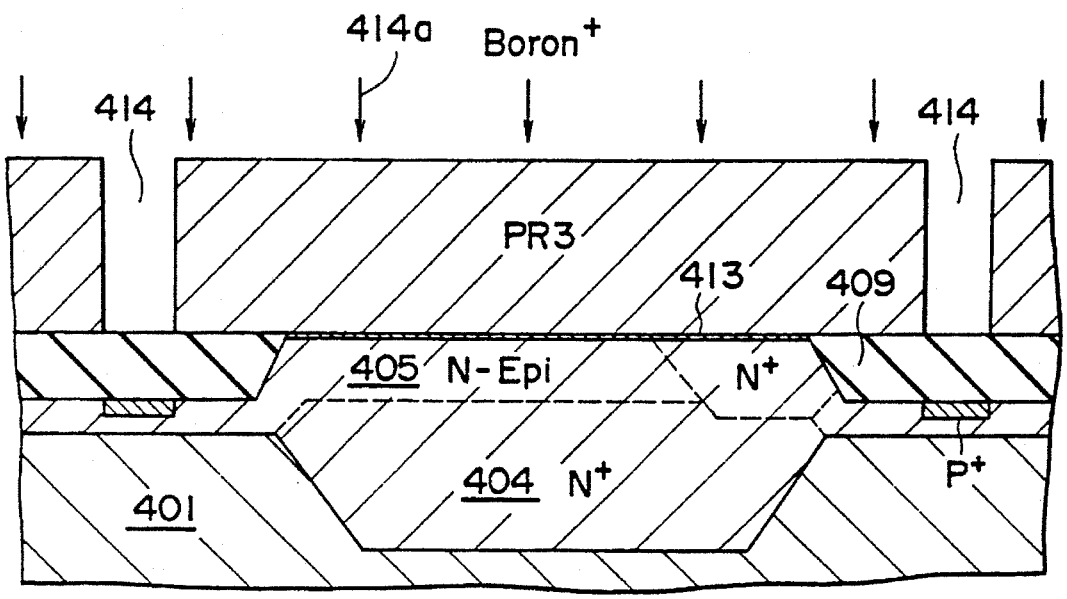
Figure 17K:
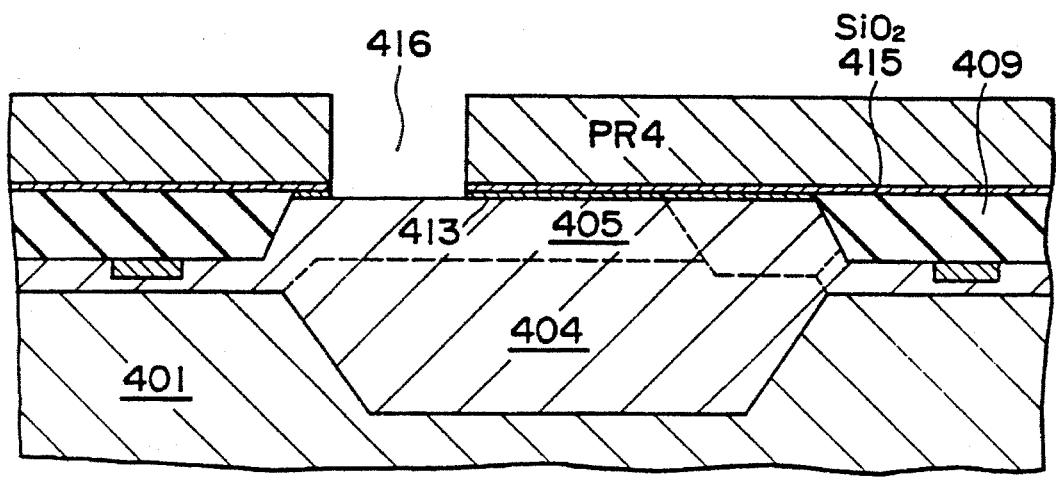
Figure 17L:
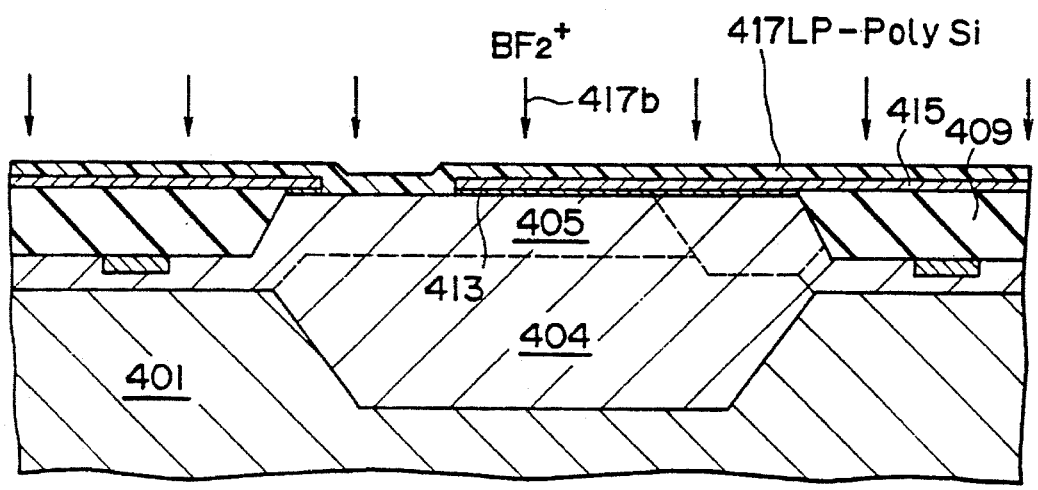
Figure 17M:
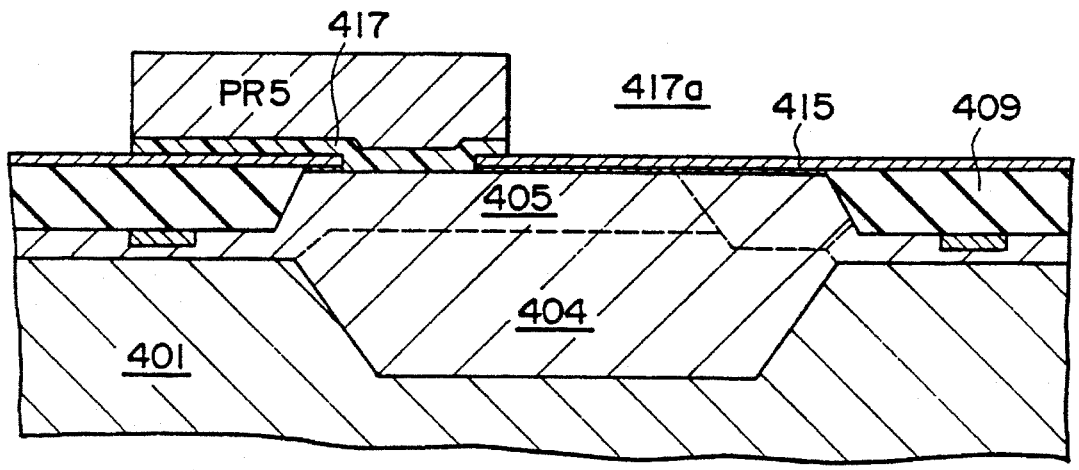
Figure 17N:
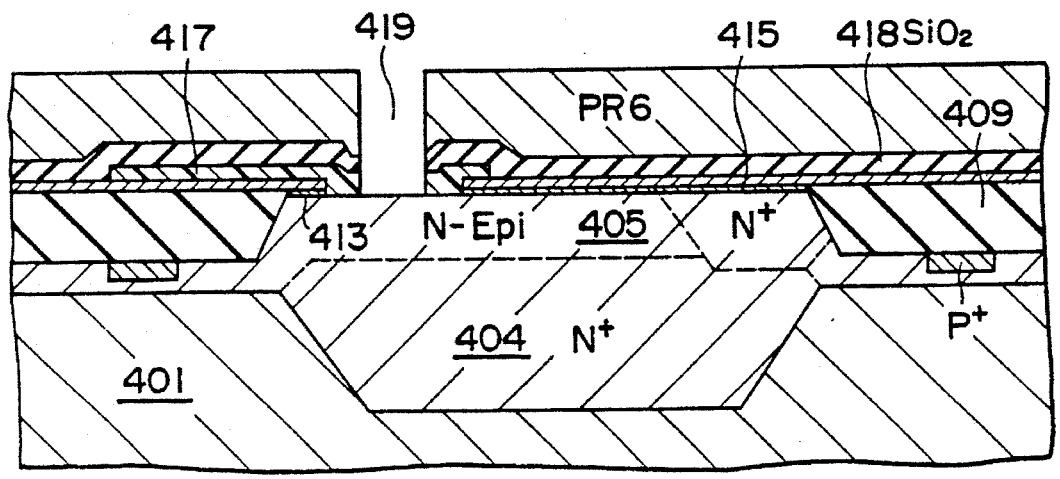
Figure 17O:
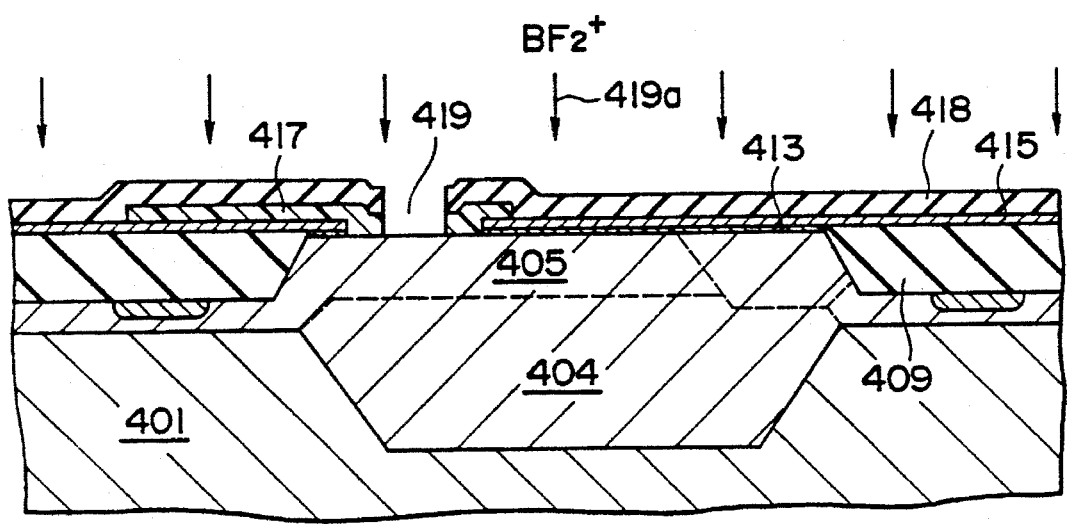
Figure 17P:
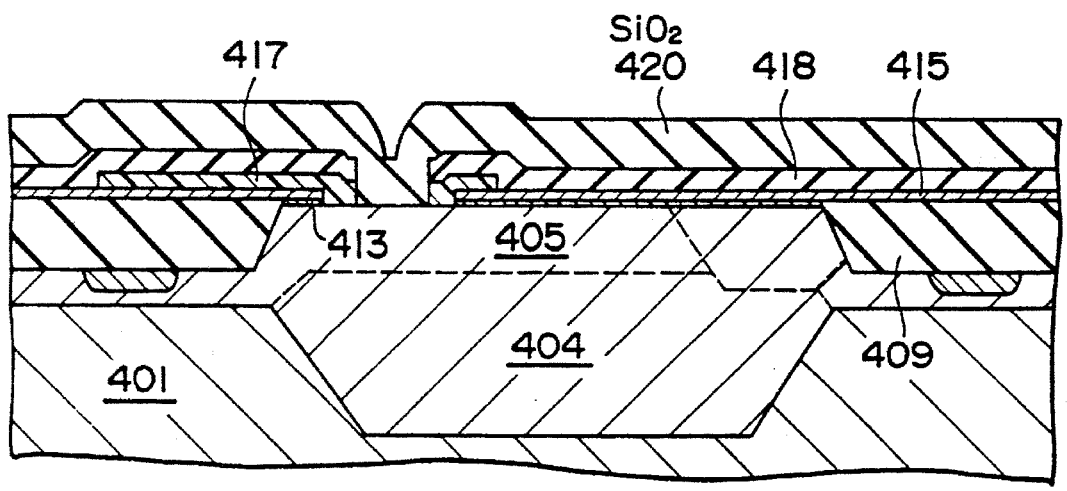
Figure 17Q:
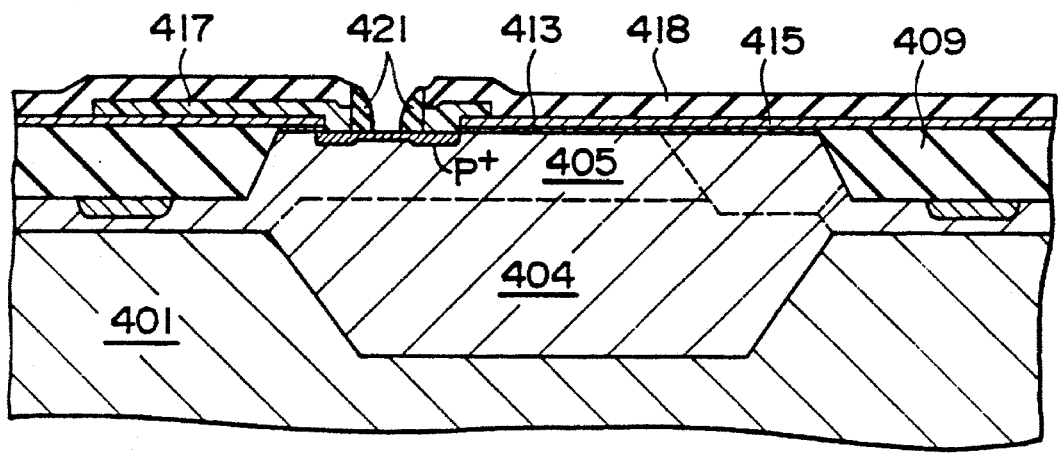
Figure 17R:
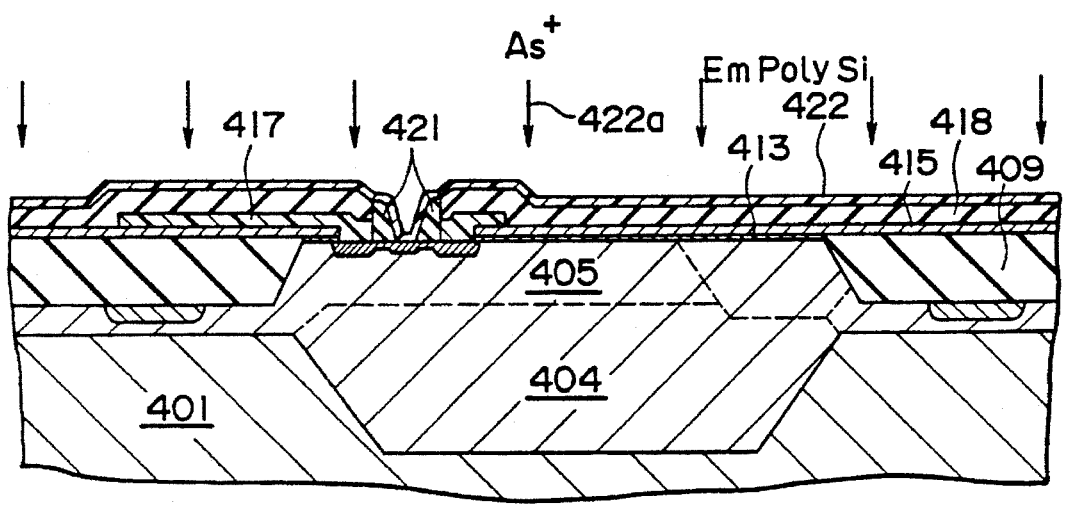
Figure 17S:
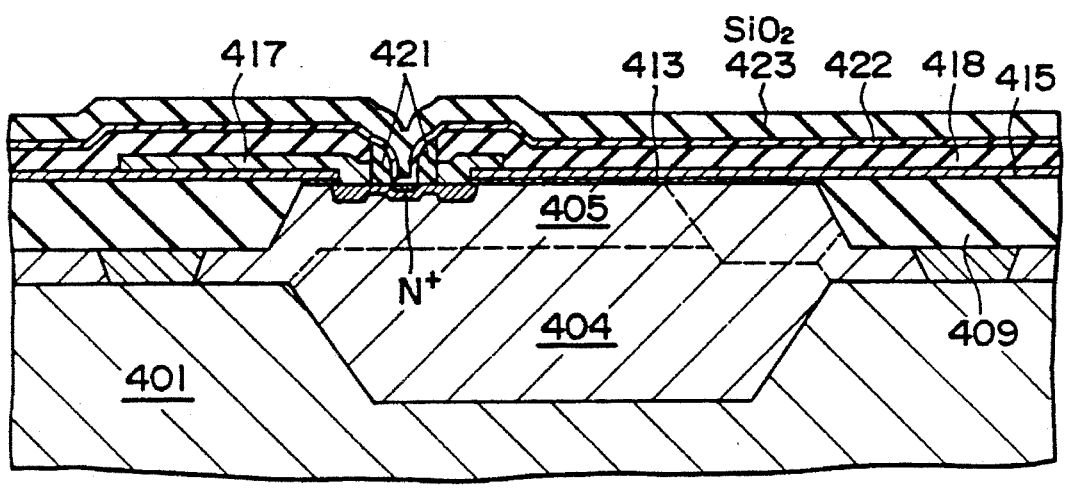
Figure 17T:
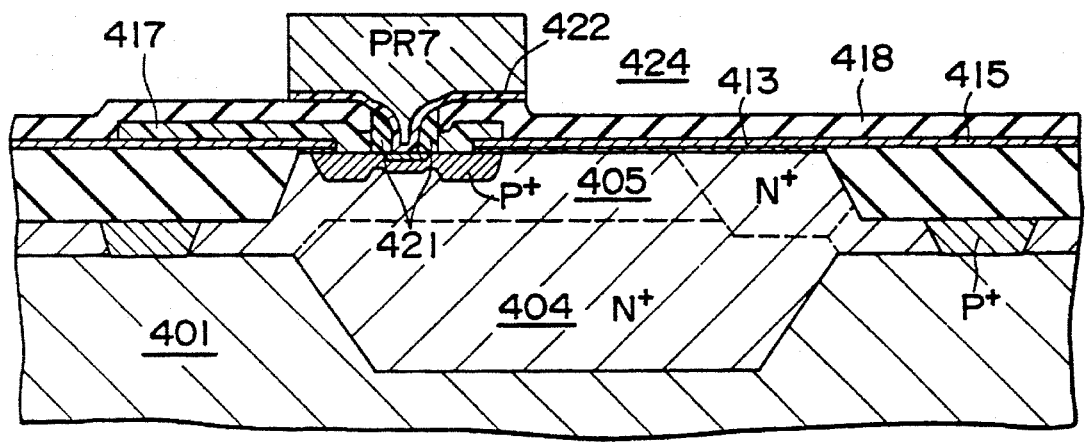
Figure 17U:
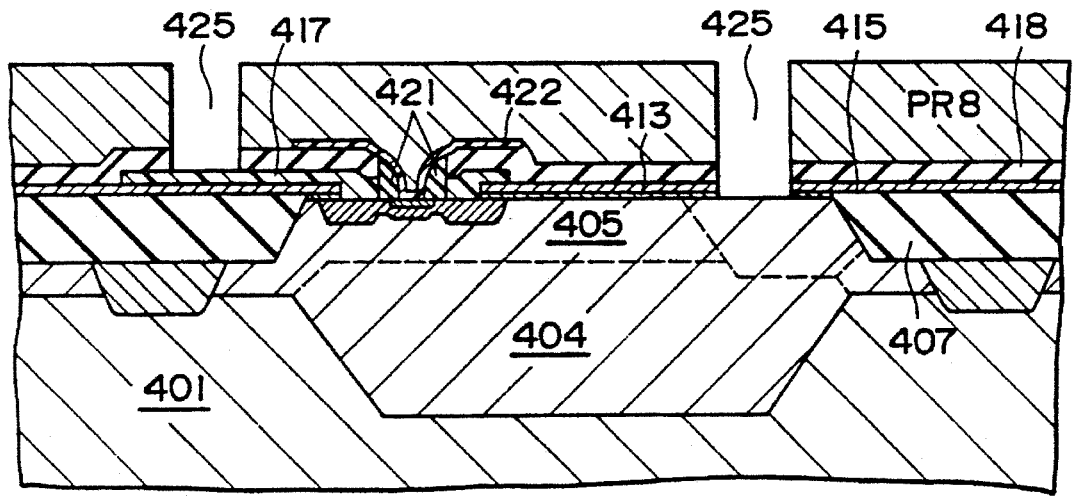
Figure 17V:
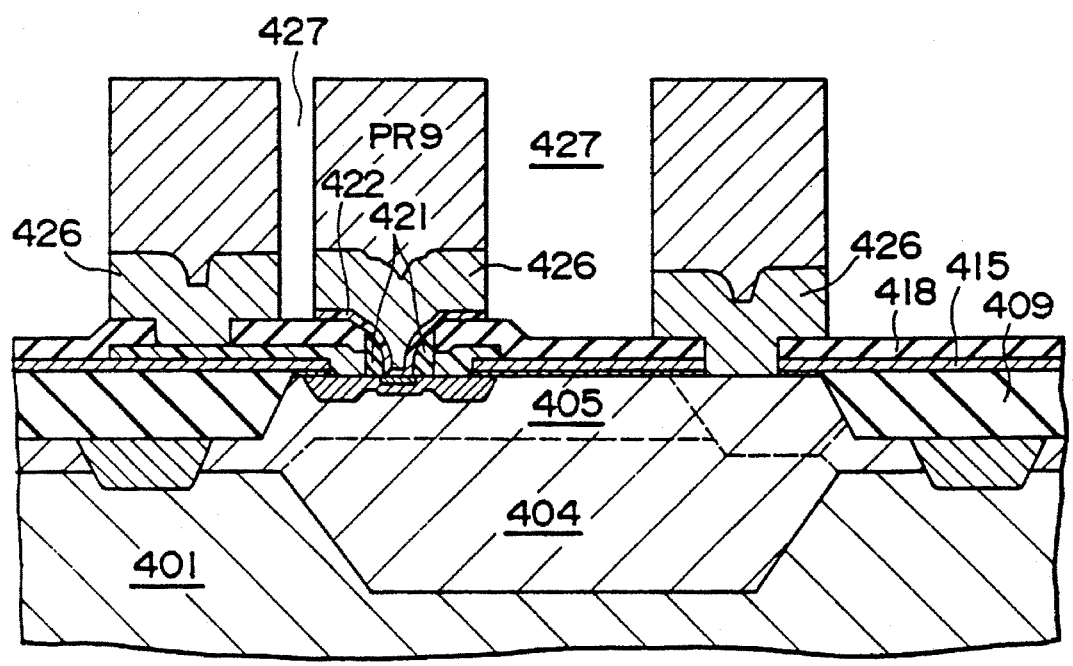
Figure 17W:
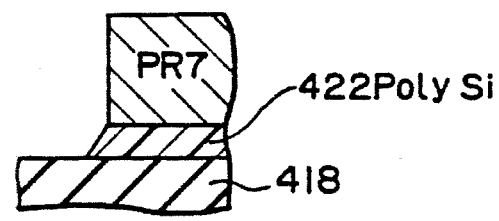

A tenth preferred embodiment of the present invention will be described with reference to FIG. 17A showing a final structure of a double-polysilicon emitter-base self-aligned bipolar transistor and FIGS. 17B to 17W showing a manufacturing process for the bipolar transistor. As shown in FIG. 17A, the bipolar transistor in this preferred embodiment comprises a collector formed in a semiconductor substrate 401 of a first conduction type; a base B as an impurity region of a second conduction type formed on the collector; a conducting film 422 connected to the impurity region; an emitter E formed in the impurity region by impurity diffusion from the conducting film 422; and barrier metal/metal laminated films 426 formed as electrodes for the collector, the base B, and the emitter E. In this bipolar transistor, it is characterized in that an edge of at least the conducting film 422 projects from a side surface of the barrier metal/metal laminated film 426 as the electrode for the emitter E, and in particular this edge is normally tapered (see FIG. 17W).

The manufacturing process of the bipolar transistor in this preferred embodiment will now be described.

Referring to FIG. 17B, an oxide film 402 having a thickness of 300 to 500 nm as a diffusion mask for forming a collector is formed on a p-type substrate 401. Then, the oxide film 402 is etched to open a window 403. Then, an $n^+$ buried layer 404 is formed by Was-phase diffusion of antimony at about 1200° C. with the oxide film 402 having the window 403 used as a mask. The $n^+$ buried layer 404 has a sheet resistance ρ s of 20 to 40 Ω/□ and a depth $X_j$ of 1 to 2 μm.

Referring next to FIG. 17C, the oxide film 402 is wholly removed by etching, and an n-type epitaxial layer 405 is formed on the substrate 401. The n-type epitaxial layer 405 has a resistivity ρ of 0.3 to 2 Ωcm and a thickness of 1 to 1.5 μm.

Referring next to FIG. 17D, an oxide film 406 having a thickness of about 20 to 40 nm as a LOCOS (local oxidation of silicon) buffer layer is formed by oxidation on the n-type epitaxial layer 405, and a silicon nitride ($Si_3N_4$) film 407 having a thickness of about 50 to 100 nm as a LOCOS mask is formed by low-pressure CVD on the oxide film 406.

Referring next to FIG. 17E, the silicon nitride film 407, the oxide film 406, and the n-type epitaxial layer 405 are etched by RIE with use of a photoresist PR1 to open a LOCOS window 408. An amount of etching of the n-type epitaxial layer 405 (silicon) is set to about 300 to 600 nm.

Referring next to FIG. 17F, LOCOS is performed at 950° to 1100° C. to form a LOCOS region 409 having a thickness of about 600 to 1200 nm. Then, the silicon nitride film 407 as the LOCOS mask is etched off by using hot phosphoric acid.

Referring next to FIG. 17G, a photoresist PR2 is used to open a window 410 for forming a collector drawing plug and perform implantation of phosphorus ions shown by 410a under the conditions of 50 to 100 keV and 1E15 to 1E16 $cm^{-2}$.

Referring next to FIG. 17H, an oxide film 411 having a thickness of about 300 nm is formed by CVD, and annealing at about 1000° to 1100° C. for 30 to 60 min is performed. Then, a resist 412 for flattening a LOCOS bird's head is coated.

Referring next to FIG. 17I, RIE is performed under the conditions that a selective ratio of the resist 412/the oxide film 411 is set to about 1 to 2 and the bird's head may be flattened. Then, the oxide film other than the LOCOS region 409 is removed by wet etching.

Referring next to FIG. 17J, a thin oxide film 413 (silicon dioxide) having a thickness of 10 to 30 nm is formed by oxidation at 900° C. Then, a photoresist PR3 is used to open a $p^+$ ion implantation window 414 for forming an isolation, and perform implantation of boron ions shown by 414a under the conditions of about 300 to 500 keV and 1E13 to 1E14 $cm^{-2}$.

Referring next to FIG. 17K, a thin oxide film 415 (silicon dioxide) having a thickness of 50 to 200 nm is formed by CVD. Then, a photoresist PR4 is used to open a window 416 for forming an active region of the transistor and remove the oxide films 413 and 415 in the window 416 by RIE.

Referring next to FIG. 17L, a polysilicon film 417 having a thickness of 100 to 300 nm as a base electrode is formed by CVD, and boron fluoride ions ($BF_2^+$) are implanted as shown by 417b under the conditions of 30 to 70 keV and 1E15 $cm^{-2}$ to 1E16 $cm^{-2}$. In the case where the polysilicon film 417 is used also as a resistor, the ion implantation conditions are set so that a low dose is selected for a high resistance, while a high dose is selected for a low resistance.

Referring next to FIG. 17M, a photoresist PR5 is used to open a window 417a and remove an unnecessary portion of the polysilicon film 417 in the window 417a by RIE.

Referring next to FIG. 17N, an oxide film 418 having a thickness of 300 to 500 nm is formed by CVD. Then, a photoresist PR6 is used to open a window 419 for forming an emitter active region and remove the oxide film 418 and the polysilicon film 417 in the window 419 by RIE.

Referring next to FIG. 17O, an oxide film having a thickness of 10 to 30 nm is formed by oxidation of 900° C., and then boron fluoride ions are implanted as shown by 419a by utilizing the window 419 under the conditions of 30 to 100 keV and 1E13 to 1E14 $cm^{-2}$.

Referring next to FIG. 17P, an oxide film 420 (silicon dioxide) for forming a side wall, having a thickness of about 300 to 800 nm is formed by CVD. Then, a base annealing is performed at 850° to 950° C. for 30 to 60 min to form a base region.

Referring next to FIG. 17Q, the oxide film 420 is etched by RIE to form a side wall 421 in the window 419.

Referring next to FIG. 17R, a polysilicon film 422 for forming an emitter, having a thickness of 50 to 200 nm is formed by CVD, and then arsenic ions are implanted as shown by 422a under the conditions of 30 to 100 keV and 1E15 to 1E16 $cm^{-2}$.

Referring next to FIG. 17S, an oxide film 423 having a thickness of about 300 nm is formed by CVD, and then emitter annealing is performed at 900° to 1100° C. for 5 sec to 30 min to form an emitter region.

Referring next to FIG. 17T, the oxide film 423 is removed by wet etching, and a photoresist PR7 is used to open a window 424 for leaving the polysilicon film 422 for the emitter electrode. At this time, the size of the polysilicon film 422 to be left is larger than that of a first aluminum electrode layer to be formed on the emitter electrode as shown in FIG. 17V. Then, the polysilicon film 422 is etched so that an edge thereof is normally tapered (see FIG. 17W showing an enlarged view of an essential part in FIG. 17T). Accordingly, even when the first aluminum electrode layer is drawn from the emitter electrode, there is no possibility of cutting of a barrier metal/aluminum layer and occurrence of electromigration or the like at the stepped portion of the polysilicon film 422.

Referring next to FIG. 17U, a photoresist PR8 is used to open windows 425 for drawing the base and the collector, and the oxide films 418 and 415 in the windows 425 are removed by RIE.

Referring next to FIG. 17V, a barrier metal/aluminum layer is formed by sputtering, and a photoresist PR9 is used to open windows 427 for forming barrier metal/aluminum electrodes 426. Then, the barrier metal/aluminum layer in the windows 427 is removed by RIE to form the barrier metal/aluminum electrodes 426 for the base, the emitter, and the collector. At the same time, a portion of the polysilicon film 422 projecting from a side surface of the barrier metal/aluminum electrode 426 for the emitter is also etched with the result that the stepped portion of the polysilicon film 422 becomes only a portion drawn for the purpose of wiring as viewed from the barrier metal/aluminum electrode 426.

Thereafter, sintering is performed to be followed by a step of wiring multiple layers. Thus, the structure shown in FIG. 17A is obtained.

According to this preferred embodiment, it is possible to prevent the coverage defect and the cutting of the barrier metal/aluminum layer at the stepped portion of the emitter polysilicon film, the occurrence of electromigration and stress migration, and the intrusion of aluminum due to the breakage of the barrier metal layer. Accordingly, a high yield can be realized.

According to the present invention, it is possible to prevent the coverage defect and the cutting of a metal wiring film such as a barrier metal/aluminum layer at a stepped portion of an emitter polysilicon film, the occurrence of electromigration and stress migration, and the intrusion of aluminum due to the breakage of a barrier metal layer. Accordingly, it is possible to provide a bipolar transistor which can realize a high yield, and it is also possible to provide a manufacturing method for a semiconductor device having such a structure.

An eleventh preferred embodiment of the present invention will be described with reference to FIGS. 18A to 18H and 19.

FIGS. 18A to 18H show a manufacturing method for a semiconductor integrated circuit device including a bipolar transistor of a double-polysilicon structure.

Figure 18A:
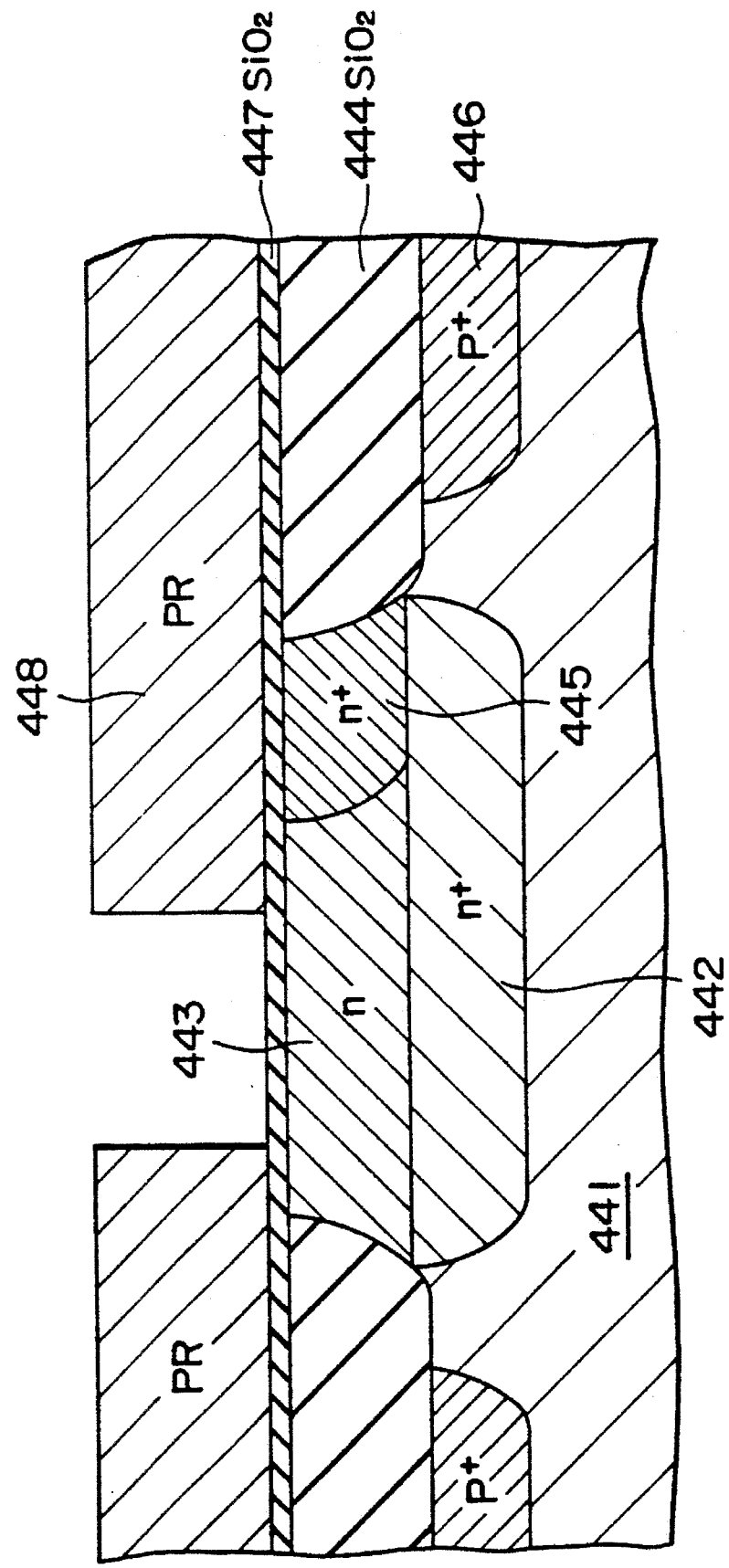
FIGS. 18A to 18H are sectional views illustrating a structure of a bipolar transistor and a manufacturing method therefor according to a eleventh preferred embodiment of the present invention.

Referring to FIG. 18A, an $n^+$ buried collector region 442 is formed by implanting arsenic ions into a p-type silicon substrate 441 as a semiconductor substrate under the conditions of 40 keV and 5E15 $cm^{-2}$, and then performing thermal diffusion. Then, an n-type silicon epitaxial layer 443 having a resistivity of 1 Ωcm and a thickness of 1.2 μm is formed in the upper surface of the substrate 441.

Then, a silicon dioxide film 444 having a thickness of 800 nm is formed by recessed LOCOS in an element isolation region of the silicon epitaxial layer 443. Then, an $n^+$ sinker region 445 of a collector electrode is formed by implanting phosphorus ions under the conditions of 50 keV and 5E15 $cm^{-2}$ and then performing thermal diffusion.

Then, an isolation region 446 is formed under the silicon dioxide film 444 by implanting boron ions under the conditions of 360 keV and 4E13 $cm^{-2}$. Then, an silicon dioxide film 447 having a thickness of 100 nm is formed by CVD on the whole surface of the substrate 441. Then, a photoresist 448 for deciding an active region is patterned.

Figure 18B:
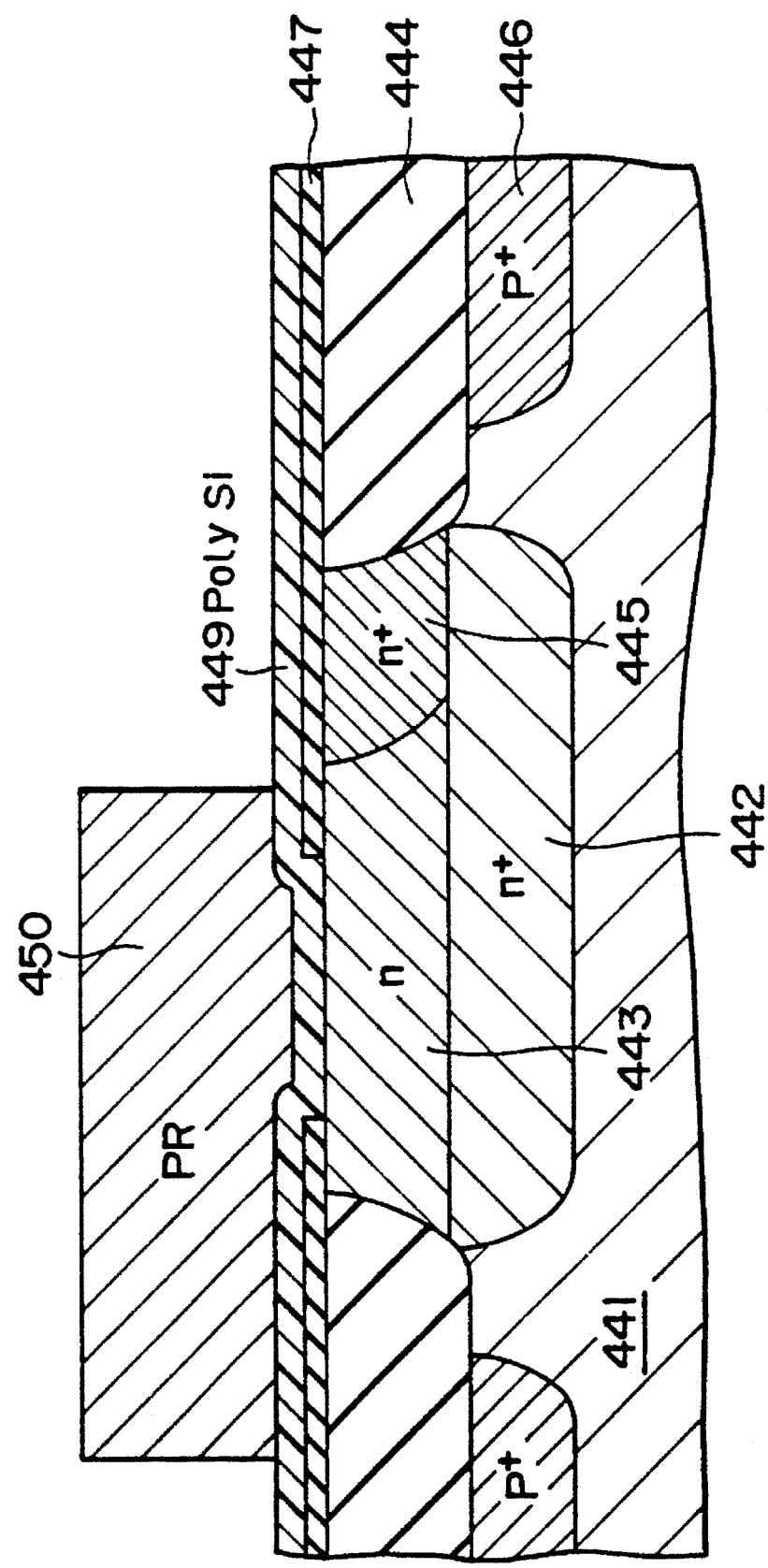

Referring next to FIG. 18B, the silicon dioxide film 447 is etched by RIE to form a window, and a polysilicon film 449 having a thickness of 150 nm is formed by CVD on the whole surface of the substrate 441. Then, boron fluoride ions ($BF_2^+$) are implanted under the conditions of 30 keV and 5E15 $cm^{-2}$, and a photoresist 450' for deciding a base drawing electrode is patterned.

Figure 18C:
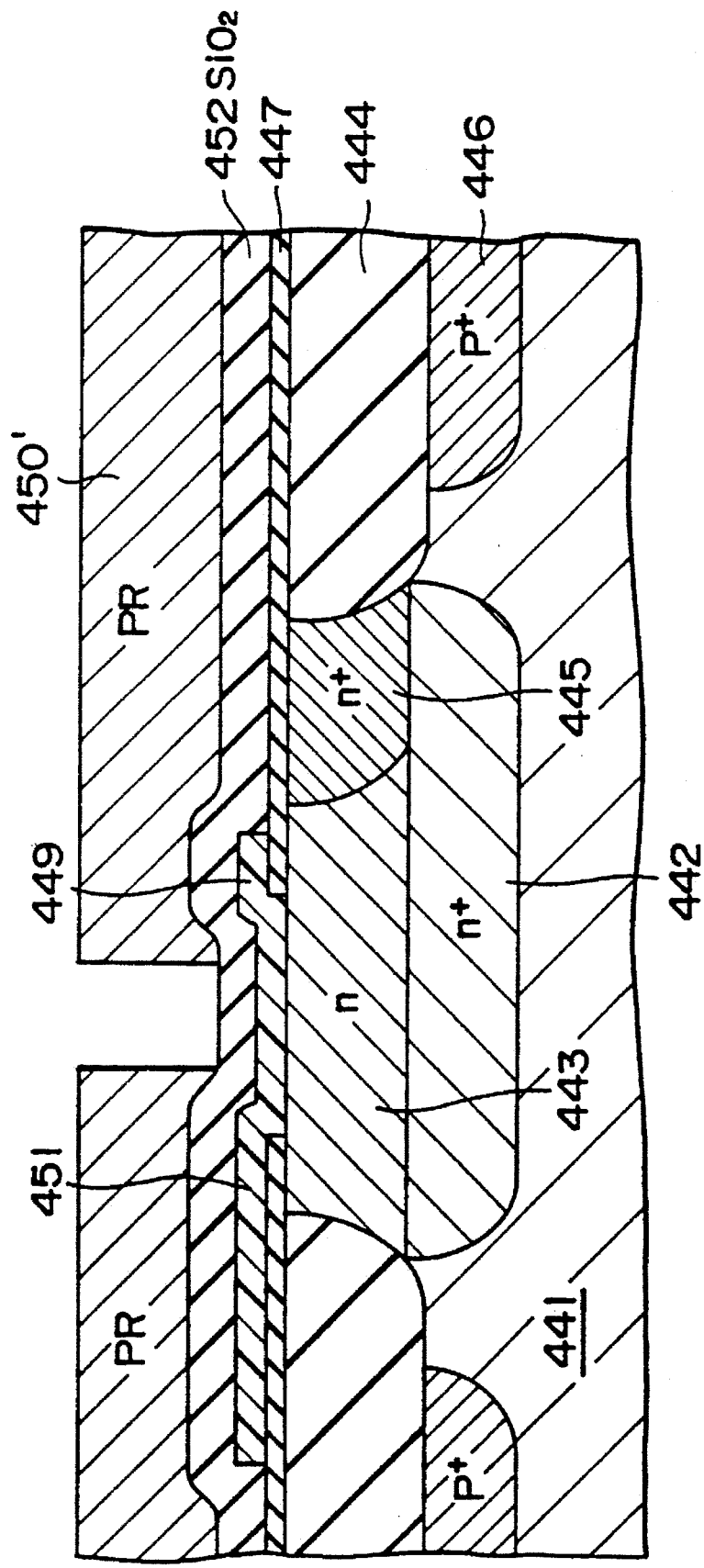

Referring next to FIG. 18C, the polysilicon film 449 is etched by RIE to form a base drawing electrode 451. Then, a silicon dioxide film 452 having a thickness of 400 nm is formed by CVD on the whole surface of the substrate 441. Then, a photoresist 450' for deciding an emitter region is patterned.

Figure 18D:
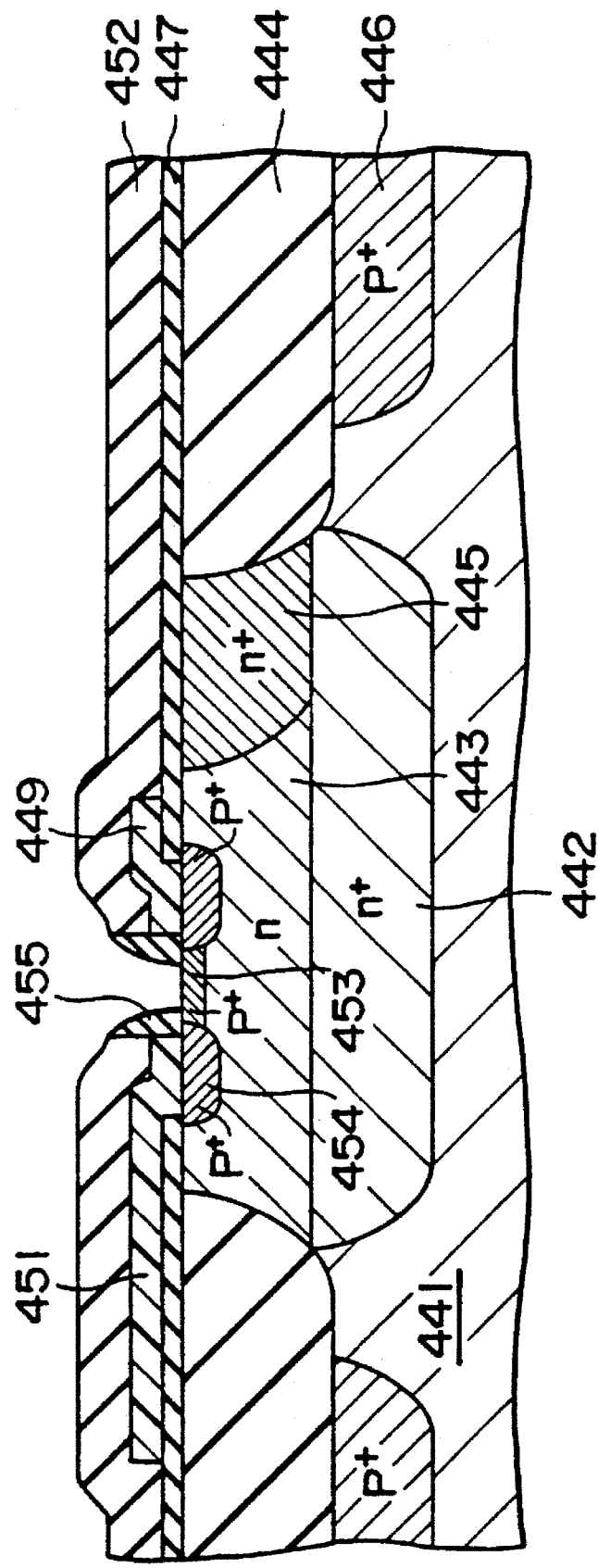

Referring next to FIG. 18D, the silicon dioxide film 452 and the polysilicon film 449 are etched by RIE with the photoresist 450' (see FIG. 18C) used as a mask to form a window. Then, boron fluoride ions are implanted under the conditions of 70 keV and 7E13 $cm^{-2}$ to form a $p^+$ intrinsic base region 453.

Then, a silicon dioxide film having a thickness of 600 nm is formed by CVD on the whole surface of the substrate 441. Then, annealing at 900° C. for 15 min is performed to diffuse the boron ions from the polysilicon film 449 into the silicon epitaxial layer 443 to form a $p^+$ external base 454.

This silicon dioxide film having the thickness of 600 nm is wholly etched by RIE to form a side wall 455 of silicon dioxide for isolating the base drawing electrode 451 from an emitter drawing electrode to be formed later.

Figure 18E:
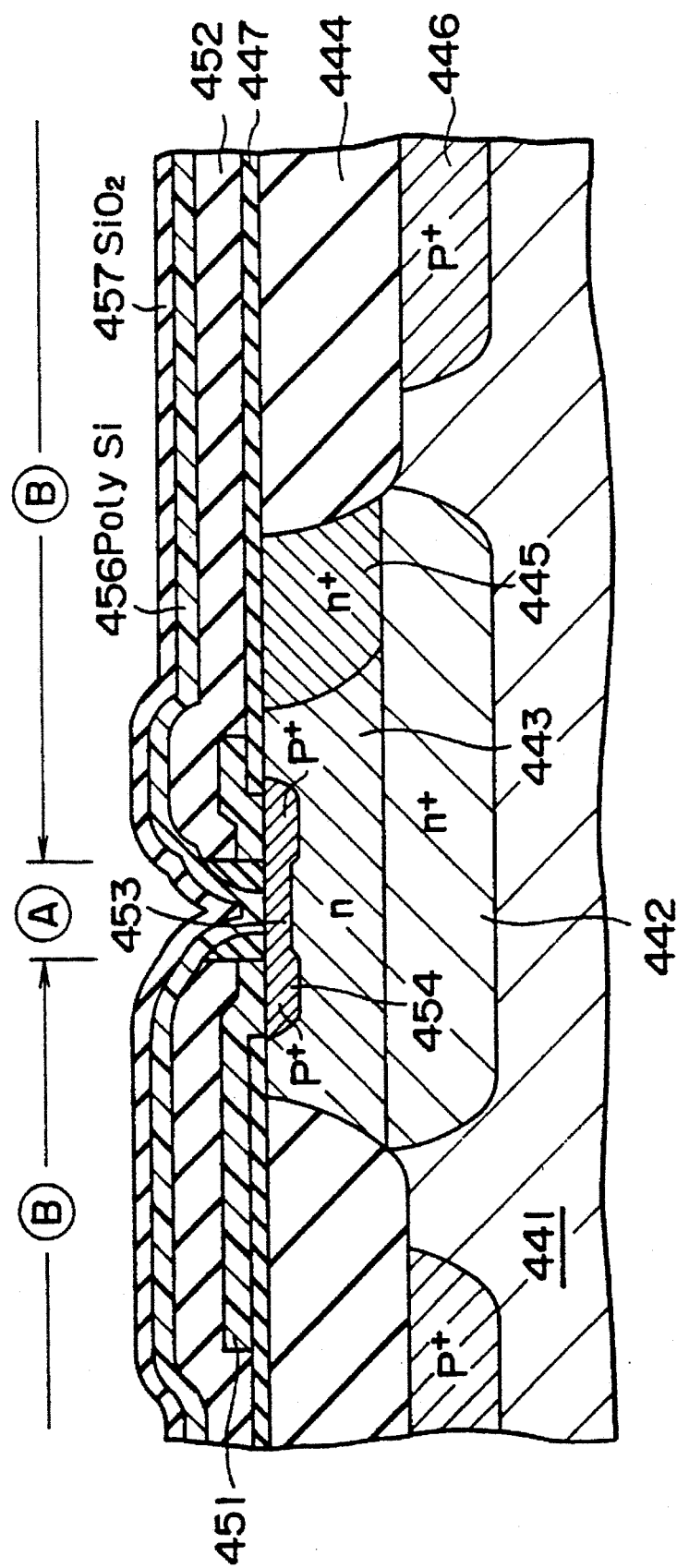

Referring next to FIG. 18E, a polysilicon film 456 having a thickness of 50 nm is formed by CVD on the whole surface of the substrate 441, and an silicon dioxide film 457 having a thickness of 40 to 60 nm is formed by CVD on the whole surface of the polysilicon film 456. The thickness of the silicon dioxide film 457 is set so that the reflectance of excimer laser light to be directed later with respect to a given wavelength may be minimized (i.e., the absorption of the laser light may be maximized). For example, as shown in FIG. 19, when the thickness of a silicon dioxide film is 50 nm, the reflectance at a laser wavelength of 308 nm is minimized.

Figure 18F:
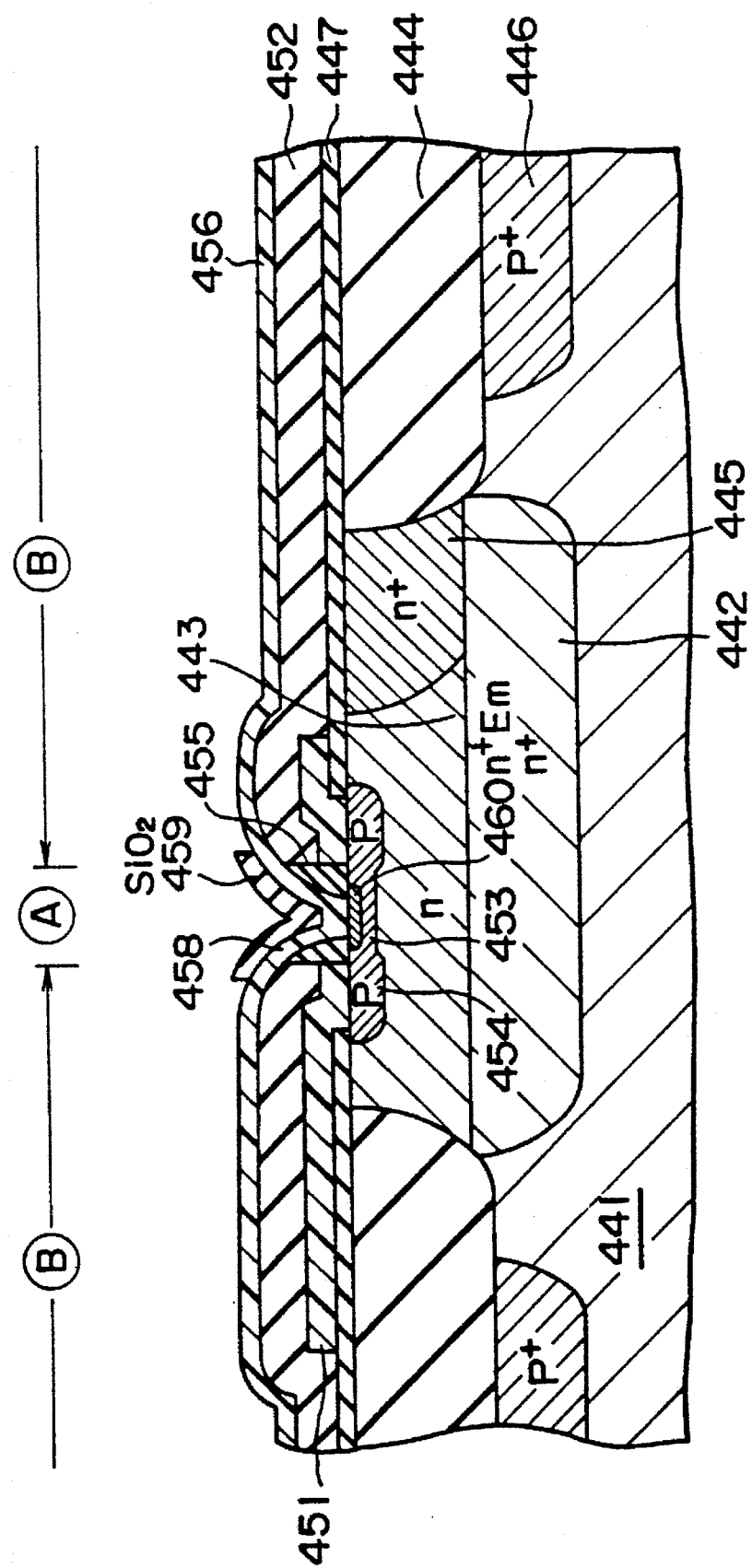

Referring next to FIG. 18F, the silicon dioxide film 457 is partially removed by RIE so that a portion of the silicon dioxide film 457 on an emitter forming portion 458 of the polysilicon film 456 is left, thereby forming a silicon dioxide film 459 as an assisting film on the emitter forming portion 458 only.

Then, excimer laser light is directed under the conditions of 600 to 1000 $mJ/cm^2$ to perform rapid thermal annealing, thereby diffusing the arsenic ions from the polysilicon film 456 into the intrinsic base region 453 to form an $n^+$ emitter region 460.

In the prior art, excimer laser light is directed in the step of FIG. 18E, wherein there is no problem in a portion (A) of the polysilicon film 456 formed in contact with the silicon substrate 441 (the $p^+$ intrinsic base region 453) having a good thermal conductivity, but there is a problem in a portion (B) of the polysilicon film 456 formed in contact with the silicon dioxide film 452 having poor thermal conductivity, that is, the polysilicon film 456 in the portion (B) excessively increases in temperature and melts.

To the contrary, in this preferred embodiment, the silicon dioxide film 459 having the thickness of 40 to 60 nm is formed on the emitter forming portion 458 (corresponding to the portion (A)), of the polysilicon film 456, so that the reflectance of the laser light in the portion (A) is small such as 33% as apparent from FIG. 19. On the other hand, no silicon dioxide film is formed on the other portion (B) of the polysilicon film 456 formed on the silicon dioxide film 452, so that the reflectance of the laser light in the portion (B) is large such as 64% (corresponding to the case where the thickness is 0 nm) as apparent from FIG. 19. Therefore, the energy of the laser light is selectively absorbed by the emitter forming portion 458 only. Accordingly, even when ELA (excimer laser annealing) is performed under conditions fit for the formation of emitter junction, the polysilicon film 456 on the silicon dioxide film 452 does not excessively increase in temperature and does not melt.

Figure 18G:
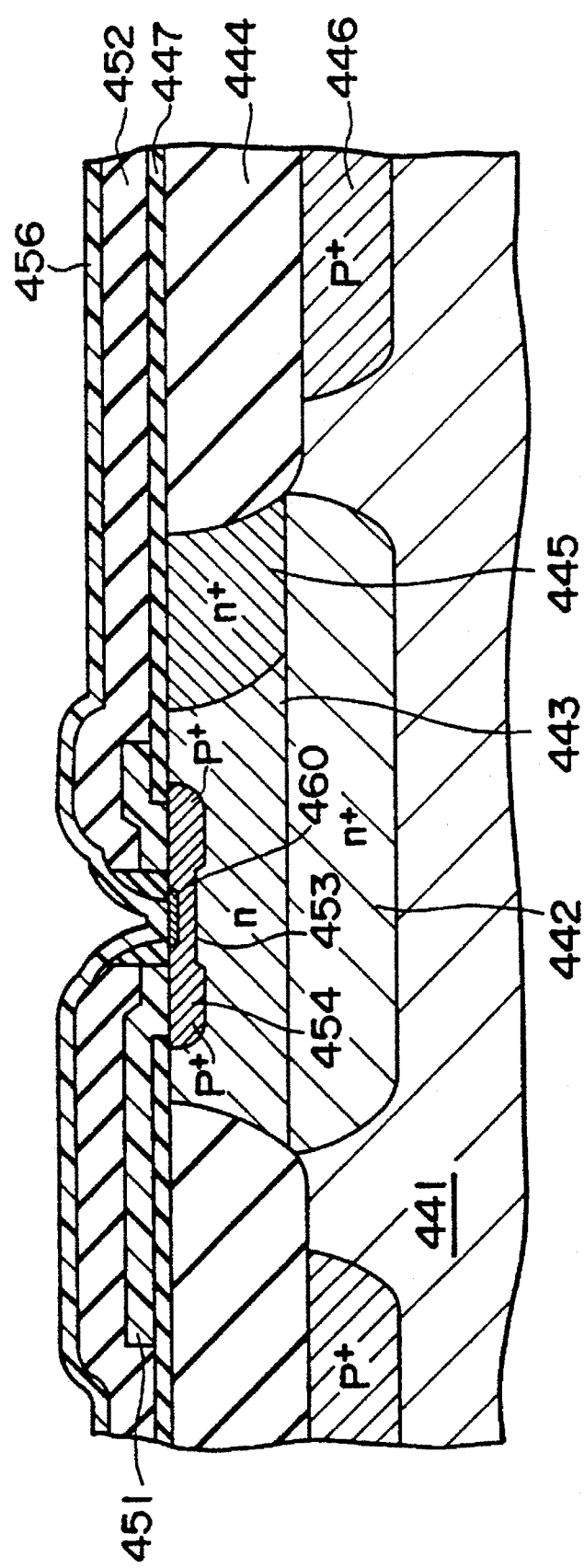

Referring next to FIG. 18G, the silicon dioxide film 459 (see FIG. 18F) is removed by solution etching using hydrofluoric acid.

Figure 18H:
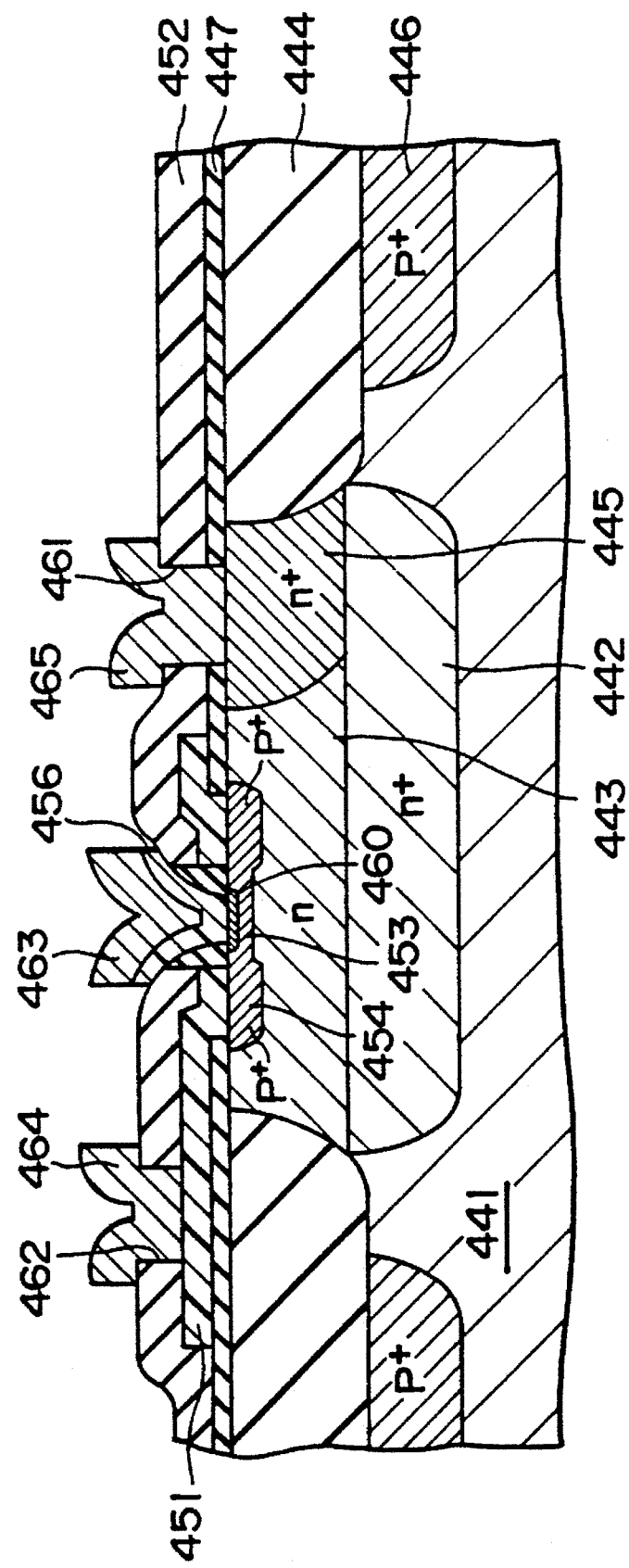

Referring next to FIG. 18H, the polysilicon film 456 is etched to an emitter drawing electrode pattern. Then, contact holes 461 and 462 respectively reaching the n$^+$ sinker region 445 of the collector electrode and the base drawing electrode 451 are formed by RIE. Then, an aluminum film having a thickness of 600 nm is formed by sputtering on the whole surface of the substrate 441, and is patterned to be followed by RIE. Thus, an emitter electrode 463, a base electrode 464, and a collector electrode 465 are formed from this aluminum film.

A twelfth preferred embodiment of the present invention will be described with reference to FIGS. 20A and 20B, in which the same parts as those of the eleventh preferred embodiment are denoted by the same reference numerals.

In a manufacturing method according to the twelfth preferred embodiment, the steps of FIGS. 18A to 18F in the eleventh preferred embodiment are similarly carried out, and accordingly the explanation thereof will be omitted hereinafter.

Figure 20A:
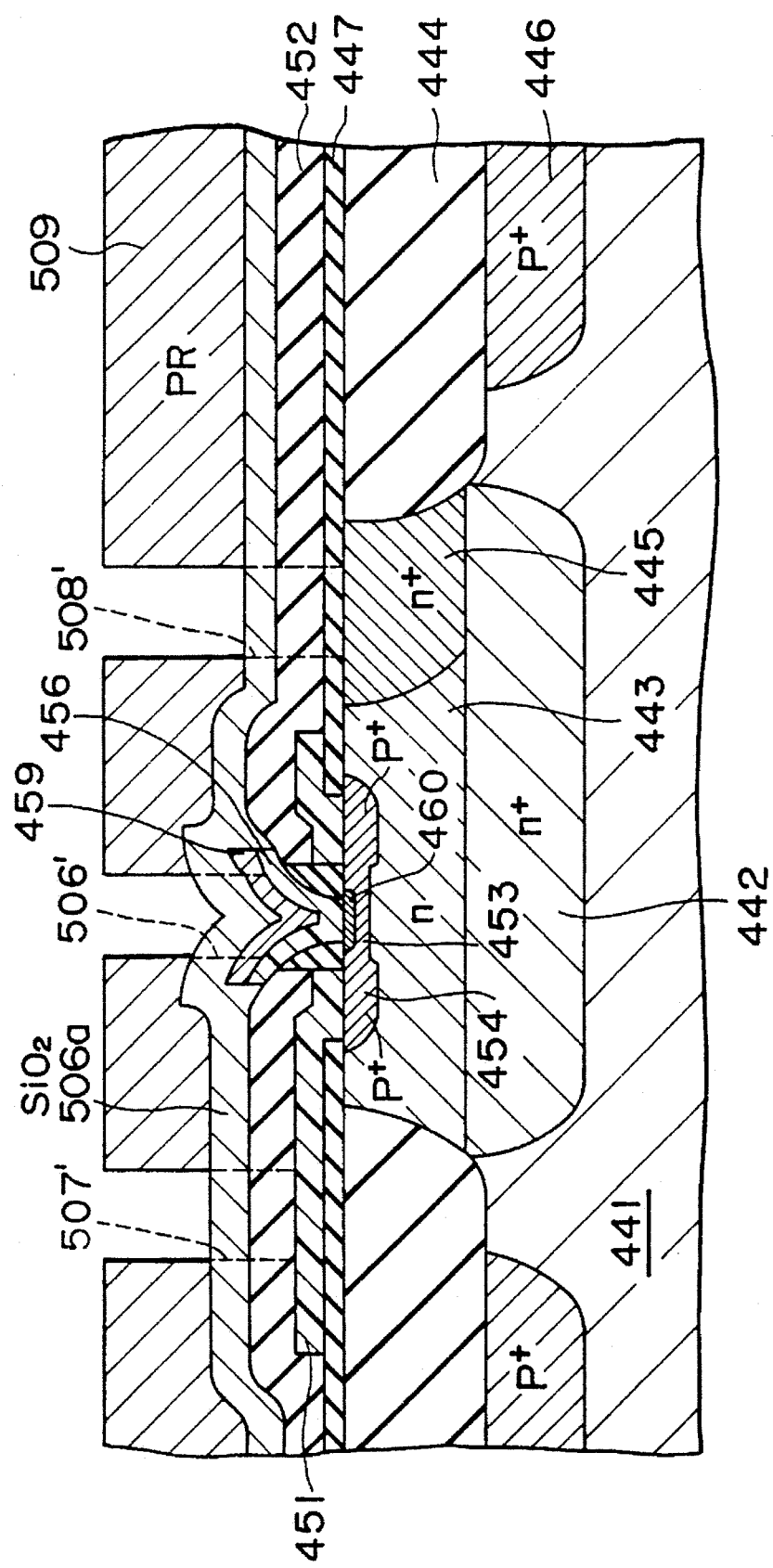
FIGS. 20A and 20B are sectional views illustrating a structure of a bipolar transistor and a manufacturing method therefor according to a twelfth preferred embodiment of the present invention.

Referring to FIG. 20A continued from the step corresponding to FIG. 18F, a silicon dioxide film 506a having a thickness of 300 nm is formed by CVD on the whole surface so as to cover a silicon dioxide film 459. Then, a photoresist 509 for deciding contact holes 506', 507', and 508' is patterned.

Then, the contact holes 506', 507', and 508' respectively reaching an emitter drawing electrode 456, an n$^+$ sinker region 443 of a collector electrode, and a base drawing electrode 451 are formed by RIE. In the prior art, the silicon dioxide film 506a is absent over the emitter drawing electrode 456. Accordingly, there is a large difference in etching thickness between the portion over the emitter drawing electrode 456 and the portion over the sinker region 445, so that the contact holes 506' and 508' cannot be simultaneously formed in the prior art. According to this preferred embodiment, however, the contact holes 506' and 508' can be simultaneously formed because the difference in etching thickness can be reduced due to the provision of the silicon dioxide film 506a.

Figure 20B:
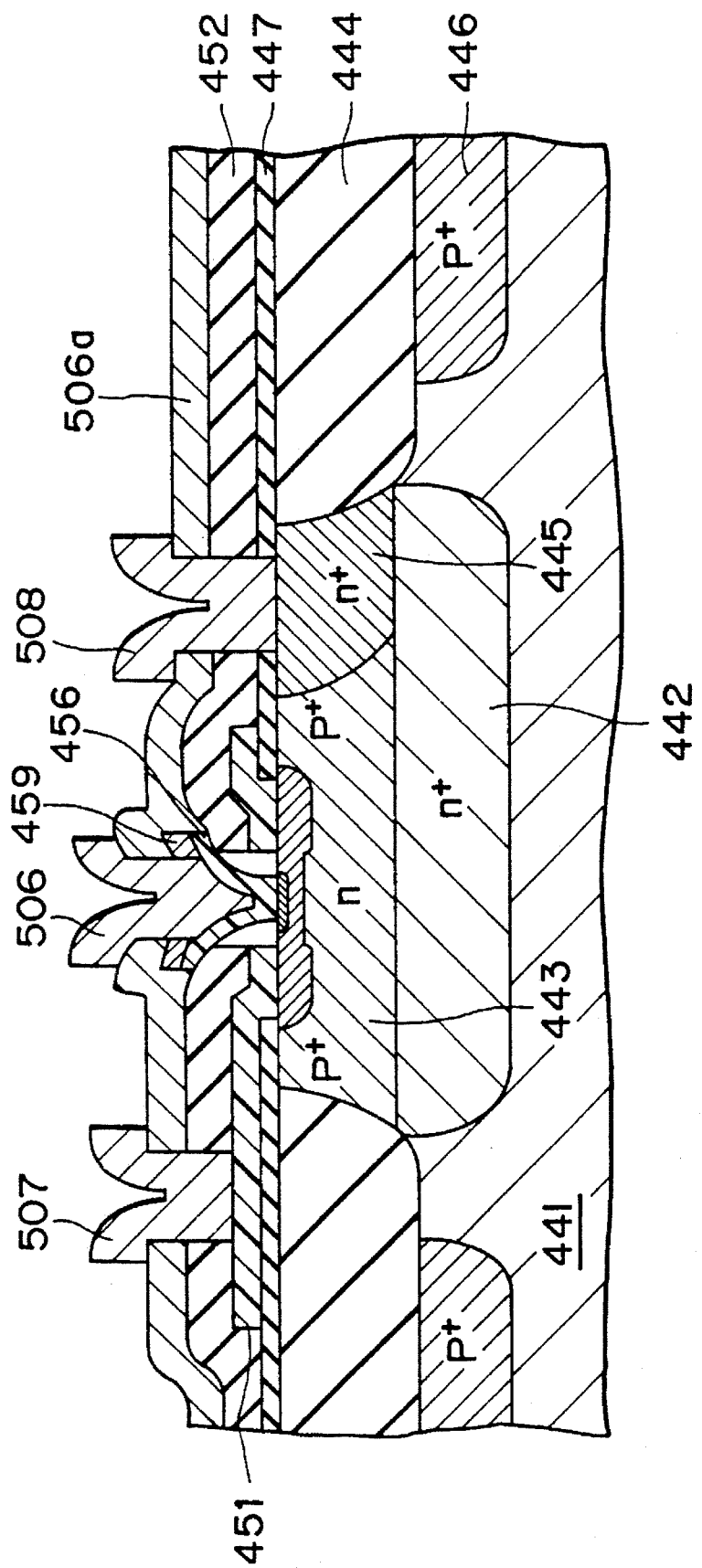

Referring next to FIG. 20B, an aluminum film having a thickness of 600 nm is formed by sputtering on the whole surface of a substrate 441, and is patterned to be followed by RIE. Thus, an emitter electrode 506, a base electrode 507, and a collector electrode 508 are formed from this aluminum film.

In the eleventh and twelfth preferred embodiments, the silicon dioxide film 459 having the thickness of 40 to 60 nm as the assisting film is formed for the purpose of selectively absorbing the energy of the laser light into the polysilicon film as the emitter drawing electrode 456. However, as apparent from FIG. 19, the thickness of the silicon dioxide film 459 may be set to from 170 to 190 nm which can also minimize the reflectance. Further, the thickness which can maximize the reflectance and the thickness which can minimize the reflectance may be arbitrarily set. Further, any insulating film or the like rather than the silicon dioxide film 459 may be used as the assisting film functioning to assist the energy absorption of laser light.

While the above eleventh and twelfth preferred embodiments are applied to the manufacturing of a semiconductor integrated circuit device including a bipolar transistor of a double-polysilicon structure, the present invention may be applied to the formation of a contact between polysilicon and single crystal silicon in an semiconductor integrated circuit device including a bipolar transistor of a single-polysilicon structure and a MOS transistor.

According to the above eleventh and twelfth preferred embodiments, the energy of laser light is selectively absorbed into the polysilicon film present just over the emitter, so that ELA can be performed under the conditions fit for the formation of emitter junction without melting the polysilicon film present on the insulating film.

According to the present invention, the problem of local temperature rise such that a polysilicon film present on an insulating film excessively increases in temperature during laser annealing can be solved to achieve uniform annealing.

While the invention has been described with reference to specific embodiments, the description is illustrative only and is not to be construed as limiting the scope of the invention. Various modifications and changes may occur to those skilled in the art without departing from the spirit and scope of the invention as defined by the appended claims.

What is claimed is:

1. A manufacturing method for a semiconductor device, comprising the steps of:

forming a first impurity diffused layer of a first conduction type in a semiconductor substrate;

forming a first conducting film connected to said first impurity diffused layer;

forming a first insulating film on said first conducting film;

forming a first hole through said first insulating film and said first conducting film;

forming a second impurity diffused layer of said first conduction type connected to said first impurity diffused layer in said semiconductor substrate;

selectively forming a second conducting film on a side surface of said first conducting film and on said semiconductor substrate exposed in said first hole;

forming a side wall with a second insulating film in said first hole to form a second hole leading through said first impurity diffused layer to said semiconductor substrate;

forming a side wall from a third insulating film in said second hole to form a third hole;

forming a third conducting film in said third hole;

doping said third conducting film with an impurity of said first conduction type;

forming a third impurity diffused layer of said first conduction type in said semiconductor substrate by impurity diffusion from said third conducting film doped with said impurity of said first conduction type;

doping said third conducting film with an impurity of a second conduction type; and forming a fourth impurity diffused layer of said second conduction type in said third impurity diffused layer by impurity diffusion from said third conducting film doped with said impurity of said second conduction type.

2. A manufacturing method for a semiconductor device according to claim 1, wherein said step of selectively forming said second conducting film comprising forming a refractory metal film at a bottom of said first hole, on side walls of said first hole, and on said first insulating layer, performing a heat treatment to make only a portion of said refractory metal film on said side surface of said first conducting film and on said semiconductor substrate exposed by said first hole into a refractory metal silicide film, and removing a remaining portion of said refractory metal film from said first insulating film.

3. A manufacturing method for a semiconductor device according to claim 2, wherein said refractory metal film comprises a titanium film.

4. A manufacturing method for a semiconductor device according to claim 1, wherein said step of selectively forming said second conducting film comprises selectively forming by CVD a refractory metal film only on said side surface of said first conducting film and on said semiconductor substrate exposed by said first hole.

5. A manufacturing method for a semiconductor device according to claim 4, wherein said refractory metal film comprises a tungsten film selectively formed by CVD.

6. A manufacturing method for a semiconductor device according to claim 1, wherein said first conducting film comprises a boron doped polysilicon film and a refractory metal silicide film laminated together.

7. A manufacturing method for a semiconductor device according to claim 1, wherein said first impurity diffused layer comprises a base of a bipolar transistor; said third impurity diffused layer comprises a base of said bipolar transistor; and said fourth impurity diffused layer comprises an emitter of said bipolar transistor.

\* \* \* \* \*